(12) United States Patent
Albrecht et al.

(10) Patent No.: US 7,266,137 B2
(45) Date of Patent: Sep. 4, 2007

(54) LASER GAS REPLENISHMENT METHOD

(75) Inventors: Hans-Stephan Albrecht, Göttingen (DE); Klaus Wolfgang Vogler, Eckental (DE); Juergen Kleinschmidt, Weissenfels (DE); Thomas Schroeder, Göttingen (DE); Igor Bragin, Göttingen (DE); Vadim Berger, Göttingen (DE); Uwe Stamm, Göttingen (DE); Wolfgang Zschocke, Noerten-Hardenberg (DE); Sergei Govorkov, Boca Raton, FL (US)

(73) Assignee: Lambda Physik AG, Goettingen (DE)

( * ) Notice: Subject to any disclaimer, the term of this patent is extended or adjusted under 35 U.S.C. 154(b) by 170 days.

(21) Appl. No.: 11/263,626

(22) Filed: Oct. 31, 2005

(65) Prior Publication Data

US 2006/0056478 A1    Mar. 16, 2006

Related U.S. Application Data

(60) Continuation of application No. 10/338,779, filed on Jan. 6, 2003, now Pat. No. 6,965,624, which is a continuation-in-part of application No. 10/114,184, filed on Apr. 1, 2002, now Pat. No. 6,504,861, which is a division of application No. 09/734,459, filed on Dec. 11, 2000, now Pat. No. 6,389,052, which is a continuation-in-part of application No. 09/447,882, filed on Nov. 23, 1999, now Pat. No. 6,490,307, application No. 10/338,779, and a continuation-in-part of application No. 09/780,120, filed on Feb. 9, 2001, now abandoned, which is a continuation-in-part of application No. 09/738,849, filed on Dec. 15, 2000, now Pat. No. 6,678,291, and a continuation-in-part of application No. 09/453,670, filed on Dec. 3, 1999, now Pat. No. 6,466,599, and a continuation-in-part of application No. 09/599,130, filed on Jun. 22, 2000, now Pat. No. 6,381,256, application No. 10/338,779, which is a continuation-in-part of application No. 09/826,301, filed on Apr. 3, 2001, now Pat. No. 6,556,609, which is a division of application No. 09/453,670, filed on Dec. 3, 1999, now Pat. No. 6,466,599, and a continuation-in-part of application No. 10/077,328, filed on Feb. 15, 2002, now Pat. No. 6,546,037, which is a division of application No. 09/599,130, filed on Jun. 22, 2000, now Pat. No. 6,381,256, which is a continuation-in-part of application No. 09/317,527, filed on May 24, 1999, now Pat. No. 6,154,470.

(60) Provisional application No. 60/171,717, filed on Dec. 22, 1999, provisional application No. 60/182,083, filed on Feb. 11, 2000, provisional application No. 60/124,785, filed on Mar. 17, 1999, provisional application No. 60/173,993, filed on Dec. 30, 1999, provisional application No. 60/170,919, filed on Dec. 15, 1999, provisional application No. 60/128,227, filed on Apr. 7, 1999, provisional application No. 60/140,531, filed on Jun. 23, 1999, provisional application No. 60/128,227, filed on Apr. 7, 1999, provisional application No. 60/140,531, filed on Jun. 23, 1999, provisional application No. 60/204,095, filed on May 15, 2000, provisional application No. 60/162,735, filed on Oct. 29, 1999, provisional application No. 60/166,967, filed on Nov. 23, 1999, provisional application No. 60/170,342, filed on Dec. 13, 1999, provisional application No. 60/120,218, filed on Feb. 12, 1999, provisional application No. 60/119,486, filed on Feb. 10, 1999.

(51) Int. Cl.
*H01S 3/22* (2006.01)
(52) U.S. Cl. .......................................... 372/59; 372/60
(58) Field of Classification Search ................ 372/55, 372/57, 59, 60
See application file for complete search history.

(56) References Cited

U.S. PATENT DOCUMENTS 3,899,750 A    8/1975    Hochuli et al. ......... 331/94.5 G
4,009,933 A    3/1977    Firester ..................... 350/152

| Patent No. | Date | Inventor | Class |
|---|---|---|---|
| 4,240,044 A | 12/1980 | Fahlen et al. | 331/94.5 PE |
| 4,380,079 A | 4/1983 | Cohn et al. | 372/87 |
| 4,393,505 A | 7/1983 | Fahlen | 372/57 |
| 4,399,540 A | 8/1983 | Buecher | 372/20 |
| 4,429,392 A | 1/1984 | Yoshida et al. | 372/9 |
| 4,534,034 A | 8/1985 | Hohla et al. | 372/59 |
| 4,611,270 A | 9/1986 | Klauminzer et al. | 364/183 |
| 4,616,908 A | 10/1986 | King | 350/576 |
| 4,674,099 A | 6/1987 | Turner | 372/59 |
| 4,686,682 A | 8/1987 | Haruta et al. | 372/87 |
| 4,691,322 A | 9/1987 | Nozue et al. | 372/82 |
| 4,716,569 A | 12/1987 | Bees | 372/38 |
| 4,719,637 A | 1/1988 | Cavaioli et al. | 372/59 |
| 4,722,090 A | 1/1988 | Haruta et al. | 372/57 |
| 4,740,982 A | 4/1988 | Hakuta et al. | 372/59 |
| 4,763,336 A | 8/1988 | Stephens | 372/81 |
| 4,829,536 A | 5/1989 | Kajiyama et al. | 372/57 |
| 4,856,018 A | 8/1989 | Nozue et al. | 372/98 |
| 4,860,300 A | 8/1989 | Bacumler et al. | 372/57 |
| 4,891,818 A | 1/1990 | Levatter | 372/57 |
| 4,905,243 A | 2/1990 | Lokai et al. | 372/32 |
| 4,926,428 A | 5/1990 | Kajiyama et al. | 372/20 |
| 4,953,174 A | 8/1990 | Eldridge et al. | 372/87 |
| 4,975,919 A | 12/1990 | Amada et al. | 372/33 |
| 4,977,573 A | 12/1990 | Bittenson et al. | 372/81 |
| 5,001,721 A | 3/1991 | Ludewig et al. | 372/59 |
| 5,005,181 A | 4/1991 | Yoshioka et al. | 372/59 |
| 5,025,445 A | 6/1991 | Anderson et al. | 372/20 |
| 5,081,635 A | 1/1992 | Wakabayashi et al. | 372/57 |
| 5,090,020 A | 2/1992 | Bedwell | 372/59 |
| 5,095,492 A | 3/1992 | Sandstrom | 372/102 |
| 5,097,291 A | 3/1992 | Suzuki | 355/69 |
| 5,099,491 A | 3/1992 | Chaffee | 372/59 |
| 5,111,473 A | 5/1992 | Rebhan et al. | 372/59 |
| 5,136,605 A | 8/1992 | Basting et al. | 372/59 |
| 5,140,600 A | 8/1992 | Rebhan | 372/25 |
| 5,142,543 A | 8/1992 | Wakabayashi et al. | 372/29 |
| 5,149,659 A | 9/1992 | Hakuta et al. | 436/55 |
| 5,150,370 A | 9/1992 | Furuya et al. | 372/106 |
| 5,221,823 A | 6/1993 | Usui | 219/121.78 |
| 5,226,050 A | 7/1993 | Burghardt | 372/20 |
| 5,243,614 A | 9/1993 | Wakata et al. | 372/29 |
| 5,247,531 A | 9/1993 | Mueller-Horsche | 372/38 |
| 5,247,534 A | 9/1993 | Mueller-Horsche | 372/38 |
| 5,247,535 A | 9/1993 | Mueller-Horsche et al. | 372/86 |
| 5,260,961 A | 11/1993 | Zhou et al. | 372/57 |
| 5,307,364 A | 4/1994 | Turner | 372/60 |
| 5,337,330 A | 8/1994 | Larson | 372/86 |
| 5,377,215 A | 12/1994 | Das et al. | 372/57 |
| 5,396,514 A | 3/1995 | Voss | 372/57 |
| 5,404,366 A | 4/1995 | Wakabayashi et al. | 372/59 |
| 5,405,207 A | 4/1995 | Zubli | 401/110 |
| 5,430,752 A | 7/1995 | Basting et al. | 372/59 |
| 5,440,578 A | 8/1995 | Sandstrom | 372/59 |
| 5,450,436 A | 9/1995 | Mizoguchi et al. | 372/59 |
| 5,463,650 A | 10/1995 | Ito et al. | 372/57 |
| 5,534,034 A | 7/1996 | Caspers | 623/32 |
| 5,535,233 A | 7/1996 | Mozoguchi et al. | 372/87 |
| 5,557,629 A | 9/1996 | Mozoguchi et al. | 372/87 |
| 5,559,584 A | 9/1996 | Miyaji et al. | 355/73 |
| 5,559,816 A | 9/1996 | Basting et al. | 372/27 |
| 5,586,134 A | 12/1996 | Das et al. | 372/38 |
| 5,596,596 A | 1/1997 | Wakabayashi et al. | 372/102 |
| 5,598,300 A | 1/1997 | Magnusson et al. | 359/566 |
| 5,642,374 A | 6/1997 | Wakabayashi et al. | 372/57 |
| 5,646,954 A | 7/1997 | Das et al. | 372/55 |
| 5,652,681 A | 7/1997 | Chen et al. | 359/831 |
| 5,659,419 A | 8/1997 | Lokai et al. | 359/330 |
| 5,659,531 A | 8/1997 | Ono et al. | 369/109 |
| 5,663,973 A | 9/1997 | Stamm et al. | 372/20 |
| 5,684,822 A | 11/1997 | Partlo | 372/95 |
| 5,710,787 A | 1/1998 | Amada et al. | 372/25 |
| 5,729,562 A | 3/1998 | Birx et al. | 372/38 |
| 5,729,565 A | 3/1998 | Meller et al. | 372/87 |
| 5,748,346 A | 5/1998 | David et al. | 359/15 |
| 5,754,579 A | 5/1998 | Mizoguchi et al. | 372/58 |
| 5,761,236 A | 6/1998 | Kleinschmidt et al. | 372/100 |
| 5,763,855 A | 6/1998 | Shioji | 219/121.84 |
| 5,771,258 A | 6/1998 | Morton et al. | 372/57 |
| 5,802,094 A | 9/1998 | Wakabayashi et al. | 372/57 |
| 5,811,753 A | 9/1998 | Weick et al. | 219/121.78 |
| 5,818,865 A | 10/1998 | Watson et al. | 372/86 |
| 5,835,520 A | 11/1998 | Das et al. | 372/57 |
| 5,852,627 A | 12/1998 | Ershov | 372/108 |
| 5,856,991 A | 1/1999 | Ershov | 372/57 |
| 5,887,014 A | 3/1999 | Das | 372/59 |
| 5,898,725 A | 4/1999 | Fomenkov et al. | 372/102 |
| 5,901,163 A | 5/1999 | Ershov | 372/20 |
| 5,914,974 A | 6/1999 | Partlo et al. | 372/38 |
| 5,917,849 A | 6/1999 | Ershov | 372/102 |
| 5,923,693 A | 7/1999 | Ohmi et al. | 372/57 |
| 5,936,988 A | 8/1999 | Partlo et al. | 372/38 |
| 5,940,421 A | 8/1999 | Partlo et al. | 372/38 |
| 5,946,337 A | 8/1999 | Govorkov et al. | 372/92 |
| 5,949,806 A | 9/1999 | Ness et al. | 372/38 |
| 5,970,082 A | 10/1999 | Ershov | 372/102 |
| 5,978,391 A | 11/1999 | Das et al. | 372/20 |
| 5,978,394 A | 11/1999 | Newman et al. | 372/32 |
| 5,978,405 A | 11/1999 | Juhasz et al. | 372/57 |
| 5,978,406 A | 11/1999 | Rokni et al. | 372/58 |
| 5,978,409 A | 11/1999 | Das et al. | 372/100 |
| 5,982,795 A | 11/1999 | Rothweil et al. | 372/38 |
| 5,982,800 A | 11/1999 | Ishihara et al. | 372/57 |
| 5,991,324 A | 11/1999 | Knowles et al. | 372/57 |
| 5,999,318 A | 12/1999 | Morton et al. | 359/572 |
| 6,005,879 A | 12/1999 | Sandstrom et al. | 372/25 |
| 6,005,880 A | 12/1999 | Basting et al. | 372/38 |
| 6,014,398 A | 1/2000 | Hofmann et al. | 372/60 |
| 6,018,537 A | 1/2000 | Hofmann et al. | 372/25 |
| 6,020,723 A | 2/2000 | Desor et al. | 320/166 |
| 6,028,872 A | 2/2000 | Partlo et al. | 372/38 |
| 6,028,880 A | 2/2000 | Carlesi et al. | 372/58 |
| 6,061,382 A | 5/2000 | Govorkov et al. | 372/101 |
| 6,081,542 A | 6/2000 | Scaggs | 372/70 |
| 6,084,897 A | 7/2000 | Wakabayashi et al. | 372/38 |
| 6,130,904 A | 10/2000 | Ishihara et al. | 372/59 |
| 6,151,346 A | 11/2000 | Partlo et al. | 372/38 |
| 6,151,350 A | 11/2000 | Komori et al. | 372/59 |
| 6,154,470 A | 11/2000 | Basting et al. | 372/19 |
| 6,157,662 A | 12/2000 | Scaggs et al. | 372/60 |
| 6,160,831 A | 12/2000 | Kleinschmidt et al. | 372/57 |
| 6,160,832 A | 12/2000 | Kleinschmidt et al. | 372/57 |
| 6,188,710 B1 | 2/2001 | Besaucele et al. | 372/60 |
| 6,212,214 B1 | 4/2001 | Vogler et al. | 372/59 |
| 6,243,405 B1 | 6/2001 | Borneis et al. | 372/57 |
| 6,243,406 B1 | 6/2001 | Heist et al. | 372/59 |
| 6,389,052 B2 | 5/2002 | Albrecht et al. | 372/58 |
| 6,490,307 B1 | 12/2002 | de Mos et al. | 372/59 |
| 6,490,308 B2 | 12/2002 | Albrecht et al. | 372/59 |
| 6,493,370 B2 | 12/2002 | Albrecht et al. | 372/58 |
| 6,504,861 B2 | 1/2003 | Albrecht et al. | 372/59 |
| 6,563,853 B2 | 5/2003 | Heist et al. | 372/57 |
| 6,727,731 B1 | 4/2004 | Rebhan et al. | 327/25 |
| 2004/0252740 A1 | 12/2004 | Albrecht et al. | 372/55 |

FOREIGN PATENT DOCUMENTS

| | | |
|---|---|---|
| DE | 32 12928 A1 | 10/1983 |
| DE | 44 01 892 | 7/1995 |
| DE | 196 18 119 A1 | 11/1996 |
| DE | 297 13 755 U1 | 11/1997 |
| DE | 298 22 090 U1 | 3/1999 |
| EP | 0 459 503 A2 | 12/1991 |
| EP | 0 459 503 A3 | 12/1991 |
| EP | 0 532 751 A1 | 3/1993 |
| EP | 0 532 751 B1 | 3/1993 |

| | | |
|---|---|---|
| EP | 1 075 060 A2 | 2/2001 |
| EP | 1 091 462 A2 | 4/2001 |
| JP | 61091982 A | 5/1986 |
| JP | 61-116889 | 6/1986 |
| JP | 63-86593 | 4/1988 |
| JP | 1-115182 | 5/1989 |
| JP | 3-9582 | 1/1991 |
| JP | 3-166784 | 7/1991 |
| JP | 3-265180 | 11/1991 |
| JP | 4-17380 | 1/1992 |
| JP | 4-87388 | 3/1992 |
| JP | 6-250008 | 9/1994 |
| JP | 6-338644 | 12/1994 |
| JP | 10-341050 | 12/1998 |
| WO | WO96/07225 | 3/1996 |
| WO | WO99/19952 | 4/1999 |

OTHER PUBLICATIONS

J.H. Eberly, "Superradiance Revisited," *American Journal of Physics*, vol. 40, No. 10, Oct. 1972, pp. 1374-1383.

T.Y. Chang, "Improved Uniform-Filed Electrode Profiles for TEA Laser and High-Voltage Applications," *The Review of Scientific Instruments*, vol. 44, No. 4, Apr. 1973, pp. 405-407.

E.A. Stappaerts, "A novel analytical design method for discharge laser electrode profiles," *Applied Physics Letters*, vol. 40, No. 12, Jun. 15, 1982, pp. 1018-1019.

G.J. Ernst, "Compact Uniform Field Electrode Profiles," *Optics Communications*, vol. 47, No. 1, Aug. 1, 1983, pp. 47-51.

G.J. Ernst, "Uniform-Field Electrodes with Minimum Width," *Optics Communications*, vol. 49, No. 4, Mar. 15, 1984, pp. 275-277.

R. Marchetti et al., "A new type of corona-discharge photoionization source for gas lasers," *Journal of Applied Physics*, vol. 56, No. 11, Dec. 1, 1984, pp. 3163-3168.

S. Ogura et al., "Output Power Stabilization of a XeCl Excimer Laser by HCl Gas Injection," *SPIE Proceedings: Gas and Metal Vapor Lasers and Applications*, vol. 1412, Jan. 20-22, 1991, pp. 123-128.

R.A. Golobic et al., "Critical Experience with an Excimer Laser Angioplasty System," *SPIE Proceedings: Diagnostic and Therapeutic Cardiovascular Interventions*, vol. 1425, Jan. 20-22, 1991, pp. 84-91.

Z. Ujda et al., "Analysis of Possibility of Computer Control of the Parameters of an Excimer Laser Part II. Results of Computerization of the Parameter of a XeCl Laser," *Journal of Technical Physics, J. Tech. Phys.*, vol. 32 (1991), No. 3-4, pp. 399-408.

D.J. Elliott et al., "Recent advances in an excimer laser source for microlithography," *J. Vac. Sci. Technol. B*, vol. 9, No. 6, Nov./Dec. 1991, pp. 3122-3125.

D. Basting et al., "Industrial Excimer Lasers Fundamentals, Technology and Maintenance," Second Edition, © Lambda Physik GmbH in Göttingen 1991, pp. 1-97.

G.M. Jurisch et al, "Gas contaminant effects in discharge-excited KrF laser," *Applied Optics*, vol. 31, No. 12, Apr. 20, 1992, pp. 1975-1981.

A Publication by Lambda Physik, "Lambda Pysik's CLEO preview: SCANmate," Apr. 1993, 4 pages in length.

R.E. Turner et al., "Dependence of Excimer Laser Beam Properties on Laser Gas Composition," *SPIE Excimer Lasers*, vol. 1835 (1993), pp. 158-164.

R.S. Taylor et al., "Pre-preionization of a long optical pulse magnetic-spiker sustainer XeCl laser," *Rev. Sci. Instrum.*, vol. 65, No. 12, Dec. 1994, pp. 3621-3627.

R. Pätzel et al., "KrF Excimer Laser with repetition rates of 1 kHz for DUV Lithography," *SPIE*, vol. 2440 (1995), pp. 101-105.

R.S. Taylor, "Transmission Properties of Spark Preionization Radiation in Rare-Gas Halide Laser Gas Mixes," *IEEE Journal of Quantum Electronicss*, vol. 31, No. 12, Dec. 1995, pp. 2195-2207.

T. Enami et al., "High spectral purity and high durability kHz KrF excimer laser with advanced RF pre-ionization discharge," *SPIE*, vol. 3334, pp. 1031-1040.

N. Kataoka et al., "Performance Improvement of a Discharge-Pumped ArF Excimer Laser by Xenon Gas Addition," *Jpn. Appl. Phys.*, vol. 38, No. 12A, Dec. 1999, pp. 6735-6738.

O. Wakabayashi et al., "Billion level durable ArF excimer laser with highly stable energy," *SPIE 24th Annual International Symposium on Microlithography*, May 14-19, 1999, 11 pages in length.

V.M. Borisov et al., "Effects limiting the average power of compact pulse-periodic KrF lasers," *Quantum Electronics*, vol. 25 (1995), No. 5, pp. 421-425.

*Primary Examiner*—Armando Rodriguez
(74) *Attorney, Agent, or Firm*—Stallman & Pollock LLP

(57) ABSTRACT

Output beam parameters of a gas discharge laser are stabilized by maintaining a molecular fluorine component at a predetermined partial pressure using a gas supply unit and a processor. The molecular fluorine is subject to depletion within the discharge chamber. Gas injections including molecular fluorine can increase the partial pressure of molecular fluorine by a selected amount. The injections can be performed at selected intervals to maintain the constituent gas substantially at the initial partial pressure. The amount per injection and/or the interval between injections can be varied, based on factors such as driving voltage and a calculated amount of molecular fluorine in the discharge chamber. The driving voltage can be in one of multiple driving voltage ranges that are adjusted based on system aging. Within each range, gas injections and gas replacements can be performed based on, for example, total applied electrical energy or time/pulse count.

28 Claims, 29 Drawing Sheets

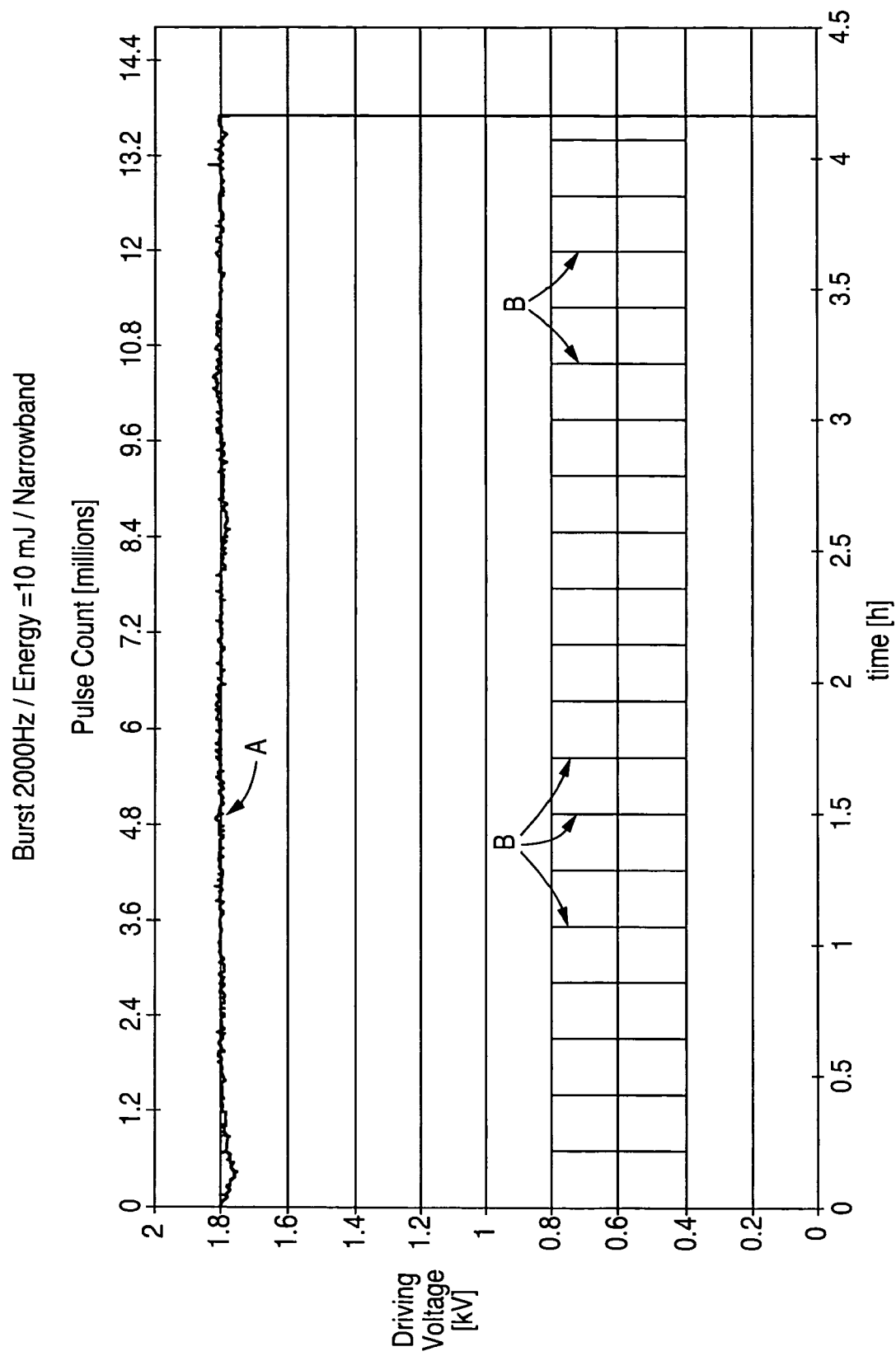

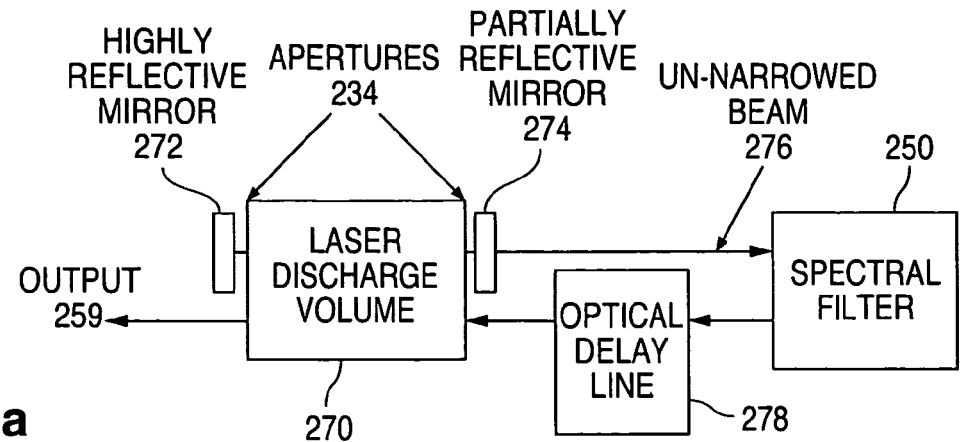
FIG. 32a
FIG. 32b(i)
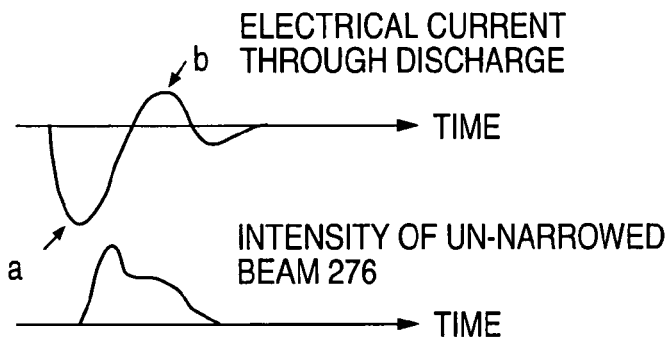
FIG. 32b(ii)
FIG. 32b(iii)
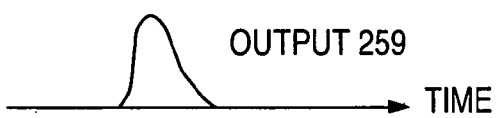
FIG. 33a
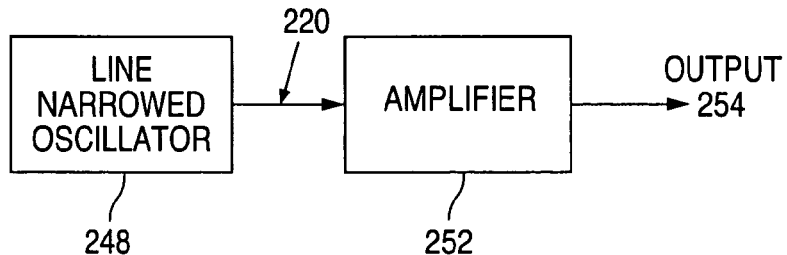

US 7,266,137 B2

LASER GAS REPLENISHMENT METHOD

CLAIM OF PRIORITY

This application is a Continuation of U.S. application Ser. No. 10/338,779, filed Jan. 6, 2003, now U.S. Pat. No. 6,965,624, which is a Continuation-in-Part of U.S. application Ser. No. 10/114,184, filed Apr. 1, 2002, now U.S. Pat. No. 6,504,861, which is a divisional of U.S. application Ser. No. 09/734,459, filed Dec. 11, 2000, now U.S. Pat. No. 6,389,052, which claims the benefit of priority to U.S. provisional patent application No. 60/171,717, filed Dec. 22, 1999, and which is a Continuation-in-Part of U.S. application Ser. No. 09/447,882, filed Nov. 23, 1999, now U.S. Pat. No. 6,490,307, which claims the benefit of U.S. provisional application No. 60/124,785, filed Mar. 17, 1999. U.S. application Ser. No. 10/338,779 also is a Continuation-in-Part of U.S. application Ser. No. 09/780,120, filed Feb. 9, 2001, now abandoned which claims priority to U.S. provisional application No. 60/182,083, filed Feb. 11, 2000. U.S. application Ser. No. 10/338,779 also is a Continuation-in-Part of U.S. application Ser. No. 09/738,849, filed Dec. 15, 2000, now U.S. Pat. No. 6,678,291, which claims priority to U.S. provisional application Nos. 60/173,993, filed Dec. 30, 1999, and 60/170,919, filed Dec. 15, 1999, and is a Continuation-in-Part of U.S. patent application Ser. No. 09/453,670, filed Dec. 3, 1999, now U.S. Pat. No. 6,466,599, which claims priority to U.S. provisional application No. 60/128,227, filed Apr. 7, 1999, and is a Continuation in Part of U.S. patent application Ser. No. 09/599,130, filed Jun. 22, 2000, now U.S. Pat. No. 6,381,256, which claims priority to U.S. provisional application No. 60/140,531, filed Jun. 23, 1999. U.S. application Ser. No. 10/338,779 also is a Continuation-in-Part of U.S. application Ser. No. 09/826,301, filed Apr. 3, 2001, now U.S. Pat. No. 6,556,609, which is a divisional of U.S. application Ser. No. 09/453,670, filed Dec. 3, 1999, now U.S. Pat. No. 6,466,599, which claims priority to U.S. provisional application No. 60/128,227, filed Apr. 7, 1999. U.S. application Ser. No. 10/338,779 also is a Continuation-in-Part of U.S. application Ser. No. 10/077,328, filed Feb. 15, 2002, now U.S. Pat. No. 6,546,037, which is a divisional of U.S. application Ser. No. 09/599,130, filed Jun. 22, 2000, now U.S. Pat. No. 6,381,256, which claims priority to U.S. provisional application Nos. 60/140,531, filed Jun. 23, 1999, and 60/204,095, filed May 15, 2000, and 60/162,735, filed Oct. 29, 1999, and 60/166,967, filed Nov. 23, 1999, and 60/170,342, filed Dec. 13, 1999, and which is a Continuation-in-Part of U.S. application Ser. No. 09/317,527, filed May 24, 1999, now U.S. Pat. No. 6,154,470, which claims priority to U.S. provisional application Nos. 60/120,218, filed Feb. 12, 1999 and 60/119,486, filed Feb. 10, 1999. The above applications are assigned to the same assignee as the present application and are hereby incorporated herein by reference.

TECHNICAL FIELD OF THE INVENTION

The present invention relates to a method and apparatus for stabilizing output beam parameters of a gas discharge laser. More particularly, the present invention relates to maintaining an optimal gas mixture composition over long, continuous operating or static periods using very small gas injections.

BACKGROUND

Pulsed gas discharge lasers such as excimer and molecular lasers emitting in the deep ultraviolet (DUV) or vacuum ultraviolet (VUV) have become very important for industrial applications such as photolithography. Such lasers generally include a discharge chamber containing two or more gases such as a halogen and one or two rare gases. KrF (248 μm), ArF (193 nm), XeF (350 nm), KrCl (222 nm), XeCl (308 μm), and $F_2$ (157 nm) lasers are examples.

The efficiencies of excitation of the gas mixtures and various parameters of the output beams of these lasers vary sensitively with the compositions of their gas mixtures. An optimal gas mixture composition for a KrF laser has preferred gas mixture component ratios around 0.1% $F_2$/1% Kr/98.9% Ne (see U.S. Pat. No. 4,393,505, which is assigned to the same assignee and is hereby incorporated by reference). A $F_2$ laser may have a gas component ratio around 0.1% $F_2$/99.9% Ne or He or a combination thereof (see U.S. Pat. No. 6,157,662, which is assigned to the same assignee and is hereby incorporated by reference). Small amounts of Xe may be added to rare gas halide gas mixtures, as well (see U.S. patent application Ser. No. 09/513,025, which is assigned to the same assignee and is hereby incorporated by reference; see also R. S. Taylor and K. E. Leopold, *Transmission Properties of Spark Preionization Radiation in Rare-Gas Halide Laser Gas Mixes*, IEEE Journal of Quantum Electronics, pp. 2195-2207, vol. 31, no. 12 (December 1995). Any deviation from the optimum gas compositions of these or other excimer or molecular lasers would typically result in instabilities or reductions from optimal of one or more output beam parameters such as beam energy, energy stability, temporal pulse width, temporal coherence, spatial coherence, discharge width, bandwidth, and long and short axial beam profiles and divergences.

Especially important in this regard is the concentration (or partial pressure) of the halogen, e.g., $F_2$, in the gas mixture. The depletion of the rare gases, e.g., Kr and Ne for a KrF laser, is low in comparison to that for the $F_2$. FIG. 1 shows laser output efficiency versus fluorine concentration for a KrF laser, showing a decreasing output efficiency away from a central maximum. FIG. 2 shows how the temporal pulse width (pulse length or duration) of KrF laser pulses decrease with increasing $F_2$ concentration. FIGS. 3-4 show the dependence of output energy on driving voltage (i.e., of the discharge circuit) for various $F_2$ concentrations of a $F_2$ laser. It is observed from FIGS. 3-4 that for any given driving voltage, the pulse energy decreases with decreasing $F_2$ concentration. In FIG. 3, for example, at 1.9 kV, the pulse energies are around 13 mJ, 11 mJ and 10 mJ for $F_2$ partial pressures of 3.46 mbar, 3.16 mbar and 2.86 mbar, respectively. The legend in FIG. 3 indicates the partial pressures of two premixes, i.e., premix A and premix B, that are filled into the discharge chamber of a KrF laser. Premix A comprised substantially 1% $F_2$ and 99% Ne, and premix B comprised substantially 1% Kr and 99% Ne. Therefore, for the graph indicated by triangular data points, a partial pressure of 346 mbar for premix A indicates that the gas mixture had substantially 3.46 mbar of $F_2$ and a partial pressure of 3200 mbar for premix B indicates that the gas mixture had substantially 32 mbar of Kr, the remainder of the gas mixture being the buffer gas Ne. FIG. 5 shows a steadily increasing bandwidth of a KrF laser with increasing $F_2$ concentration.

In industrial applications, it is advantageous to have an excimer or molecular fluorine laser capable of operating continuously for long periods of time, i.e., having minimal downtime. It is desired to have an excimer or molecular laser capable of running non-stop year round, or at least having a minimal number and duration of down time periods for scheduled maintenance, while maintaining constant output beam parameters. Uptimes of, e.g., greater than 98% require precise control and stabilization of output beam parameters, which in turn require precise control of the composition of the gas mixture.

Unfortunately, gas contamination occurs during operation of excimer and molecular fluorine lasers due to the aggressive nature of the fluorine or chlorine in the gas mixture. The halogen gas is highly reactive and its concentration in the gas mixture decreases as it reacts, leaving traces of contaminants. The halogen gas reacts with materials of the discharge chamber or tube as well as with other gases in the mixture. Moreover, the reactions take place and the gas mixture degrades whether the laser is operating (discharging) or not. The passive gas lifetime is about one week for a typical KrF-laser.

During operation of a KrF-excimer laser, such contaminants as HF, $CF_4$, $COF_2$, $SiF_4$ have been observed to increase in concentration rapidly (see G. M. Jurisch et al., *Gas Contaminant Effects in Discharge-Excited KrF Lasers*, Applied Optics, Vol. 31, No. 12, pp. 1975-1981 (Apr. 20, 1992)). For a static KrF laser gas mixture, i.e., with no discharge running, increases in the concentrations of HF, $O_2$, $CO_2$ and $SiF_4$ have been observed (see Jurisch et al., above).

One way to effectively reduce this gas degradation is by reducing or eliminating contamination sources within the laser discharge chamber. With this in mind, an all metal, ceramic laser tube has been disclosed (see D. Basting et al., *Laserrohr für halogenhaltige Gasentladungslaser*" G 295 20 280.1, Jan. 25, 1995/Apr. 18, 1996 (disclosing the Lambda Physik Novatube, and hereby incorporated by reference into the present application)). FIG. 6 qualitatively illustrates how using a tube comprising materials that are more resistant to halogen erosion (plot B) can slow the reduction of $F_2$ concentration in the gas mixture compared to using a tube which is not resistant to halogen erosion (plot A). The $F_2$ concentration is shown in plot A to decrease to about 60% of its initial value after about 70 million pulses, whereas the $F_2$ concentration is shown in plot B to decrease only to about 80% of its initial value after the same number of pulses. Gas purification systems, such as cryogenic gas filters (see U.S. Pat. Nos. 4,534,034, 5,136,605, 5,430,752, 5,111,473 and 5,001,721 assigned to the same assignee, and hereby incorporated by reference) or electrostatic particle filters (see U.S. Pat. No. 4,534,034, assigned to the same assignee and U.S. Pat. No. 5,586,134, each of which is incorporated by reference) are also being used to extend KrF laser gas lifetimes to 100 million shots before a new fill is advisable.

It is not easy to directly measure the halogen concentration within the laser tube for making rapid online adjustments (see U.S. Pat. No. 5,149,659 (disclosing monitoring chemical reactions in the gas mixture)). Therefore, it is recognized in the present invention that an advantageous method applicable to industrial laser systems includes using a known relationship between $F_2$ concentration and a laser parameter, such as one of the $F_2$ concentration dependent output beam parameters mentioned above. In such a method, precise values of the parameter would be directly measured, and the $F_2$ concentration would be calculated from those values. In this way, the $F_2$ concentration may be indirectly monitored.

Methods have been disclosed for indirectly monitoring halogen depletion in a narrow band excimer laser by monitoring beam profile (see U.S. Pat. No. 5,642,374, hereby incorporated by reference) and spectral (band) width (see U.S. Pat. No. 5,450,436, hereby incorporated by reference). Neither of these methods is particularly reliable, however, since beam profile and bandwidth are each influenced by various other operation conditions such as repetition rate, tuning accuracy, thermal conditions and aging of the laser tube. That is, the same bandwidth can be generated by different gas compositions depending on these other operating conditions.

An advantageous technique monitors amplified spontaneous emission (ASE), as is described in U.S. Pat. No. 6,243,406 (assigned to the same assignee and hereby incorporated by reference). The ASE is very sensitive to changes in fluorine concentration, and thus the fluorine concentration may be monitored indirectly by monitoring the ASE, notwithstanding whether other parameters are changing and affecting each other as the fluorine concentration in the gas mixture changes.

It is known to compensate the degradation in laser efficiency due to halogen depletion by steadily increasing the driving voltage of the discharge circuit to maintain the output beam at constant energy. To illustrate this, FIG. 7 shows how, at constant driving voltage, the energy of output laser pulses decreases with pulse count. FIG. 8 then shows how the driving voltage may be steadily increased to compensate the halogen depletion and thereby produce output pulses of constant energy.

One drawback of this approach is that output beam parameters other than energy such as those discussed above with respect to FIGS. 1-5 affected by the gas mixture degradation will not be correspondingly corrected by steadily increasing the driving voltage. FIGS. 9-11 illustrate this point showing the driving voltage dependencies, respectively, of the long and short axis beam profiles, short axis beam divergence and energy stability sigma. Moreover, at some point the halogen becomes so depleted that the driving voltage reaches its maximum value and the pulse energy cannot be maintained without refreshing the gas mixture.

It is desired to have a method of stabilizing all of the output parameters affected by halogen depletion and not just the energy of output pulses. It is recognized in the present invention that this is most advantageously achieved by adjusting the halogen and rare gas concentrations themselves.

There are techniques available for replenishing a gas mixture by injecting additional rare and halogen gases into the discharge chamber between new gas fills and to methods including readjusting the gas pressure, e.g., by releasing gases from the laser tube (see especially U.S. Pat. Nos. 6,490,307 and 6,212,214, and also U.S. Pat. No. 6,243,406; and U.S. Pat. Nos. 5,396,514 and 4,977,573, each of which is assigned to the same assignee and hereby incorporated by reference). A more complex system monitors gas mixture degradation and readjusts the gas mixture using selective replenishment algorithms for each gas of the gas mixture (see U.S. Pat. No. 5,440,578, hereby incorporated by reference). One technique uses an expert system including a database of information and graphs corresponding to different gas mixtures and laser operating conditions (see the '214 patent, mentioned just above). A data set of driving voltage versus output pulse energy, e.g., is measured and compared to a stored "master" data set corresponding to an optimal gas composition such as may be present in the discharge chamber after a new fill. From a comparison of values of the data sets and/or the slopes of graphs generated from the data sets, a present gas mixture status and appropriate gas replenishment procedures, if any, may be determined and undertaken to re-optimize the gas mixture. Early gas replenishment procedures are described in the '573 patent (mentioned above).

Most conventional techniques generally produce some disturbances in laser operation conditions when the gas is replenished. For example, strong pronounced jumps of the driving voltage are produced as a result of macro-halogen injections (macro-HI) as illustrated in FIG. 12 (macro-HI are distinguished from micro-halogen injections, or µHI, as described in the '307 patent). The result of a macro-HI is a strong distortion of meaningful output beam parameters such as the pulse-to-pulse stability. For this reason, in some techniques, the laser is typically shut down and restarted for gas replenishment, remarkably reducing laser uptime (see U.S. Pat. No. 5,450,436).

The '307 patent referred to above provides a technique wherein gas replenishment is performed for maintaining constant gas mixture conditions without disturbing significant output beam parameters. The '307 patent describes a gas discharge laser system which has a discharge chamber containing a gas mixture including a constituent halogen-containing species, a pair of electrodes connected to a power supply circuit including a driving voltage for energizing the first gas mixture, and a resonator surrounding the discharge chamber for generating a laser beam.

A gas supply unit is connected to the discharge chamber for replenishing the gas mixture including the constituent halogen-containing species. The gas supply unit includes a gas inlet port having a valve for permitting a small amount of gas to inject into the discharge chamber to mix with the gas mixture therein. A processor monitors a parameter indicative of the partial pressure of the first constituent gas and controls the valve at successive predetermined intervals to compensate a degradation of the constituent halogen-containing species in the gas mixture.

The partial pressure of the halogen containing-species in the gas mixture is increased by an amount preferably less than 0.2 mbar, as a result of each successive injection. The gaseous composition of the injected gas is preferably 1%-5% of the halogen-containing gas and 95%-99% buffer gas, so that the overall pressure in the discharge chamber increases by less than 20 mbar, and preferably less than 10 mbar per gas injection.

The processor monitors the parameter indicative of the partial pressure of the halogen-containing gas and the parameter varies with a known correspondence to the partial pressure of the halogen gas. The small gas injections each produce only small variations in partial pressure of the halogen gas in the gas mixture of the laser tube, and thus discontinuities in laser output beam parameters are reduced or altogether avoided.

The constituent gas is typically a halogen containing molecular species such as molecular fluorine or hydrogen chloride. The constituent gas to be replenished using the method of the '307 patent may alternatively be an active rare gas or gas additive. The monitored parameter may be any of time, shot count, driving voltage for maintaining a constant laser beam output energy, pulse shape, pulse duration, pulse stability, beam profile, bandwidth of the laser beam, energy stability, temporal pulse width, temporal coherence, spatial coherence, amplified spontaneous emission (ASE), discharge width, and long and short axial beam profiles and divergences, or a combination thereof. Each of these parameters varies with a known correspondence to the partial pressure of the halogen, and then halogen partial pressure is then precisely controlled using the small gas injections to provide stable output beam parameters.

The gas supply unit of the '307 patent preferably includes a small gas reservoir for storing the constituent gas or second gas mixture prior to being injected into the discharge chamber (see U.S. Pat. No. 5,396,514, which is assigned to the same assignee and is hereby incorporated by reference, for a general description of how such a gas reservoir may be used). The reservoir may be the volume of the valve assembly or an additional accumulator. The accumulator is advantageous for controlling the amount of the gas to be injected. The pressure and volume of the gases to be injected are selected so that the overall pressure in the discharge chamber will increase by a predetermined amount preferably less than 10 mbar, and preferably between 0.1 and 2 mbar, with each injection. As above, the halogen partial pressure preferably increases by less than 0.2 mbar and preferably far less such as around 0.02 mbar per injection. These preferred partial pressures may be varied depending on the percentage concentration of the halogen containing species in the gas pre-mixture to be injected.

Injections may be continuously performed during operation of the laser in selected amounts and at selected small intervals. Alternatively, a series of injections may be performed at small intervals followed by periods wherein no injections are performed. The series of injections followed by the latent period would then be repeated at predetermined larger intervals. A comprehensive algorithm is desired for performing gas actions in order to better stabilize the gas composition in the laser tube, and correspondingly better stabilize significant parameters of the output beam of the excimer or molecular fluorine laser system.

BRIEF SUMMARY

An excimer or molecular fluorine gas discharge laser system is provided including a laser chamber containing a laser gas mixture at least molecular fluorine and a buffer gas, the molecular fluorine being particularly subject to depletion; a power supply circuit including a high voltage power supply and a pulse compression circuit; multiple electrodes connected to the power supply circuit for providing a driving voltage as a pulsed discharge to energize said laser gas mixture, the multiple electrodes including a pair of main electrodes and at least one preionization unit; a resonator including the discharge chamber and line-narrowing and/or line-selection optics for generating a pulsed, narrowband laser beam at a wavelength less than 250 nm and a bandwidth less than 1 pm; a fan for circulating the gas mixture between the main electrodes at a predetermined flow rate, wherein the discharge width divided by the flow rate of said gas mixture through said discharge is less than substantially 0.5 milliseconds; a heat exchanger for controlling a temperature of the gas mixture; a gas supply unit connected to the laser chamber; a processor for controlling gaseous flow between said gas supply unit and the laser chamber, wherein the gas supply unit and the processor are configured to permit a quantity less than 7% of the halogen gas in the laser chamber to inject into the laser chamber at selected intervals; and an amplifier, wherein the narrowband laser beam generated by the resonator is directed through the amplifier for increasing the power of the beam.

Extra-resonator optics may be provided for redirecting the beam generated by and outcoupled from the resonator back into the laser chamber at or near a time of maximum discharge current within the laser chamber, as the amplifier for increasing the power of the beam. The extra-resonator optics may include an optical delay line for timing the entry of the beam back into the laser chamber for amplification at or near the time of maximum discharge current.

The buffer gas may include neon for pressurizing the gas mixture sufficiently to enhance the performance of the laser, and wherein the processor cooperates with the gas supply system to control the molecular fluorine concentration within the discharge chamber to maintain the molecular fluorine concentration within a predetermined range of optimum performance of the laser.

An aperture may be provided within the resonator. The line-narrowing and/or selection optics may include a beam expander before at least one of a grating, a grism, an interferometric device and a dispersion prism. The aperture may be positioned between the laser chamber and the beam expander. A second aperture may be provided on the other side of the laser chamber. A highly reflective mirror may be provided before the grating.

An excimer or molecular fluorine gas discharge laser system is also provided including a laser chamber containing a laser gas mixture at least molecular fluorine and a buffer gas, the molecular fluorine being particularly subject to depletion; a power supply circuit including a high voltage power supply and a pulse compression circuit; multiple electrodes connected to the power supply circuit for providing a driving voltage as a pulsed discharge to energize said laser gas mixture, the multiple electrodes including a pair of main electrodes and at least one preionization unit; a resonator including the discharge chamber and line-narrowing and/or line-selection optics for generating a pulsed, narrowband laser beam at a wavelength less than 250 nm and a bandwidth less than 1 pm; a fan for circulating the gas mixture between the main electrodes at a predetermined flow rate, wherein the discharge width divided by the flow rate of said gas mixture through said discharge is less than substantially 0.5 milliseconds; a heat exchanger for controlling a temperature of the gas mixture; a gas supply unit connected to the laser chamber; a processor for controlling gaseous flow between the gas supply unit and the laser chamber, wherein the gas supply unit and the processor are configured to permit a quantity less than 7% of the halogen gas in the laser chamber to inject into the laser chamber at selected intervals; and an energy detector module including an energy detector and beam splitter module provided in a sealed enclosure substantially devoid of molecular species that photoabsorb around the sub-250 nm wavelength of the narrowband laser beam, and wherein the beam splitter module separates a beam portion from a main output laser beam for detection at the energy detector.

The energy detector module may be purged with an inert gas at a slight, regulated overpressure, or evacuated to low pressure. The energy detector module may be coupled with a main enclosure for the narrowband laser beam, such that a beam path of the separated beam portion to be detected at the energy detector is substantially free of the photoabsorbing species.

An excimer or molecular fluorine gas discharge laser system is further provided including a laser chamber containing a laser gas mixture at least molecular fluorine and a buffer gas, the molecular fluorine being particularly subject to depletion; a power supply circuit including a high voltage power supply and a pulse compression circuit; multiple electrodes connected to the power supply circuit for providing a driving voltage as a pulsed discharge to energize the laser gas mixture, the multiple electrodes including a pair of main electrodes and at least one preionization unit, wherein at least one of the main electrodes includes a narrow central portion and a base portion, the narrow portion substantially carrying a discharge current such that the discharge width is substantially 4 mm or less; a resonator including the discharge chamber and line-narrowing and/or line-selection optics for generating a pulsed, narrowband laser beam at a wavelength less than 250 nm and a bandwidth less than 1 pm; a fan for circulating the gas mixture between the main electrodes at a predetermined flow rate, wherein the discharge width divided by the flow rate of the gas mixture through the discharge is less than substantially 0.5 milliseconds; a heat exchanger for controlling a temperature of the gas mixture; a gas supply unit connected to the laser chamber; and a processor for controlling gaseous flow between the gas supply unit and the laser chamber, wherein the gas supply unit and the processor are configured to permit a quantity less than 7% of the halogen gas in the laser chamber to inject into the laser chamber at selected intervals.

The laser gas flow rate may be more than 10-15 m/s. The discharge width may be 2 mm or less. The laser chamber may include a spoiler for forming gas flow between the main electrodes to reduce turbulence. The laser chamber may further include aerodynamic current return ribs defining upstream to downstream tapered openings for further forming gas flow between the main electrodes to further reduce turbulence. The discharge width divided by the flow rate may be less than or equal to substantially 0.25 milliseconds.

A method is provided for controlling a composition of a gas mixture within a laser chamber of a high power (2 kHz or more) excimer or molecular fluorine gas discharge laser system including the laser chamber disposed within a laser resonator including line-narrowing and/or selection optics, and an amplifier chamber, the gas mixture at least including molecular fluorine and a buffer gas. The method includes operating the laser system for generating a high power, narrowband laser beam; monitoring a parameter indicative of the molecular fluorine concentration in the gas mixture; determining a next amount of molecular fluorine less than substantially 7% of an amount already in the laser chamber to be injected into the laser chamber based on an amount determined at least approximately to be within the laser chamber; narrowing the bandwidth of the beam to less than 1 pm within the laser resonator; outcoupling the beam from the resonator; and amplifying the outcoupled beam within the amplifier chamber for increasing the power of the beam.

A step of monitoring an input driving voltage of a pulse power circuit of the laser system may be including, as well as determining the next amount of molecular fluorine based further on a value of the input driving voltage. A step of adjusting a total pressure of the gas mixture within the laser tube to maintain the input driving voltage within a tolerance range of an optimal input driving voltage may also be included. The total pressure adjusting step may include releasing a predetermined amount of the gas mixture from the laser tube and/or adding a predetermined amount of gas to the gas mixture within the laser tube. The method may further include applying a first input voltage to the electrodes to excite the gas mixture having a first pressure for generating the beam at the desired energy; and applying a second input voltage to the electrodes to excite the gas mixture having a second pressure for generating the beam at the substantially same desired energy. The narrowing step may include expanding and dispersing the beam prior to the outcoupling step. The narrowing step may further include passing the beam through one or more intra-resonator apertures. The next amount to be injected may be less than substantially 5% of said amount already in the laser chamber.

BRIEF DESCRIPTION OF THE DRAWINGS

FIG. 13b shows a schematic diagram of the gas control unit of the excimer or molecular laser of FIG. 13a.

FIG. 15 is a graph of driving voltage versus time also showing periodic halogen injections for a system in accord with a preferred embodiment.

FIG. 32a schematically shows an alternative embodiment in accord with the second aspect of the invention including a single discharge chamber providing the gain medium for both an oscillator and an amplifier, and having a spectral filter in between.

FIG. 32b(i)-(iii) respectively show waveforms of the electrical discharge current, un-narrowed beam intensity and output beam intensity in accord with the alternative embodiment of FIG. 3a.

FIG. 33a schematically shows a preferred embodiment in accord with a third aspect of the invention including a line-narrowed oscillator followed by a power amplifier.

INCORPORATION BY REFERENCE

Figure 1:
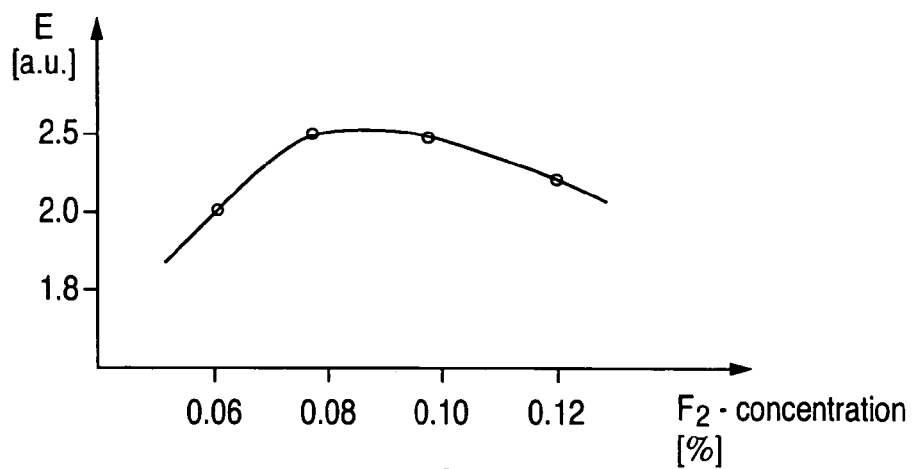
FIG. 1 is a graph of the output efficiency of an excimer or molecular laser versus $F_2$-concentration.
Figure 2:
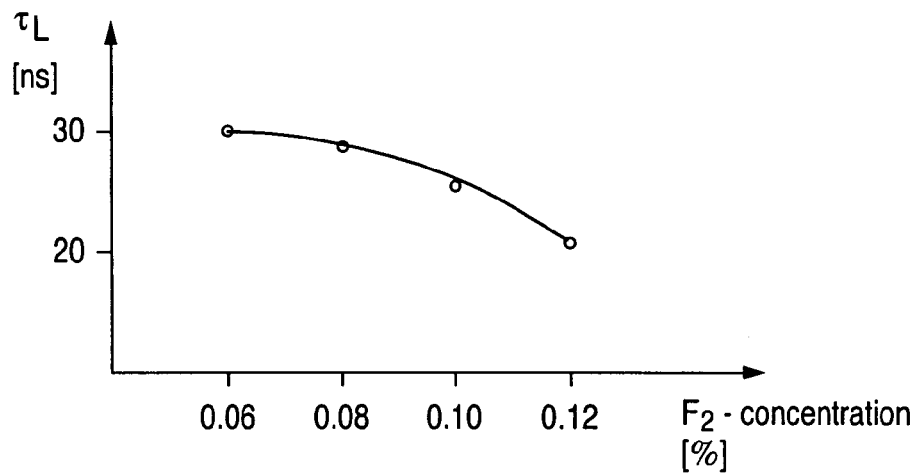
FIG. 2 is a graph of integrated pulse width of an excimer or molecular laser versus $F_2$-concentration.
Figure 4:
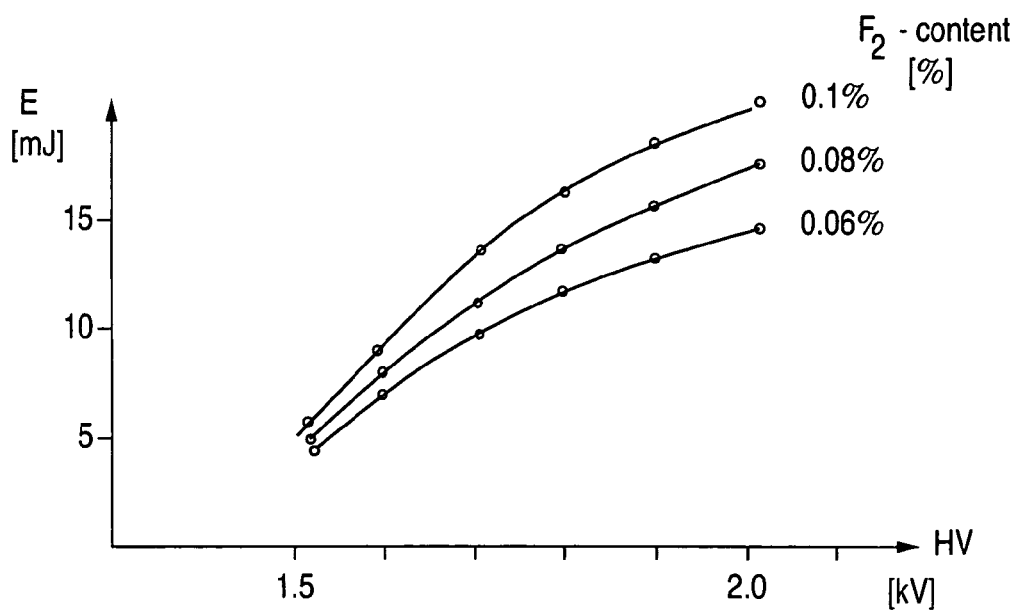
FIG. 4 shows several graphs of output beam energy of an excimer or molecular fluorine laser versus driving voltage for various $F_2$ concentrations.
Figure 3:
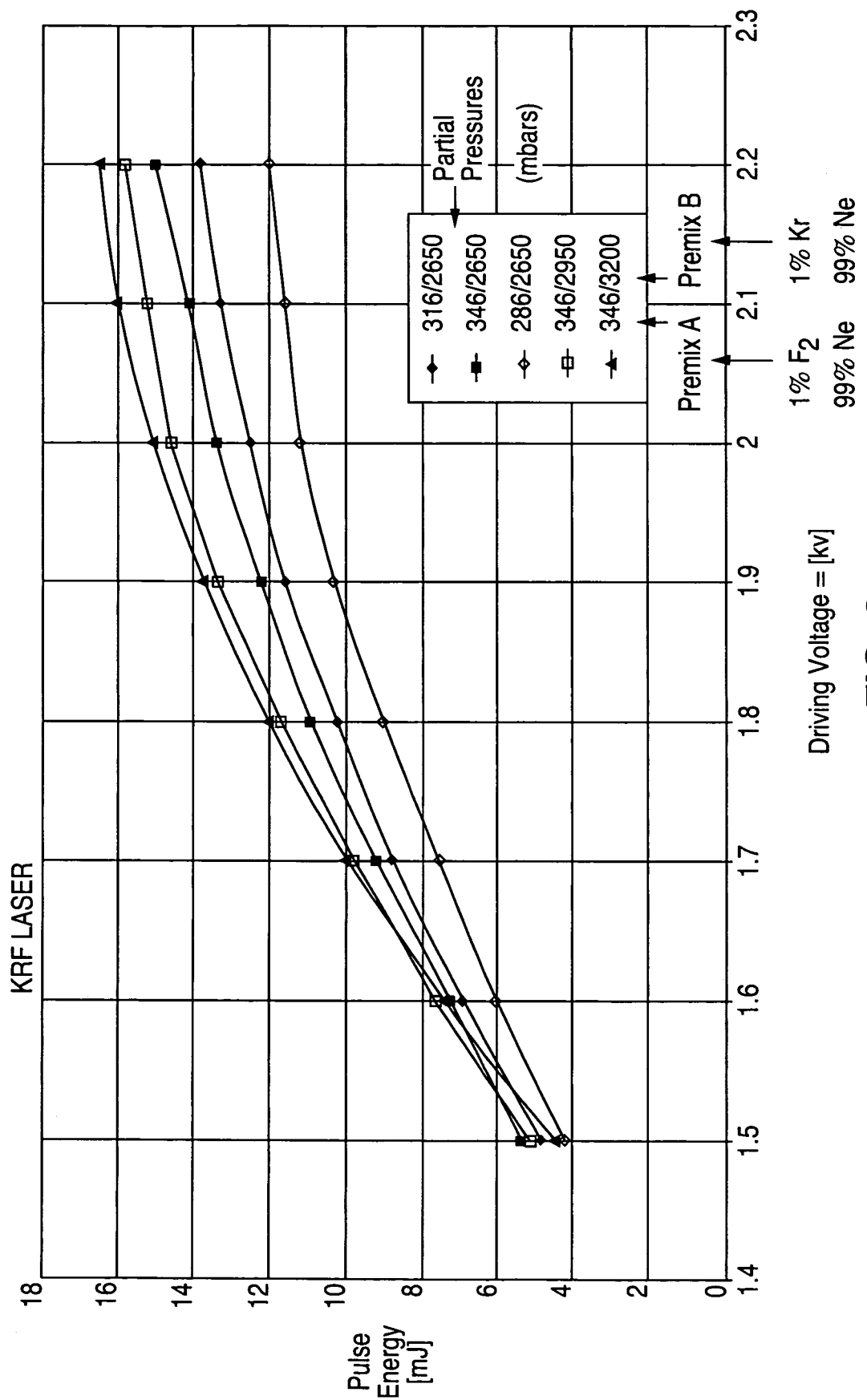
FIG. 3 shows several graphs of output beam energy of a KrF excimer laser versus driving voltage for various gas mixture component partial pressures.
Figure 5:
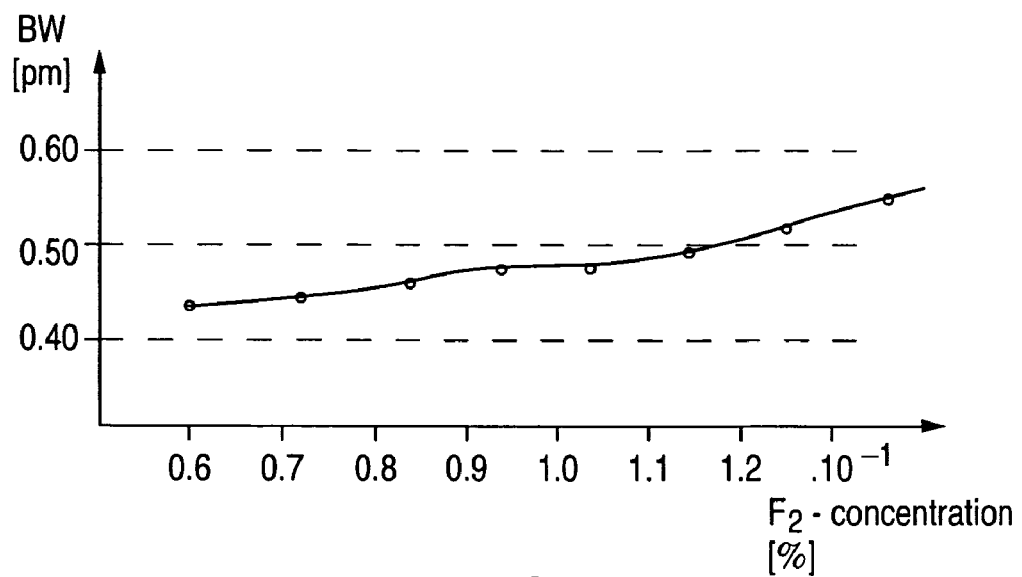
FIG. 5 is a graph of the bandwidth of an excimer laser versus $F_2$ concentration.
Figure 6:
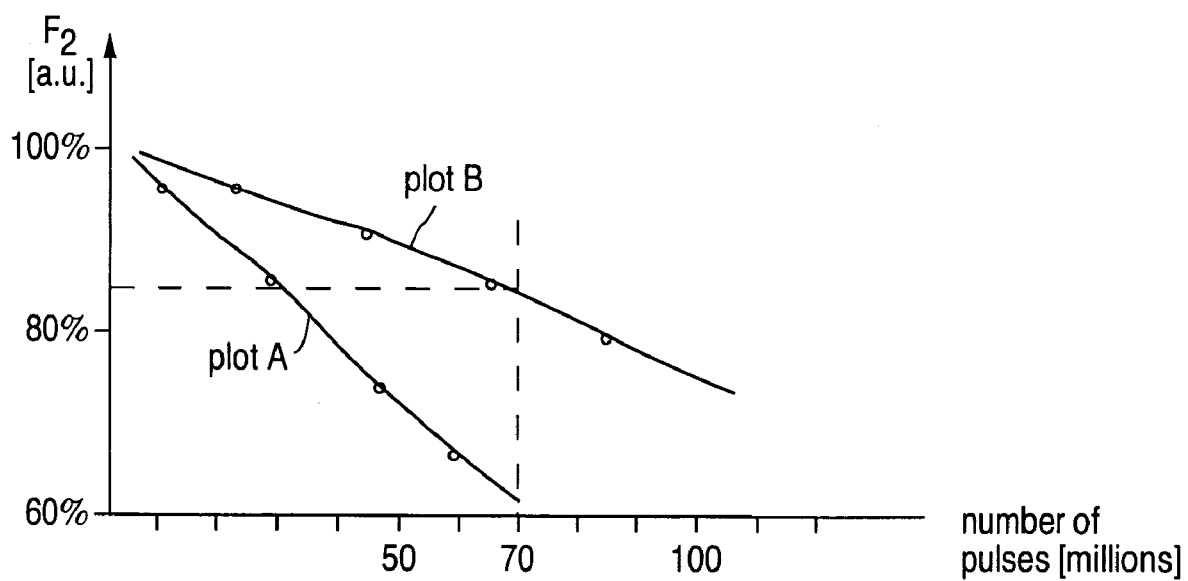
FIG. 6 illustrates how $F_2$ depletion rates vary for excimer or molecular fluorine lasers depending on discharge chamber composition.
Figure 7:
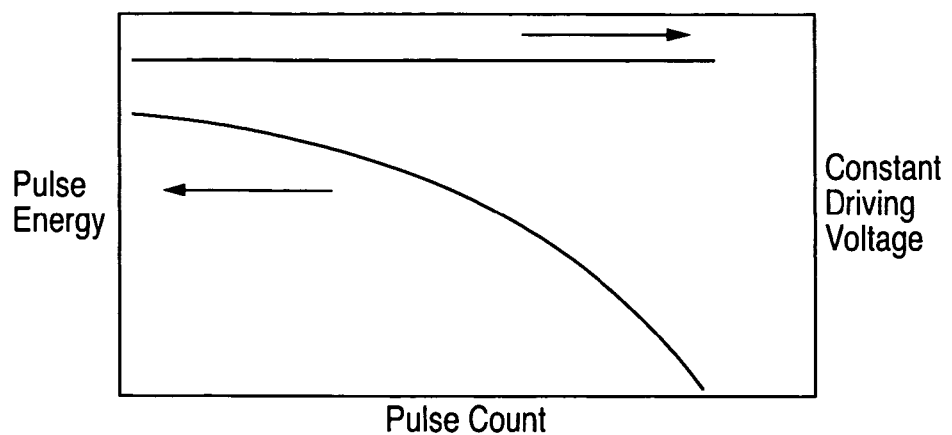
FIG. 7 is a graph of pulse energy versus pulse count for an excimer or molecular laser operating at constant driving voltage.

What follows is a cite list of references each of which is, in addition to those references cited above in the priority section, hereby incorporated by reference into the detailed description of the preferred embodiment below, as disclosing alternative embodiments of elements or features of the preferred embodiments not otherwise set forth in detail below. A single one or a combination of two or more of these references may be consulted to obtain a variation of the preferred embodiments described in the detailed description below. Further patent, patent application and non-patent references are cited in the written description and are also incorporated by reference into the preferred embodiment with the same effect as just described with respect to the following references:

U.S. Pat. Nos. 3,899,750, 4,009,933, 4,240,044, 4,380,079, 4,393,505, 4,399,540, 4,429,392, 4,534,034, 4,611,270, 4,616,908, 4,674,099, 4,686,682, 4,691,322, 4,716,569, 4,719,637, 4,722,090, 4,740,982, 4,763,336, 4,829,536, 4,856,018, 4,860,300, 4,891,818, 4,905,243, 4,926,428, 4,953,174, 4,958,174, 4,975,919, 4,977,573, 5,001,721, 5,005,181, 5,025,445, 5,081,635, 5,090,020, 5,095,492, 5,097,291, 5,099,491, 5,111,473, 5,136,605, 5,140,600, 5,142,543, 5,149,659, 5,150,370, 5,221,823, 5,226,050, 5,243,614, 5,247,531, 5,247,534, 5,247,535, 5,247,535, 5,260,961, 5,307,364, 5,337,330, 5,377,215, 5,396,514, 5,404,366, 5,405,207, 5,430,752, 5,440,578, 5,450,436, 5,463,650, 5,534,034, 5,535,233, 5,557,629, 5,559,584, 5,559,816, 5,586,134, 5,596,596, 5,598,300, 5,642,374, 5,646,954, 5,652,681, 5,659,419, 5,659,531, 5,663,973, 5,684,822, 5,710,787, 5,729,562, 5,729,565, 5,748,346, 5,754,579, 5,761,236, 5,763,855, 5,771,258, 5,802,094, 5,811,753, 5,818,865, 5,835,520, 5,852,627, 5,856,991, 5,887,014, 5,898,725, 5,901,163, 5,914,974, 5,917,849, 5,923,693, 5,936,988, 5,940,421, 5,946,337, 5,949,806, 5,970,082, 5,978,391, 5,978,394, 5,978,405, 5,978,406, 5,978,409, 5,982,795, 5,982,800, 5,991,324, 5,999,318, 6,005,879, 6,005,880, 6,014,398, 6,018,537, 6,028,872, 6,028,880, 6,020,723, 6,061,382, 6,081,542, 6,084,897, 6,130,904, 6,151,346, 6,151,350, 6,154,470, 6,157,662, 6,160,831, 6,160,832, 6,188,710, 6,389,052, 4,997,573, 5,337,215, 5,097,291, 5,140,600, 5,450,436, 4,674,099, 5,463,650, 5,710,787, 6,084,897, 5,835,520, 5,978,406, 6,028,880, 6,130,904, 6,151,350, 5,901,163, 5,856,991, 6,028,879, 5,559,816, 4,977,563, 4,611,270, 6,061,382, 5,406,571, 5,852,627, 3,609,856, 5,095,492 3,471,800, 3,546,622, 5,440,574, 6,014,206, 5,373,515, 6,128,323, 6,243,406, 6,490,307, 6,212,214, 6,243,405, 6,389,052, 6,157,662, 6,219,368, 6,345,065, 6,154,470, 6,285,701, 6,381,256, 6,424,666, 6,426,966, 6,160,831, 6,393,037, 6,466,599, 6,430,205, 6,414,978, 6,442,182, 6,493,370, 6,504,861, 6,490,308, 6,463,086, 6,490,306 and 5,479,431;

U.S. patent application nos. 2001/0012309, 2002/0031157, 10/077,328, 09/583,037, 09/513,025, 09/588,561, 09/512,417, 09/712,877, 09/574,921, 09/738,849, 09/718,809, 09/733,874, 09/771,366, 09/271,020, 09/454,803, 09/780,120, 09/657,396, 09/602,184, 09/629,256, 09/843,604, 09/900,703, 09/960,875, and 09/780,124, each of which is assigned to the same assignee as the present application; and Japanese Published Application No. SHO-63-86593.

U. Stamm, "Status of 157 nm The 157 Excimer Laser" International SEMATECH 157 nm Workshop, Feb. 15-17 1999, Litchfield, Ariz., USA;

T. Hofman, J. M. Hueber, P. Das, S. Scholler, "Prospects of High Repetition Rate $F_2$ (157 nm) Laser for Microlithography", International SEMATECH 157 Workshop, Feb. 15-17 1999, Litchfield, Ariz., USA;

U. Stamm, I. Bragin, S. Govorkov, J. Kleinschmidt, R. Patzel, E. Slobodtchikov, K. Vogler, F. Voss, and D. Basting, "Excimer Laser for 157 nm Lithography", $24^{th}$ International Symposium on Microlithography, Mar. 14-19,1999, Santa Clara, Calif., USA;

T. Hofmann, J. M. Hueber, P. Das, S. Scholler, "Revisiting The $F_2$ Laser For DUV microlithography", $24^{th}$ International Symposium on Microlithography, Mar. 14-19, 1999, Santa Clara, Calif., USA.

W. Muckenheim, B. Ruckle, "Excimer Laser with Narrow Linewidth and Large Internal Beam Divergence", J. Phys. E: Sci. Instrum. 20 (1987)1394;

G. Grunefeld, H. Schluter, P. Andersen, E. W. Rothe, "Operation of KrF and ArF Tunable Excimer Lasers Without Cassegrain Optics", Applied Physics B 62 (1996) 241; and W. Mueckenheim, "Seven Ways to Combine Two Excimer Lasers," reprinted from July 1987 edition of Laser Focus/Electro-Optics.

German Utility Model No. 299 07 349.1;

Japanese patent nos. 8-274399, 2-152288, 60-16479, and 62-160783;

R. Hultzsch: Gitterprismen, Photonik (September 1998), p. 40;

W. Demtroder: Laser Spectroscopy Springer, Berlin Heidelberg (1996) p. 112; and

W. A. Taub: Constant Dispersion Grism Spectrometer for Channeled Spectra J. Opt. Soc. Am. A7 (1990) p. 1779.

DETAILED DESCRIPTION

A gas replenishment technique is provided for an excimer or molecular fluorine laser system. The technique encompasses several aspects of the present invention, each contributing to achieving the above objects. In a first aspect, it is recognized that the fluorine concentration in the laser gas mixture has a known correspondence to the value of the driving voltage, when the driving voltage is being adjusted to maintain a constant pulse-to-pulse output beam energy, constant energy dose or moving average energy dose, optimum energy stability, etc. Thus, a particular gas replenishment action is performed first based on the value of the driving voltage for each gas action, and then based on a counter that counts total accumulated electrical input to the discharge, time and/or pulse count.

For example, the amount of gas including a halogen-containing species and/or the total amount of gas injected may be based on the driving voltage. Whether the gas action is a partial or mini gas replacement or only a gas injection is also determined based on the driving voltage. It may be determined that no gas action will be presently performed. Also, the interval between the previous gas action and the next gas action may be adjusted.

Another factor that is preferably taken in account in determining the above particulars of the next gas action is the specific amount of halogen that was injected during the previous gas action. That amount may be determined based on measurements of the gas pressure in an accumulator (see the '785 application) from which the gas was injected during the previous gas action (and optionally also based on the pressure in the laser tube). The temperatures of the gas mixtures in the laser tube and the accumulator may also be taken into account.

On a larger overall scale, or macro scale, the determination of which gas actions are to be performed, if any, may be based on which of several ranges of driving voltages that the driving voltage is presently at. For example, if the driving voltage is presently in a first range, then partial gas replacement (PGR) will be performed for cleaning the gas mixture, and causing the driving voltage to vary out of the first range.

If the driving voltage is presently in a second range below the first range, then enhanced μHIs together with periodic mini-gas replacements (MGR) are performed, preferably subject to adjustments as described above from injection to injection and/or from MGR to MGR, until the driving voltage varies out of the second range. Enhanced μHIs may include injections of larger amounts of halogen than ordinary μHIs, or the injections may be performed more often or at reduced intervals than ordinary μHIs would be performed.

If the driving voltage is presently in a third range below the second range, then ordinary μHIs together with periodic mini-gas replacements (MGR) are performed, preferably subject to adjustments as described above from injection to injection and/or from MGR to MGR, until and unless the driving voltage varies out of the third range.

If the driving voltage is presently in a fourth range below the third range, then no gas actions are performed. Alternatively, a gas replacement action may be performed, e.g., to reduce the fluorine concentration in the gas mixture. More than MGR may be performed, or more than one amount of gas may be injected (and correspondingly released) during MGRs, as well, or the interval between MGRs may be adjusted.

In addition, after a new fill of the laser tube, the system of the present invention is adjusted depending on the age of the tube and/or the optics of the laser resonator. The driving voltage ranges may be adjusted within which the particular types of gas actions are performed as described above.

Figure 13A:
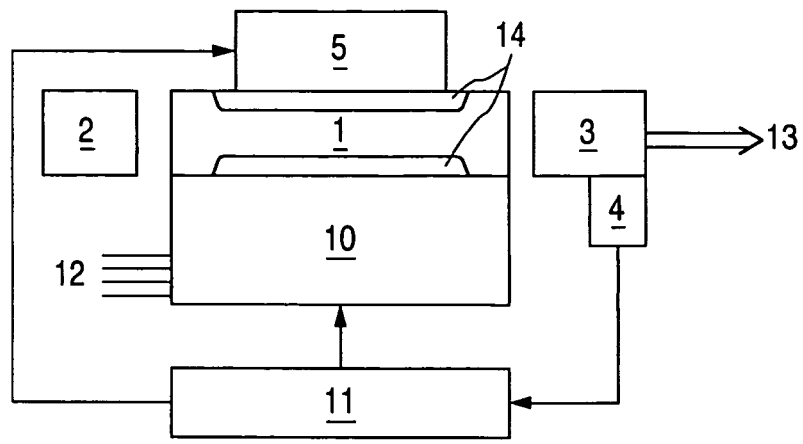
FIG. 13a shows a schematic block diagram of an excimer or molecular laser in accord with a preferred embodiment.

FIG. 13a shows a schematic block diagram of a preferred embodiment of an excimer or molecular fluorine laser. The laser system of FIG. 13a includes a laser tube 1 including an electrode or discharge chamber and a gas flow vessel, wherein the gas flow vessel typically includes a blower and heat exchanger or cooling unit. The laser tube 1 contains a laser gas mixture, and a pressure gauge P is preferably provided for monitoring the pressure in the laser tube 1. A resonator surrounds the tube 1 and includes a rear optics module 2 and a front optics module 3.

The rear optics module 2 includes a resonator reflector which may be a highly reflective mirror, a grating or a highly reflecting surface of another optical component such as an etalon or a prism. A wavelength calibration module is preferably included with the rear optics module. Preferred wavelength calibration units or devices and techniques are disclosed in U.S. Pat. No. 4,905,243 and U.S. patent application Ser. Nos. 09/136,275, 09/167,657 and 09/179,262, each of which is assigned to the same assignee as the present application and is hereby incorporated by reference.

The front optics module 3 preferably includes a resonator reflector which is preferably an output coupler. The resonator reflector of the front optics module may alternatively be a highly reflecting mirror and other means for output coupling the beam 13 may be used, such as a beam splitter or other angled partially reflecting surface within the resonator.

The front optics module 3 also may include a line narrowing and/or selection unit and/or a wavelength tuning unit.

Alternatively, the line narrowing and/or selection unit and/or wavelength tuning unit may be included with the rear optics module. Such optical elements as one or more beam expanding elements such as beam expanding prism(s) and/or lens arrangements, one or more dispersive elements such as dispersive prism(s) and/or a grating, one or more etalons, birefringent plate(s), or grism(s) may be included for line narrowing, selection and/or tuning. U.S. Pat. Nos. 4,399,540, 4,905,243, 5,226,050, 5,559,816, 5,659,419, 5,663,973, 5,761,236, and 5,946,337, and U.S. patent application Ser. Nos. 09/317,695, 09/130,277, 09/244,554, 09/317,527, 09/073,070, 60/124,241, 60/140,532, and 60/140,531, each of which is assigned to the same assignee as the present application, and U.S. Pat. Nos. 5,095,492, 5,684,822, 5,835,520, 5,852,627, 5,856,991, 5,898,725, 5,901,163, 5,917,849, 5,970,082, 5,404,366, 4,975,919, 5,142,543, 5,596,596, 5,802,094, 4,856,018, and 4,829,536, are each hereby incorporated by reference into the present application, as describing line narrowing, selection and/or tuning elements, devices and/or techniques, among others known to those skilled in the art, which may be used in a laser system according to the preferred embodiment.

Wavelength, pulse energy, and gas control information, as well as other information about the laser system is received by a processor 11. The processor 11 controls the wavelength of the output beam 13 by controlling the line tuning module based on the wavelength information the processor 11 receives, the electrical pulse power and discharge module ("pulse power module") 5 based on pulse energy information it receives, and gas control elements 6-10 and 12 based on information it receives relating to the gas mixture status, and on data saved in its database(s) (see the '653 application, above).

A beam portion is preferably received by an energy monitor 4 which measures the energy and/or angular distribution and/or other beam parameters of the received beam portion of the output beam 13. Data corresponding to the energy of the beam portion is then sent to the processor 11 which is connected to the energy monitor 4. The processor 11 then uses this information to perform processing relating to the energy of the output beam 13.

The pulse power module 5 provides energy to the gas mixture via a pair of electrodes 14 within the discharge chamber 1. Preferably, a preionization unit (not shown) is also energized by the pulse power module for preionizing the gas mixture just prior to the main discharge. The energy of the output beam 13 of the laser system has a known dependence on the "driving voltage" of the pulse power module. The driving voltage is adjusted during laser operation to control and stabilize the energy of the output beam 13. The processor 11 controls the driving voltage based on the energy information received from the energy monitor 4. In accord with the present invention, the processor 11 also controls and stabilizes the status of the gas mixture and thus indirectly controls and stabilizes other laser output beam parameters such as energy stability, temporal pulse width, spatial and temporal coherences, bandwidth, and long and short axial beam profiles and divergences by controlling the status of the gas mixture within the laser tube 1.

Figure 13B:
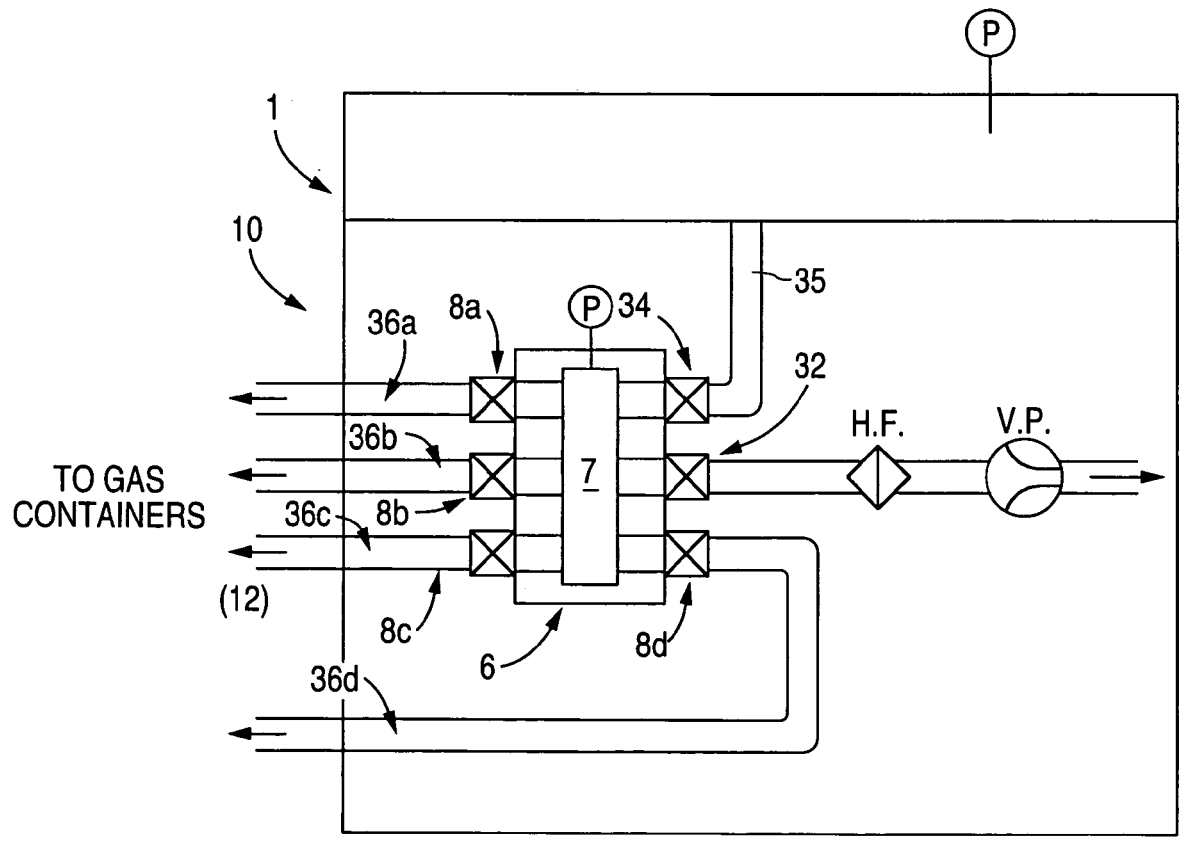

FIG. 13b shows a detailed schematic of the gas control box 10 of FIG. 13a. The gas control box 10 is connected to the laser tube 1 for supplying gas based on control signals received from the processor 11. The processor 11 regulates the delivery of gases or mixtures of gases to the laser tube 1 via a valve assembly 6 or system of valves. The valve assembly preferably has a reservoir or compartment 7 having a known volume and having a pressure gauge P attached for measuring the pressure in the compartment 7. The compartment and the laser tube preferably also each have means, such as a thermocouple arrangement, for measuring the temperature of the gases within the compartment and tube. The compartment 7 may be 20 cm$^3$ or so in volumetric size (by contrast, the laser tube 1 may be 42,000 cm$^3$ volumetrically). Four valves 8a-8d are shown as controlling the flow of gases contained in external gas containers into the compartment 7. Of course, more or less than four such valves may be provided. Another valve 32 is shown controlling the access of a vacuum pump vp to the compartment 7 which is shown connected through a halogen filter hf. Another valve 34 is shown controlling the flow of gases between the compartment 7 and the laser tube 1. A further valve or valves (not shown) may be provided along the line 35 from valve 34 to the tube 1 for controlling the atmosphere in the line 35, e.g., using a pump for evacuating the line 35.

Small amounts of a gas or gas mixture are preferably injected from the compartment 7 into the discharge chamber 1 as μHIs or enhanced μHIs, or during a PGR or MGR action. As an example, the gas supply connected to the valve assembly 6 through gas line 36a may be a premix A including 1% $F_2$:99% Ne, and that through gas line 36b may be a premix B including 1% Kr:99% Ne, for a KrF laser. For an ArF laser, premix B would have Ar instead of Kr, and for a $F_2$ laser premix B is not used. Thus, by injecting premix A and premix B into the tube 1 via the valve assembly, the fluorine and krypton concentrations in the laser tube 1, respectively, may be replenished. Gas lines 36c and 36d may be used for different additional gas mixtures. Although not shown, the tube 1 preferably has additional means for releasing gas, or alternatively, the gas is released through the valve assembly, such as via valves 34 and 32.

New fills, partial and mini gas replacements and gas injection procedures, e.g., enhanced and ordinary micro-halogen injections, and any and all other gas replenishment actions are initiated and controlled by the processor 11 which controls the valve assembly 6 and the pump vp based on various input information in a feedback loop.

An exemplary method according to the present invention is next described for accurately and precisely replenishing the fluorine concentration in the laser tube 1 in small amounts such that significant output beam parameters are not significantly disturbed, if at all, with each gas injection. The processor 11, which is monitoring a parameter indicative of the fluorine concentration in the laser tube 11, determines that it is time for a micro-halogen injection (μHI).

The processor 11 then sends a signal that causes valve 8a to open and allow premix A to fill the compartment 7 to a predetermined pressure, e.g., 5 bar. Then, valve 8a is closed and valve 34 is opened allowing at least some of the premix A that was filled into the compartment 7 to release into the laser tube 1.

If the pressure in the tube was 3 bar prior to the injection and the tube has 42,000 cm$^3$, and the injection is such that the pressure in the accumulator was reduced to 3 bar after the injection, then 2×20/40,000 bar would be the pressure increase in the tube 1 as a result of the injection, or 1 mbar. If the premix A contains 1% $F_2$:99% Ne, then the increase in partial pressure of the $F_2$ in the laser tube as a result of the injection would be approximately 0.01 mbar.

The above calculation may be performed by the processor 11 to determine more precisely how much $F_2$ was injected, or prior to injection, the pressure in the compartment 7 may be set according to a calculation by the processor 11 concerning how much $F_2$ should be injected based on the status information of the monitored parameter received by the processor 11, or based on pre-programmed criteria. A correction for difference in temperature between the gas in the compartment 7 and that in the tube 1 may also be performed by the processor 11 for more accuracy, or the temperature of the gas in the compartment 7 may be preset, e.g., to the temperature within the laser tube 1.

Preferably, an amount of gas premix corresponding to smaller than 10 mbar total gas pressure, or 0.1 mbar $F_2$ partial pressure, increase in the tube 1 is injected from the compartment 7. Even more preferably, less than 5 mbar or even 2 mbar total gas pressure (0.05 or 0.02 mbar $F_2$ partial pressure) increase in the laser tube 1 results from the gas injection.

The compartment 7 may simply be the valve assembly 6 itself, or may be an additional accumulator (described in detail below). The compartment 7 is also configured so that the small amounts of gas may be injected at successive very short intervals, to compensate a degradation of a halogen gas and/or another gas or gases within the discharge chamber 1 of an excimer or molecular laser such as a KrF, ArF or $F_2$ laser.

There may be more than one compartment like compartment 7, as described above, each having different properties such as volumetric space. For example, there may be two compartments, one for μHIs and the other for enhanced μHIs. There may be more than two, for still further versatility in the amounts of halogen to be injected in a gas action, and for adjusting the driving voltage ranges corresponding to different gas action algorithms. Different premixes may be injected from the different compartments. Also, the exemplary method described using premixes of particular gas compositions, but many different gas compositions could be used in accord with the present invention. For example, gas compositions having higher fluorine (or hydrogen chloride) percentage concentrations could be used such as 5% or 2% instead of 1%. There also may be an additional valve connected to a 100% buffer gas container.

Advantageously, the processor 11 and gas supply unit are configured to permit the delivery or injection of very small amounts of one or more gases or gas mixtures to the discharge chamber 1. The injection of the small amounts of the gas or gas mixture result in gas pressure increases in the discharge chamber 1 below 10 mbar, and preferably between 0.1 and 2 mbar. Each gas in the gas mixture within the discharge chamber 1 may be separately regulated so the gas composition within the discharge chamber may be precisely controlled. For example, similar injections of Kr, Ar or Xe may be performed for replenishing those gases in the laser tube 1.

Because the amount of gas injected during a gas injection or replacement procedure is small, laser output beam parameters do not vary greatly with each injection. The injections are preferably carried out periodically at predetermined intervals corresponding to known depletion amounts of the gases. For example, if the halogen partial pressure in the gas mixture of an $F_2$ laser is known, under current operating conditions, to be around 3 bar after a new fill and to deplete by 0.1 mbar per X minutes or Y shots, then halogen injections including, e.g., 1 mbar (pressure increase in tube 1) of a premix including 1% $F_2$ could be performed every X/10 minutes or Y/10 shots, in accord with the present invention, to maintain the concentration of the halogen, or halogen injections of 2 mbar of the premix may be performed every X/5 minutes, and so on. Also, micro-halogen injections (µHI) of 1 mbar of premix A including 1% $F_2$ and 99% Ne buffer may be injected every X/5 minutes for 100 minutes followed by a period of 100 minutes when no injections are performed. Many variations are possible within the spirit of the present invention including irregular gas actions as determined by the processor.

In contrast with the present invention, if, e.g., a 50 mbar (pressure increase in tube 1) premix A injection (again having 1% $F_2$ such that the $F_2$ partial pressure increase in the tube 1 is 0.5 mbar and corresponds to around a 17% increase in the $F_2$ concentration in the tube 1) is performed every 5X minutes or 5Y shots, or at any time, the large injection amount will cause output beam parameters of the laser beam to noticeably and undesirably fluctuate in response. For example, the pulse energy or driving voltage can fluctuate by 10% or more when the large injection is performed. If the laser is not shut down, or industrial processing interrupted, when the large injection is performed, then imprecise industrial processing will occur due to disturbances in meaningful output beam parameters.

The halogen injection algorithm of the present invention may be considered to extend a total halogen injection over a longer period of time or number of pulse counts. Over the period of the several halogen injections, the high voltage and the $F_2$ concentration do not change significantly so that significant changes in pulse energy and pulse energy stability, among other meaningful output beam parameters, are eliminated. Again, some of these other output beam parameters are listed above and each will be extremely stable using the method of the present invention.

Figure 14A:
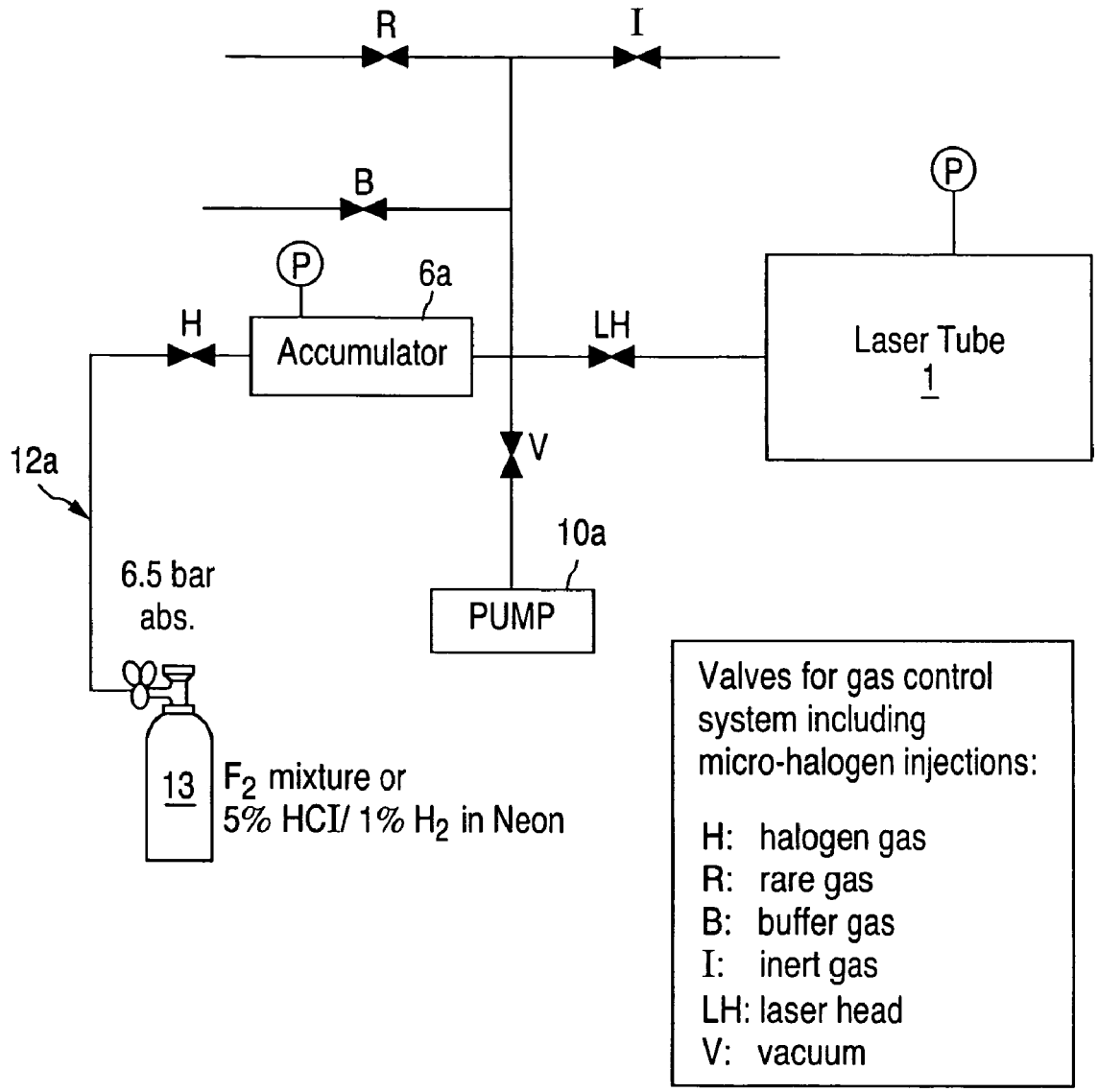
FIG. 14a schematically shows gas lines for halogen injections into the discharge chamber of the laser of FIG. 13 using an accumulator.

FIG. 14a schematically shows another configuration of gas lines for halogen injections into the discharge chamber 1 of the laser of FIG. 13a using an accumulator 6a. The accumulator 6a is connected to the laser tube 1 via laser head valve LH. The accumulator 6a is also connected to a gas line 12a via halogen valve H connected to a gas bottle 13 including the halogen or halogen premix. For example, the gas bottle 13 may be filled with a gas mixture including an $F_2$ mixture (e.g., 5% $F_2$/95% Ne or a 5% HCl/1% $H_2$ in neon mixture or a 1% $F_2$:99% Ne premix, among other possibilities). A pump is shown connected to each of the accumulator 6a and the laser tube 1 via a vacuum valve V. The tube 1 is shown valve-connected to additional gas lines and valves including a buffer gas via valve B, a rare gas or rare gas premix via valve R (used with KrF, ArF, XeCl and XeF excimer lasers, e.g.) and an inert gas via valve I. The inert gas valve I or another valve not depicted may be used for valve connecting to a source of Xe to be used as an additive in the gas mixture within the tube. Again, one or more additional accumulators may be added to the system.

The accumulator 6a has the particular advantage that the small amounts of gas including the $F_2$ within the $F_2$ premix to be injected with each halogen injection in accord with the present invention may be precisely controlled. The accumulator is easily pumped to low pressure. A precise amount of $F_2$ gas or $F_2$ gas premix is released into the accumulator 6a and the amount of $F_2$ is determined according to the total gas pressure within the accumulator, the known volumes of the accumulator 6a and the laser tube 1 and the known concentration of the $F_2$ or the $F_2$ percentage concentration in the premix gas. A $F_2$ partial pressure increase in the laser tube 1 after the injection is determined based on the amount of $F_2$ known to be in the accumulator 6a prior to (and possible after) the injection.

Based on this determination and/or other factors such as the interval between the previous and current gas actions (measured in time or pulse count, e.g.) and/or the value of the driving voltage at the time of the previous, present and/or next gas action, the interval between the current and next gas action and/or the amount of halogen containing gas or total gas to be injected in the next gas action may be determined so that a precise amount of each gas, particularly the halogen-containing gas, may be injected in the next gas action. Also, the type of gas action to be performed may be determined based on these or other factors.

Figure 14B:
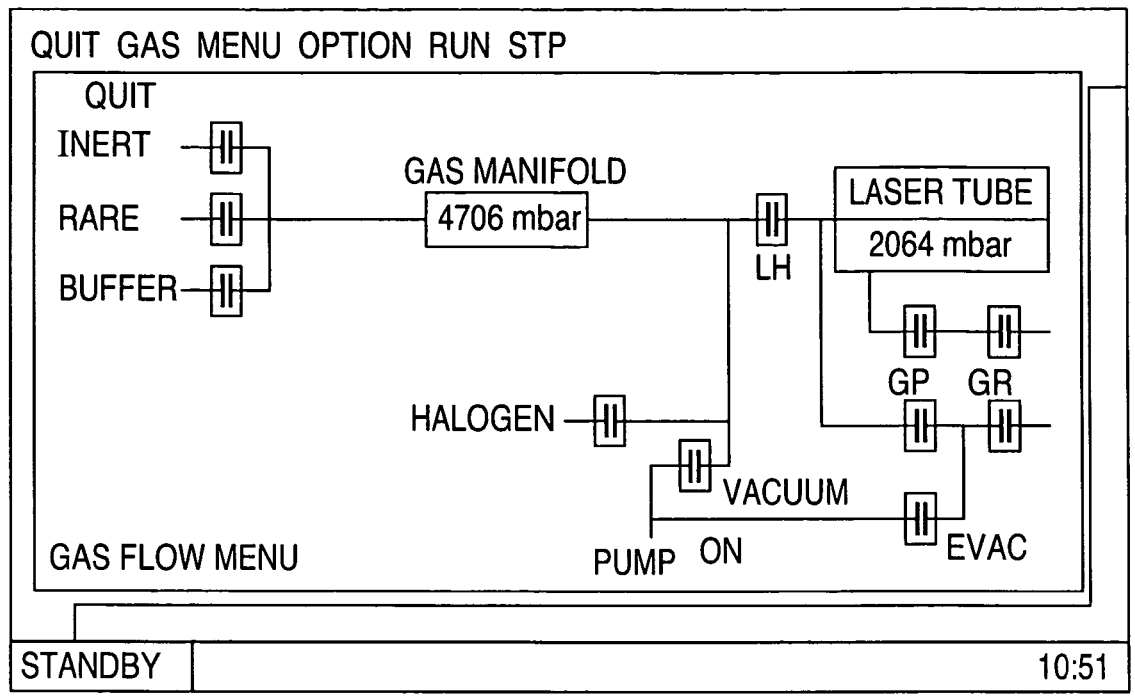
FIG. 14b shows a computer display connected to the processor of FIG. 13a indicating that the processor is controlling the gas replenishment process.

FIG. 14b shows how a display monitor attached to the processor 11 might look as the laser system is operating. The laser tube is shown to have an internal pressure of 2064 mbar, while the pressure within the gas manifold (corresponding to the compartment 7 of FIG. 13a or the accumulator 6a of FIG. 14a) shows an internal pressure of 4706 mbar. As discussed, the precise amount of gas injected into the laser tube can be calculated based in part on these pressure readings. Again, the temperature may be taken into account for making an even more precise determination.

Various gas actions and procedures will now be described. The procedures are potentially applicable to all gas discharge lasers, although excimer lasers (e.g., KrF, ArF, XeCl and XeF) and the $F_2$ laser would benefit greatly by the present invention. The KrF-laser is used as a particular example below.

The process begins with a new fill which is performed prior to operating the laser system. For a new fill, the laser tube 1 is evacuated and a fresh gas mixture is then filled in. A new fill of a KrF-laser would typically result in a gas mixture having approximately the following partition of gases: $F_2$: Kr: Ne=0.1%: 1.0%: 98.9%. If the gas mixture within the KrF laser discharge chamber has a typical total pressure of around p=3000 mbar, then the partial pressures of $F_2$ and Kr would typically be around 3 mbar and 30 mbar, respectively. A new fill for a $F_2$ laser would produce the following typical partition of gases:$F_2$:Ne=0.1% :99.9%. For the $F_2$ laser, He or a mixture of He and Ne may be used as the buffer instead of only Ne (see the '526 application, above).

The new fill procedure can be performed using separate gas lines delivering pure or premixed gases. Typical gas premixes used regularly in semiconductor industry fabs are premixes A and B, where: premix A has 1% $F_2$/1% Kr/Ne and premix B has 1% Kr/Ne.

After the new fill is performed, the halogen gas begins to react with components of the laser tube 1 that it comes into contact with, whether the laser is operating or not. "Gas replenishment" is a general term which includes gas replacement (PGRs and MGRs each subject to varying amounts and compositions of injected and released gases) and gas injections (µHIs and enhanced µHIs again each subject to varying amounts and compositions of injected gases), performed to bring the gas mixture status back closer to new fill status.

Any gas replenishment procedures are performed taking into account that each gas in the gas mixture depletes at a different depletion rate due to the halogen depletion just described and the gas replenishment procedures performed in response. For the narrow band KrF-laser, e.g., $F_2$-depletion occurs at a rate of between about 0.1% to 0.3% (and sometimes up to nearly 1%) per million shots, whereas Kr depletion occurs about 10 to 50 times more slowly. The Ne buffer is less important, but may also be considered as part of an overall gas replenishment operation, e.g., to maintain a desired pressure in the tube 1.

Separate gas actions are preferably performed to replenish each constituent gas of the gas mixture. For the KrF-laser, for example, the $F_2$ may be replenished by halogen or halogen/rare gas or premix A injections and the Kr replenished by rare gas or premix B injections. Other gas additives such as Xe may be replenished by Xe gas or still further premixes C, D, etc. The individual depletion rates also depend on operating conditions of the laser such as whether the laser is in broadband or narrow band mode, the operating energy level, whether the laser is turned off or is in continuous, standby or other burst pattern operation, and the operating repetition rate. The processor 11 is programmed to consider all of these variations in laser operation.

The gas mixture status is considered sufficiently stable in the present invention when deviations in fluorine and krypton content are below 5%, and preferably below 3%. Without any gas replenishment actions, after 100 million shots the partial pressures of $F_2$ and Kr might degrade by between 30% and 100% and between 0.5% and 5%, respectively.

To compensate for the various depletion rates of the gases in the discharge chamber, the present invention performs a variety of separate and cross-linked gas replenishment procedures, which take into account the variety of individual degradation rates by referring to a comprehensive database of different laser operating conditions. A preferred technique is disclosed in the '653 application already mentioned above. The behavior of the particular laser in operation and related experiences with gas degradation under different operating conditions are stored in that database and are used by a processor-controlled "expert system" to determine the current conditions in the laser and manage the gas replenishment or refurbishment operations. A history of gas actions performed during the current operation of the laser may also be used in accord with the present invention.

As mentioned above, series of small gas injections (referred to as enhanced and ordinary micro gas or halogen injections, or μHI) can be used to return any constituent gas of an excimer or molecular laser, particularly the very active halogen, to its optimal concentration in the discharge chamber without disturbing significant output beam parameters. However, the gas mixture also degrades over time as contaminants build up in the discharge chamber. Therefore, mini gas replacements (MGR) and partial gas replacements (PGR) are also performed in the preferred methods. Gas replacement generally involves releasing some gas from the discharge chamber, including expelling some of the contaminants. MGR involves replacement of a small amount of gas periodically at longer intervals than the small μHIs are performed. PGR involves still larger gas replacement and is performed at still longer periodic intervals generally for "cleaning" the gas mixture. The precise intervals in each case depend on consulting current laser operating conditions and the expert system and comprehensive database. The intervals are changes of parameters which vary with a known relationship to the degradation of the gas mixture. As such, the intervals may be one or a combination of time, pulse count or variations in driving voltage, pulse shape, pulse duration, pulse stability, beam profile, coherence, discharge width or bandwidth. In addition, the accumulated pulse energy dose may used as such an interval. Each of μHI, MGR and PGR may be performed while the laser system is up and running, thus not compromising laser uptime.

Three exemplary gas replenishment methods for stabilizing an optimum gas mixture are described below. Many other methods are possible including combinations of the ones described below. The methods and parameters used may also be varied during the laser operation depending on the laser operating conditions and based on the data base and the expert system. The processor and gas supply unit are configured to perform many methods based on a comprehensive database of laser operating conditions and gas mixtures statuses.

Each method involves well-defined very small gas actions with small, successive gas injections preferably by injecting a premix of less than 10 mbar and more preferably between 0.1 and 2 mbar including a concentration including preferably 5% or less of the halogen containing species in order not to disturb the laser operation and output beam parameters. Whatever the composition of the premix, it is the amount of the halogen in the premix that is most significant. That is, the preferred amount of the halogen containing species that is injected in the small gas actions preferably corresponds to less than 0.1 or 0.2 mbar and more preferably between 0.001 and 0.02 mbar partial pressure increase in the laser tube 1.

The first exemplary gas stabilization method involves performing gas injections based on operation time. The method takes into account whether or not the laser is operating, i.e., whether the laser system is up and performing industrial processing, in standby mode, or simply shut off. The first method is thus useful for maintaining either an active or a passive gas composition status. Time-correlated μHI, MGR and PGR are performed according to a selectable time interval based on operating conditions. For example, μHIs may be performed after time intervals $t_1$, MGRs after time intervals $t_2$, and PGRs after time intervals $t_3$.

In accord with the present invention, the time intervals $t_1$, $t_2$ and $t_3$ are adjusted in real time as are the amounts and/or compositions of gases injected during the gas actions. Preferably, the time intervals and gas amounts and compositions are adjusted from gas action to gas action. In addition, the driving voltage ranges within which particular gas actions are performed are preferably also adjusted, at least at each new fill based on the aging of the tube and optical components of the laser resonator. Such ranges may be adjusted during operation, even between new fills, e.g., based on beam-induced effects on the optical components of the line-narrowing module (see for a general explanation of such effects U.S. patent application No. 60/124,804, assigned to the same assignee and hereby incorporated by reference).

Below, detailed graphs are described for an operating laser system in accord with the present invention. Typically, gas actions occur after several hours if the laser is in the standby-mode without pulsing or pulsing with low repetition rate (<100 Hz). If the laser is completely switched off (power-off-mode), a battery driven internal clock is still running and the expert system can release an adequate, time controlled number of injections during the warm-up phase after re-starting the laser. The number and amount of the injections can be also related to certain driving voltage start conditions which initiate a preferred sequence of gas actions to reestablish optimum gas quality.

Figure 16:
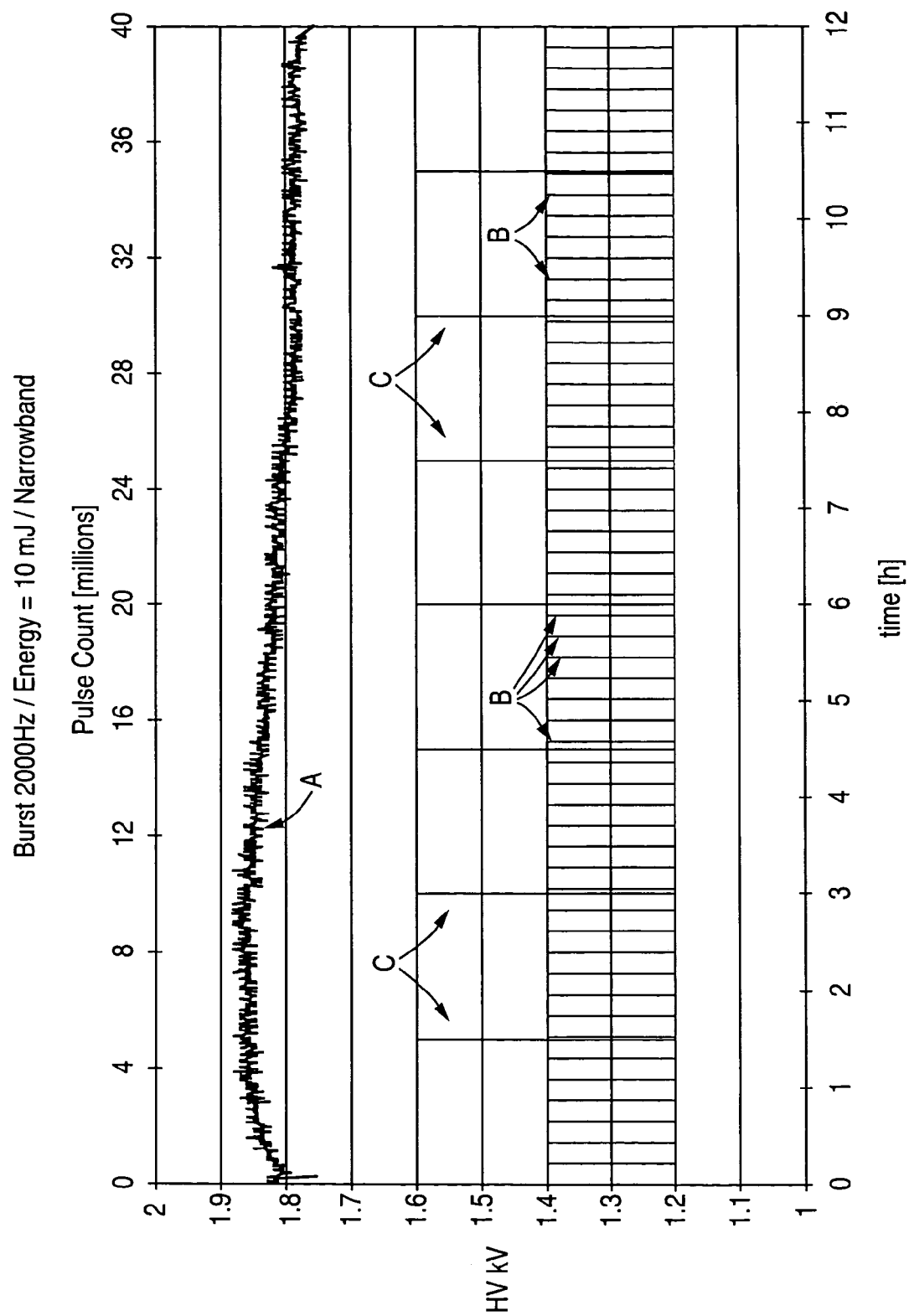
FIG. 16 is a graph of driving voltage versus time also showing periodic halogen injections and mini gas replacements for a system in accord with a preferred embodiment.

FIGS. 15 and 16 are graphs of driving voltage versus time also illustrating the intervals of periodic μHI and periodic μHI and MGR, respectively, for a fully operating system in accord with the present invention. FIG. 15 includes a plot of driving voltage versus time (A) wherein μHIs are performed about every 12 minutes, as indicated by the vertical lines (some of which are designated for reference with a "B") on the graph, for a narrowband laser running in 2000 Hz burst mode at 10 mJ output beam energy. The vertical axis only corresponds to graph A. As is shown by graph A, the small μHIs produce no noticeable discontinuities in the driving voltage.

FIG. 16 is a plot (labelled "A") of driving voltage versus time wherein μHIs are performed about every 12 minutes, as indicated by the short vertical lines on the graph (again, some of which are designated for reference with a "B" and the vertical axis doesn't describe the halogen injections in any way), and MGR is performed about every 90 minutes, as indicated by the taller vertical lines on the graph (some of which are designated with a "C" for reference and again the vertical axis is insignificant in regard to the MGRs shown), for a narrowband laser running in 2000 Hz burst mode at 10 mJ output beam energy. Again, the driving voltage is substantially constant around 1.8 KV and no major changes, e.g., more than %5, are observed.

Figure 8:
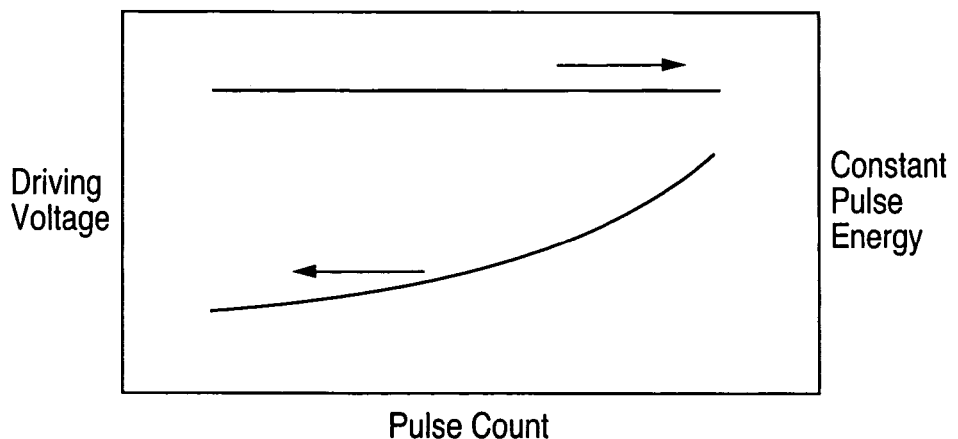
FIG. 8 is a graph of driving voltage versus pulse count for an excimer or molecular laser operating at constant output pulse energy.

A comparison of FIGS. 15 and 16 with FIG. 8 reveals that the present invention advantageously avoids the conventional approach which drastically increases the driving voltage as the gas mixture degrades. By avoiding discontinuities, fluctuations or changes in the driving voltage in this way, disturbances of meaningful output beam parameters are also avoided.

Figure 17:
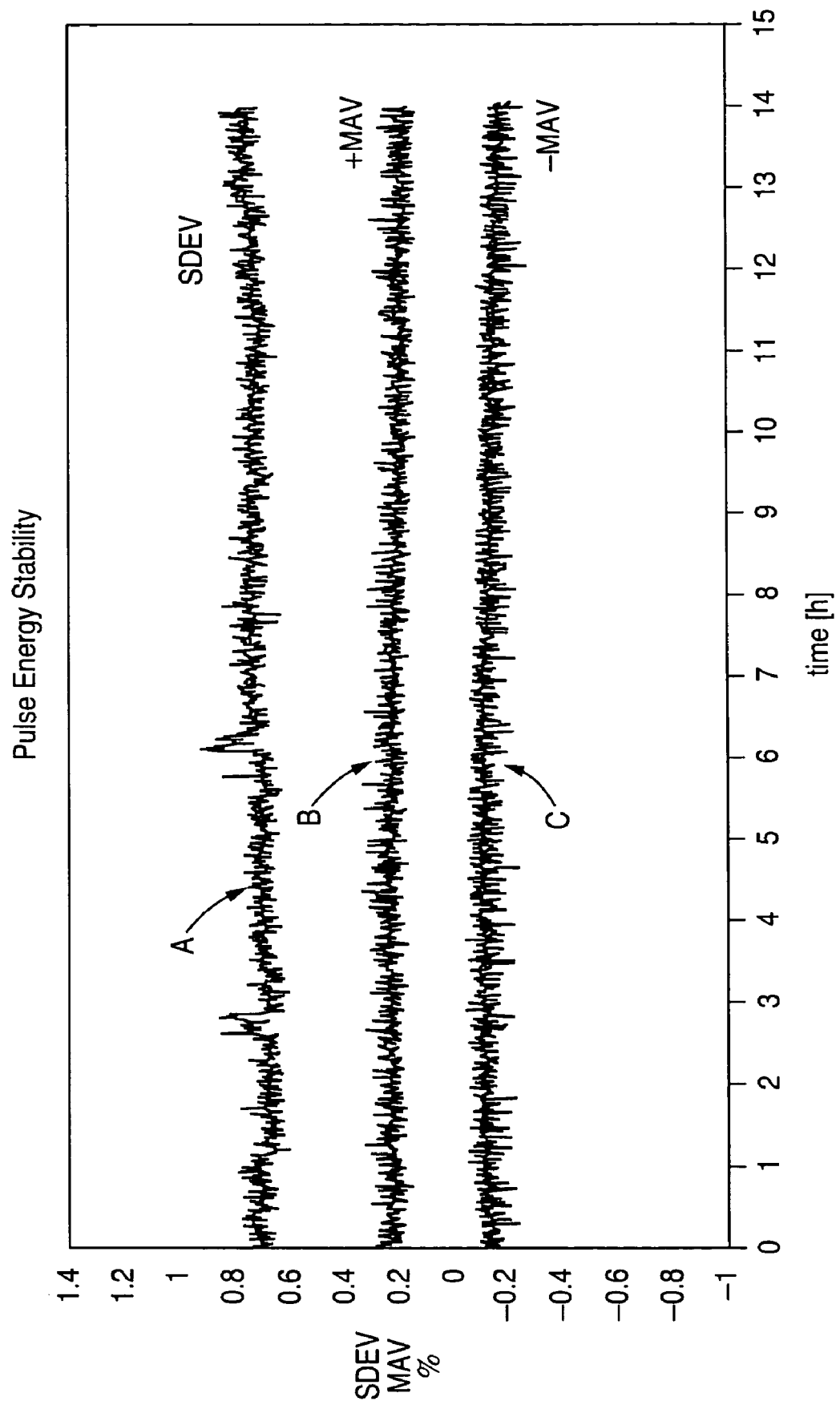
FIG. 17 is a graph of pulse energy stability (sigma, upper graph) versus time and moving averages (over 40 pulse intervals, maximum and minimum) for a laser system operating at 2 kHz in accord with a preferred embodiment.

FIG. 17 includes a graph (labelled "A") of pulse energy stability versus time of the laser pulses by values of standard deviation (SDEV) and moving average stabilities (±MAV) as percentages of the absolute pulse energy for a system in accord with the present invention. The graphs labelled "B" and "C" show the moving average for groups of 40 pulses each. During this run, micro-halogen injections were performed resulting in very stable continuous laser operation without any detectable deviations caused by the gas replenishment actions.

The second exemplary gas stabilization method involves performing gas injections based on shot or pulse count using a shot or pulse counter. After certain numbers of laser pulses, e.g., N(μHI), N(MGR), and N(PGR), depending again on the mode of operation of the laser, μHI, MGR and PGR can be respectively performed. Typically, the μHIs amount to about 0.5 . . . 2.0 mbar of fluorine premix (e.g., 1-5% $F_2$:95-99% Ne) for the KrF, ArF, XeF or $F_2$ lasers (Ne being replaceable with He or a mix of He and Ne) or HCl premix (e.g., 1-5% HCl:1% in Ne or He) for XeCl or KrCl laser and are released after several hundred thousand or even after millions of laser shots. Each μHI just compensates the halogen depletion since the last gas action and typically corresponds to less than 0.1 mbar of the halogen containing species and more preferably between 0.001 and 0.02 mbar partial pressure increase in the laser tube 1 per, e.g., 1 million shots. The actual amounts and shot intervals vary depending on the type of laser, the composition of the discharge chamber, the original gas mixture composition and operating mode, e.g., energy, or repetition rate, being used.

A third exemplary method is similar to those described above using time or pulse count, and this method instead uses accumulated energy applied to the discharge. Use of this parameter, and advantages thereof, are set forth in the '525 application. The total input electrical energy to the discharge is maintained in a counter for that purpose, and gas actions are performed after certain intervals or amounts of this input electrical energy are applied.

Also, in accord with a preferred embodiment, the intervals of any of the exemplary methods are dynamically adjusted from injection to injection, as are the amounts of halogen injected with each gas action. The interval between the current and next injection is set based on any one or a combination of parameters such as the driving voltage or any of the output beam parameters described above. In addition, the amount of halogen injected in the current injection and/or the interval between the previous and current injection may be taken into account.

The amount of halogen injected in any μHI or enhanced μHI may be determined in accord with the present invention by measuring the pressure in the accumulator (see FIGS. 13b and 14a) and the laser tube at the time of the injection, and/or just before, and/or just after the injection. The temperatures of the gases in the accumulator and tube may be measured as well. The interior volumes of the tube and accumulator are known in advance. The well-known formula $PV=Nk_BT$ is used to calculate the amount of halogen injected into the tube during any injection.

For example, if the accumulator has a measured halogen partial pressure $P_a$, and temperature $T_a$, and a volume $V_a$, then the accumulator contains $N_a$ fluorine molecules. If all of the $N_a$ molecules are injected into the laser tube during the injection, and the tube has a temperature $T_T$ and volume $V_T$, then the change in fluorine partial pressure in the tube as a result of the injection will be $\Delta P(F_2)_T = P_a V_a T_T / V_T T_a$. Since it is desired to maintain the total number of fluorine molecules in the tube, then it may be more appropriate to calculate the change in the number of fluorine molecules in the tube, i.e., $\Delta N(F_2)_T = )P(F_2)_T V_T / k_B T_T$, and keep track of that quantity. Then, the amount of halogen and/or the interval before the next injection is determined based on the calculated amount of halogen that was injected in the previous injection, the partial pressure of the halogen in the tube after the previous injection and/or the amount of halogen that it is desired to have in the tube after the next injection.

The overall calculation depends also on the amount of depletion that the halogen gas has undergone (or will undergo) between injections. Such depletion is, in principal, known as a function of many factors, e.g., including time and pulse count (and possibly any of the parameters enumerated above or others). For example, a change in halogen partial pressure (or, alternatively, the number of halogen molecules) in the laser tube in the interval between injections can be calculated to depend on $k_t \times \Delta t$ and on $k_p \times \Delta p$, wherein $k_t$ and $k_p$ are constants that depend on the rate of halogen depletion with time and pulse count, respectively, and $\Delta t$ and $\Delta p$ are the amount of time and the number of pulses, respectively, in the interval under consideration. The number of pulses $\Delta p$ itself depends on the repetition rate, taking into account also the number of pulses in a burst and the pause intervals between bursts for a laser operating in burst mode. Again, other parameters may have an effect and may be additive terms included with this calculation.

Now, from one interval to the next, a calculation could be performed as follows. The increase (or decrease reflected as a negative sum) in fluorine partial pressure in the laser tube over the interval is calculated to be: $\Delta P(F_2)_{interval} \approx P(F_2)_{T\ injection} - k_t \times \Delta t - k_p \times \Delta p$. Again, since it is the total number of fluorine molecules that it is desired to keep constant, then a calculation of the change in the number of molecules is calculated as: $\Delta N(F_2)_{interval} \approx N(F_2)_{T\ injection} - k_t \times \Delta t - k_p \times \Delta p$, where the constants $k_t$ and $k_p$ would differ from the partial pressure calculation by a units conversion.

The overall algorithm would seek to maintain the total number of halogen molecules (or halogen partial pressure) constant. Thus, the changes in particle number (or partial pressure) would be summed continuously over many intervals, or preferably all intervals since the last new fill. That overall sum would be maintained as close as possible to zero, in accord with the present invention.

As discussed, the shot counter can also be used in combination with time related gas replenishment, and either of the shot counter or time related gas replenishment can be used in combination with the total energy applied to the discharge. The shot counter or total applied energy can be used for different laser pulse operation modes, e.g., burst patterns, or continuous pulsing modes at different pulse repetitions wherein a number of individual shot or input energy counters $N_i(HI)$ are used. All of these different counters can be stored in the data base of the expert system. Which of the different counters $N_i(HI)$ is to be used at any time is determined by the software of the expert system.

Figure 18:
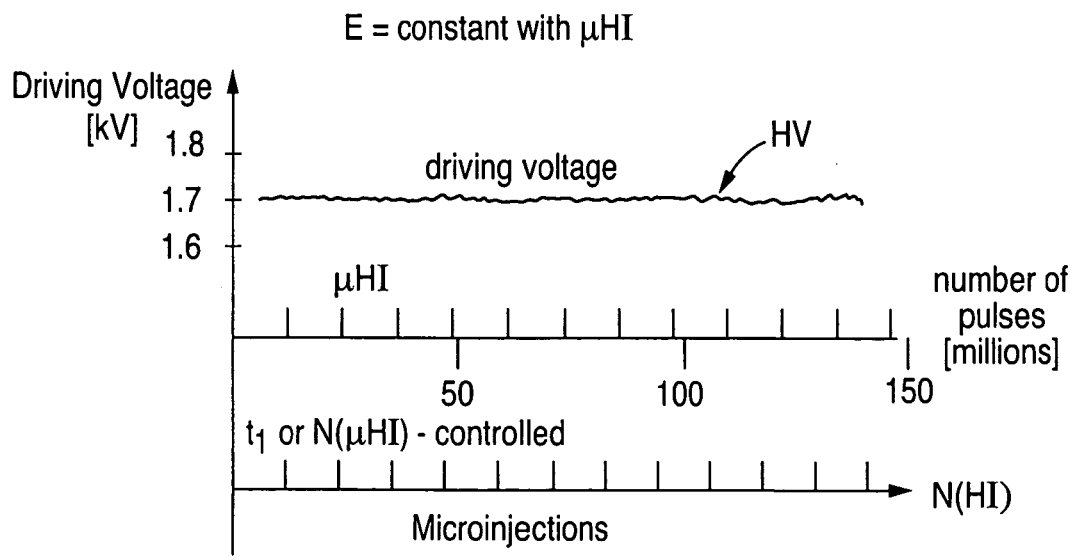
FIG. 18 is qualitative graph of driving voltage versus time also showing periodic micro-halogen injections (µHI) for a system in accord with a preferred embodiment.

FIG. 18 illustrates qualitatively a driving voltage free of discontinuities when small partial pressure increases are effected in the laser discharge chamber due to µHIs in accord with the present invention. The driving voltage is shown as being substantially constant at around 1.7 KV over 150 million pulses, while µHIs are performed about once every 12 million pulses. The pulse energy is also maintained at a constant level.

Figure 9:
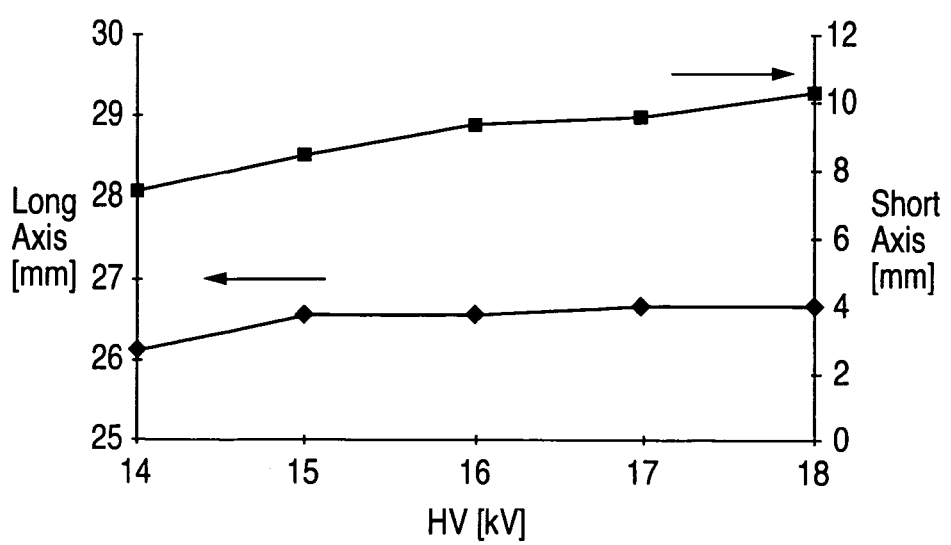
FIG. 9 shows a first graph of the long axis beam profile versus driving voltage and a second graph of the short axis beam profile versus driving voltage for an excimer or molecular laser operating at constant output pulse energy.
Figure 10:
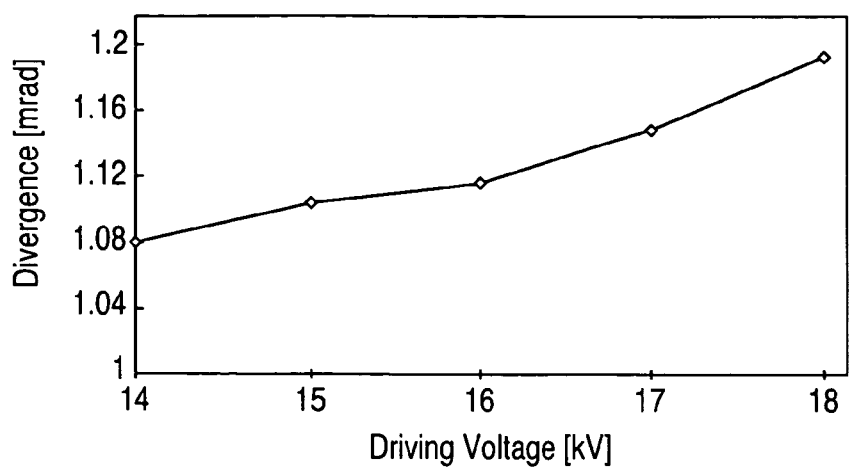
FIG. 10 is a graph of the divergence of the short axis of an output beam versus driving voltage of an excimer or molecular laser operating at constant output pulse energy.
Figure 11:
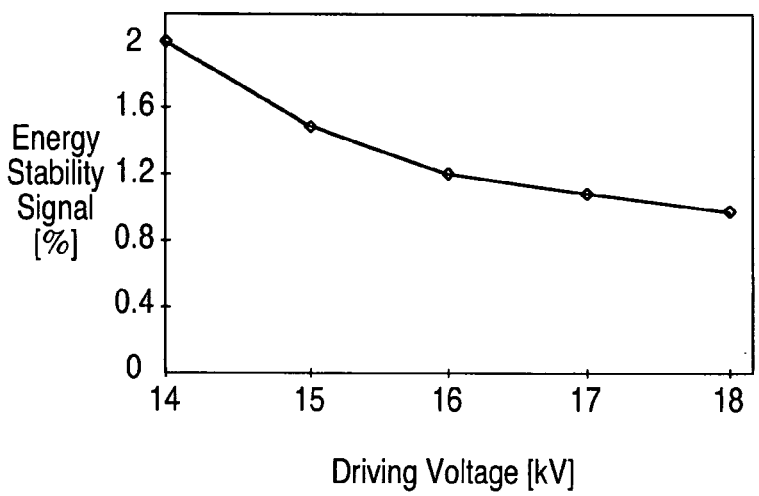
FIG. 11 is a graph of output pulse energy stability versus driving voltage of an excimer or molecular laser operating at constant output pulse energy.
Figure 12:
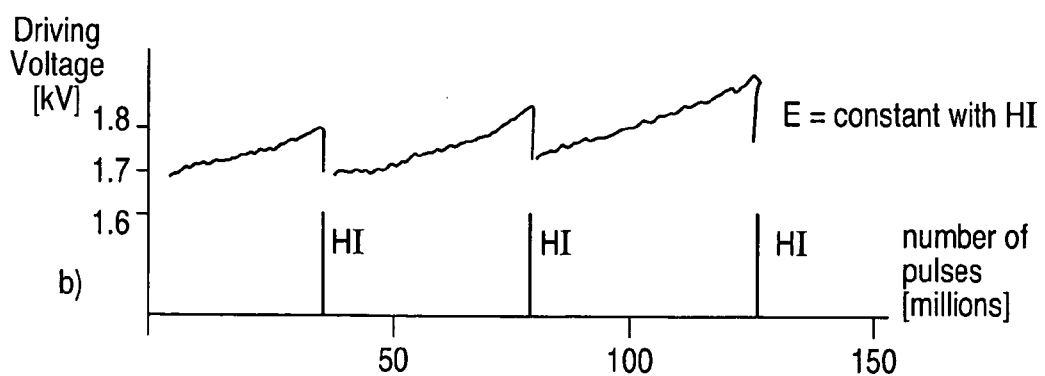
FIG. 12 illustrates the strong pronounced discontinuities in the driving voltage when large halogen partial pressures increases are rapidly effected in the discharge chamber due to halogen injections.

A comparison of FIG. 18 with the driving voltage graph of FIG. 12 shows an advantage of the present invention. In FIG. 12 the driving voltage is observed to increase steadily until a halogen injection (HI) is performed, and is then observed to drop precipitously when the halogen is injected in a large amount in accord with conventional gas replenishment. These disturbances in the driving voltage curve of FIG. 12 occur because the intervals for the HIs are too large and the amounts of halogen injected are thus too large to prevent the disturbances. As can be deduced from FIGS. 9-11, these large driving voltage disturbances undesirable affect meaningful output beam parameters. FIG. 18, on the other hand, shows no fluctuations in the driving voltage in response to micro-halogen injections performed in accord with the present invention.

Figure 19:
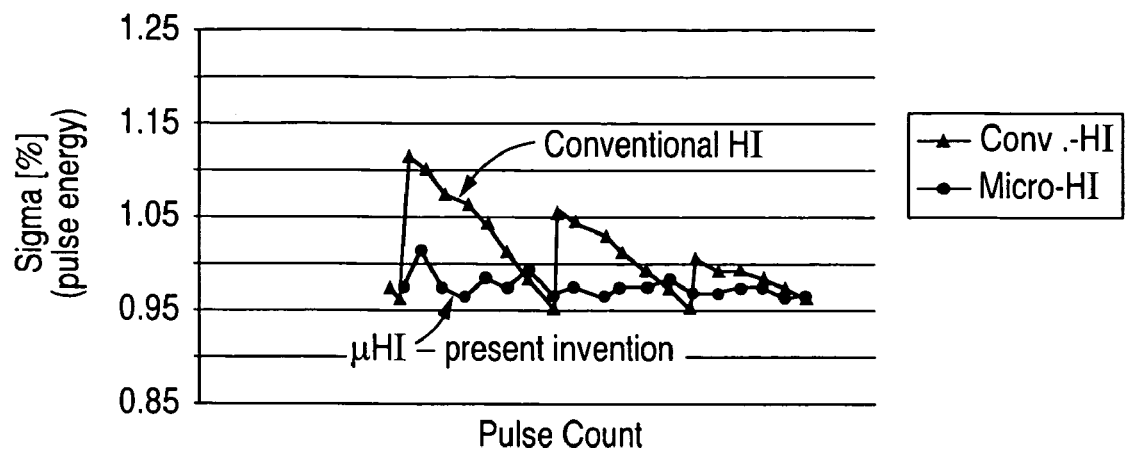
FIG. 19 is a graph of energy stability variation versus pulse count for a system in accord with a preferred embodiment.

FIG. 19 is a graph including two plots. The first plot following the darkened triangles and labeled "convention HI" is the energy stability variation versus pulse count for a system using a conventional HI algorithm and shows sharp discontinuities in the energy stability. For example, the first HI is shown to produce a leap from 0.95% to 1.10% almost instantaneously in response to the HI. The second plot following the darkened circles and labeled "µHI-present invention" is the energy stability variation versus pulse count for a system using a µHI algorithm in accord with the present invention wherein discontinuities are substantially minimized in the energy stability.

Figure 20:
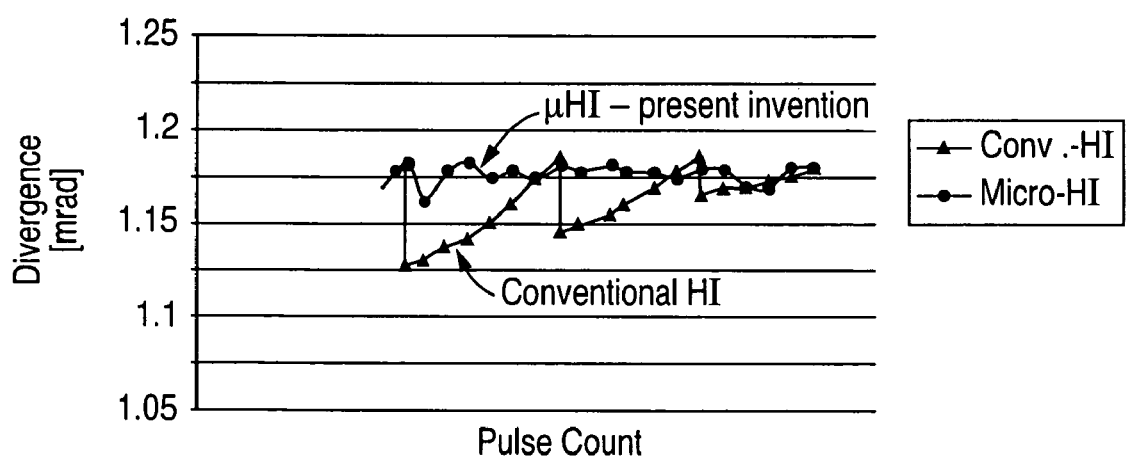
FIG. 20 is a graph of beam divergence versus pulse count for a system in accord with a preferred embodiment.

FIG. 20 is a graph also including two plots. The first plot following the darkened triangles and labeled "conventional HI" is the beam divergence versus pulse count for a system using a conventional HI algorithm and shows sharp discontinuities in the beam divergence. For example, the first HI is shown to produce a sharp drop from 1.175 mrad to 1.125 mrad almost instantaneously in response to the HI. The second plot following the darkened circles and labeled "µHI-present invention" is the beam divergence versus pulse count for a system using a µHI algorithm in accord with the present invention wherein discontinuities are substantially minimized in the beam divergence.

The expert system can use a different kind of shot counter, e.g., N(MGR) and/or N(PGR) for other types of gas actions (i.e., different from the N(µHI)). MGR and PGR replace or substitute different gases of the gas mixture in the laser tube by predetermined amounts. As mentioned, MGR and PGR include a gas injection accompanied by a release of gases from the laser tube, whereas µHIs do not involve a release of gases. Gas releases can be performed simply to reduce the pressure in the laser tube, as well as for expelling contaminants from the gas mixture. Unequal degradations of the individual gas components within the gas mixture are nicely compensated using MGR and PGR, and again, different numbers $N_i(MGR)$ and $N_i(PGR)$ may be used for different operating modes and conditions as determined by the expert system. All of these settings, i.e., $N_i(\mu HI)$, $N_i(MGR)$, $N_i(PGR)$ and the separately selectable portions of injections for each gas can be adapted for the aging of the laser tube, and/or the aging of the resonator optics, taking into account changing conditions of gas consumption and replenishments as the laser system components age. The amount of compensation can be pre-selected by manual settings or based on settings in the data base of the computer controlled expert system. For MGR, like µHI, the portions of injected gases amount to a few mbar total pressure increase in the laser tube (or percent only). The MGR is combined with a small pressure release of some few to 10 mbar of the pressure of the tube, preferably bringing the pressure in the tube back near to the pressure in the tube just after the last new fill.

More than one gas may be injected or replaced in the same gas action. For example, a certain amount of halogen and a certain amount of an active rare gas and/or a gas additive for an excimer laser may be injected together into the laser tube. This injection may be accompanied by a small pressure release as with MGR. Alternatively, this mixture of the halogen and rare or additive gases may simply be injected to increase the partial pressure of each gas within the discharge chamber without any accompanying release of gases.

A further exemplary gas stabilization method involves performing gas injections based on operating driving voltage values of the laser. This method can be and preferably is advantageously combined with any of the first, second and third exemplary methods. That is, the time related $t_1(\mu HI)$, $t_2(MGR)$, $t_3(PGR)$ and the pulse and/or input electrical energy to the discharge counter-related $N_i(\mu HI)$, $N_i(MGR)$, $N_i(PGR)$ gas actions, discussed above, are generally adjusted during operation depending on the value of the operating driving voltage, and preferably, on the operation band of the driving voltage.

Figure 21:
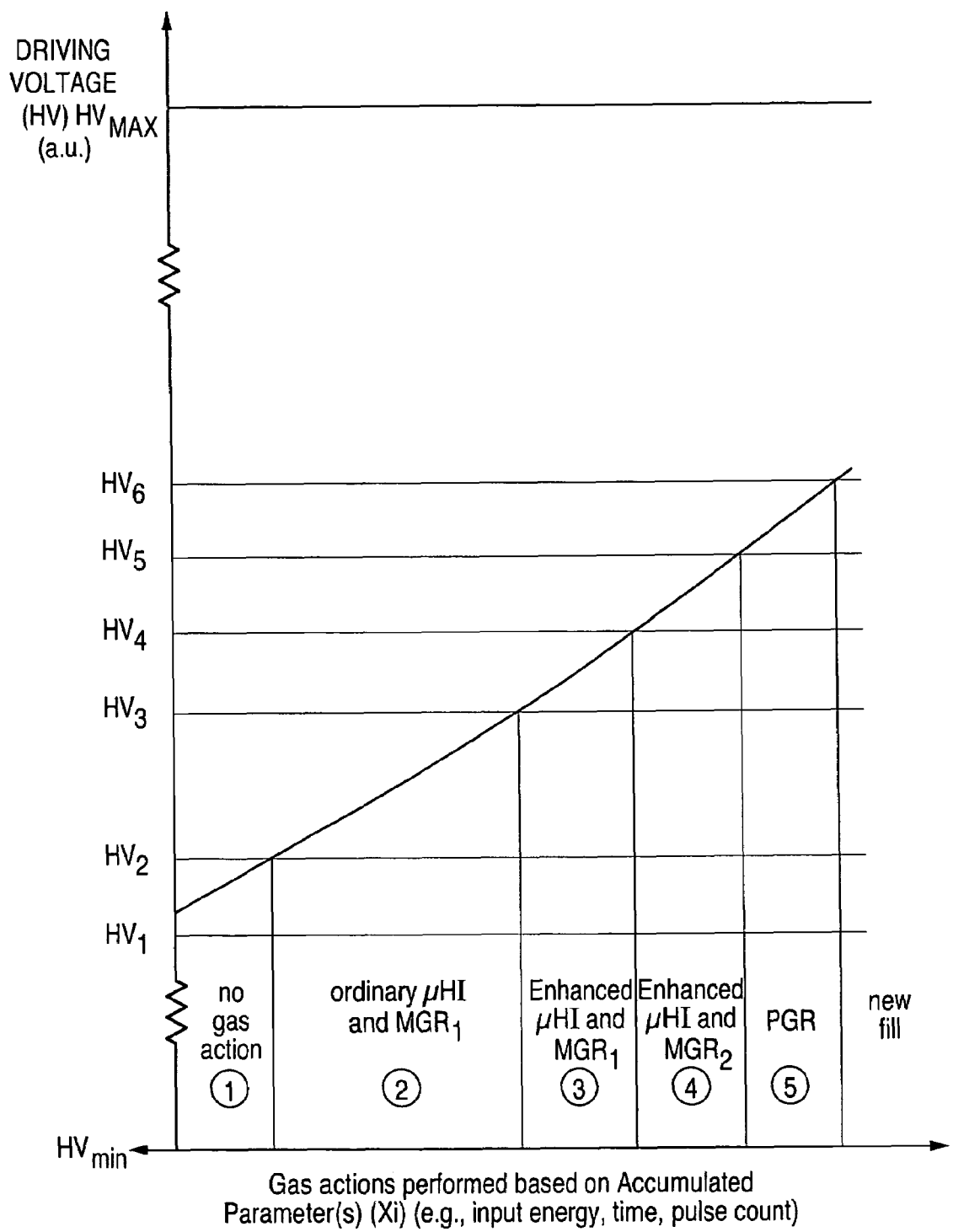
FIG. 21 is a qualitative graph of driving voltage versus pulse count also showing periodic halogen injections, mini gas replacements and partial gas replacements for a system in accord with a preferred embodiment.

Referring to FIG. 21, several driving voltage levels ($HV_i$) can be defined wherein particular gas actions are predetermined to be performed. The processor monitors the driving voltage and causes the gas supply unit to perform gas injections of varying degrees and partial and mini gas replacements of varying degrees depending on the value of the driving voltage, or which preset range the current operating driving voltage is in (y-axis of FIG. 21), based on such parameters as time, pulse count and/or total input electrical energy to the discharge, etc. (see '525 application mentioned above) x-axis of FIG. 21).

An example in accord with the present invention is next described with reference to FIG. 21. The laser system may operate at driving voltages between $HV_{min}$ and $HV_{max}$. The actual operating minimum and maximum driving voltages are set to be in a much smaller range between $HV_1$ and $HV_6$, as illustrated by the broken ordinate axis. An advantage of the present invention is that the range $HV_1$ to $HV_6$ itself may be reduced to a very small window such that the operating voltage is never varied greatly during operation of the laser. Where this operating range itself lies between $HV_{min}$ and $HV_{max}$, i.e., the actual voltage range (in Volts) corresponding to the range may be adjusted, e.g., to increase the lifetimes of the optical components of the resonator and the laser tube, e.g., such as by adjusting an output energy attenuating gas additive (see the '126 application).

The coordinate axis of FIG. 21 denotes the gas actions that are performed, based on one or more accumulated parameters, when the driving voltage is in each interval. The general order of performance of the gas actions is from left to right as the gas mixture ages. However, when each gas action is performed, the driving voltage is checked, and the next gas action may that corresponding to the same driving voltage range, or a different one denoted to the left or the right of that range. For example, after a PGR is performed (when it is determined that the driving voltage is above $HV_5$), the driving voltage may be reduced to between $HV_2$ and $HV_3$, and so the system would return to ordinary μHI and $MGR_1$ gas control operations.

Within the operating range between $HV_1$ and $HV_6$, several other ranges are defined. For example, when the driving voltage HV is between $HV_1$ and $HV_2$ (i.e., $HV_1<HV<HV_2$), no gas actions are performed as there is a sufficient amount of halogen in the gas mixture. When the driving voltage is between $HV_2$ and $HV_3$ (i.e., $HV_2<HV<HV_3$), $MGR_1$ and ordinary μHI are performed periodically based on the accumulated parameter(s) (i.e., input electrical energy to the discharge, time, and/or pulse count, etc.). This is the ordinary range of operation of the system in accord with the present invention.

When the driving voltage is between $HV_3$ and $HV_4$ (i.e., $HV_3>HV>HV_4$), one or both of the injection amounts of the μHIs and the MGRs with corresponding gas releases is increased. In this example, only the μHIs are increased. Thus, the range between $HV_3$ and $HV_4$ in FIG. 21 is the range within which enhanced μHIs are performed, and the same MGR amounts as in the previous range between $HV_2$ and $HV_3$ are maintained.

Enhanced μHIs may differ from ordinary μHIs in one or both of two ways. First, the amount per injection may be increased. Second, the interval between successive μHIs may be increased.

The range between $HV_4$ and $HV_5$ (i.e., $HV_4<HV<HV_5$) represents a new range within which one or both of the injection amounts of the pHIs and the MGRs with corresponding gas releases is increased. In this example, only the MGRs are increased as compared with the range $HV_3$ to $HV_4$. Thus, an enhanced amount of halogen gas is injected (with corresponding release of gases) during each $MGR_2$ than the ordinary amount $MGR_1$ when the driving voltage is in the range between $HV_4$ and $HV_5$. Alternatively, or in combination with replacing the gas in larger amounts, the mini gas replacements $MGR_2$ are performed at smaller intervals than the $MGR_1$ are performed. In each of the preferred and alternative $MGR_2$ procedures, the contaminants in the discharge chamber are reduced at smaller intervals (e.g., of accumulated input energy to the discharge, pulse count and/or time, among others) compared with the $MGR_1$ procedures that are performed at the lower driving voltage range between $HV_3$ and $HV_4$. The μHIs are also preferably performed periodically in this range to recondition the gas mixture. It is noted here that several ranges wherein either or both of the amounts injected during the μHIs and MGRs is adjusted may be defined each corresponding to a defined driving voltage range. Also, as mentioned above with respect to monitoring the pressure (and optionally the temperature) in the accumulator (and optionally the laser tube), the amount injected may be adjusted for each injection.

When the driving voltage is above $HV_5$ (i.e., $HV_5<HV<HV_6$), a still greater gas replacement PGR is implemented. PGR may be used to replace up to ten percent or more of the gas mixture. Certain safeguards may be used here to prevent unwanted gas actions from occurring when, for example, the laser is being tuned. One is to allow a certain time to pass (such as several minutes) after the $HV_5$ level is crossed before the gas action is allowed to be performed, thus ensuring that the driving voltage actually increased due to gas mixture degradation. When the driving voltage goes above $HV_6$, then it is time for a new fill of the laser tube. It is noted here that the magnitudes of the driving voltages ranges shown in FIG. 21 are not necessarily drawn to scale.

Figure 22:
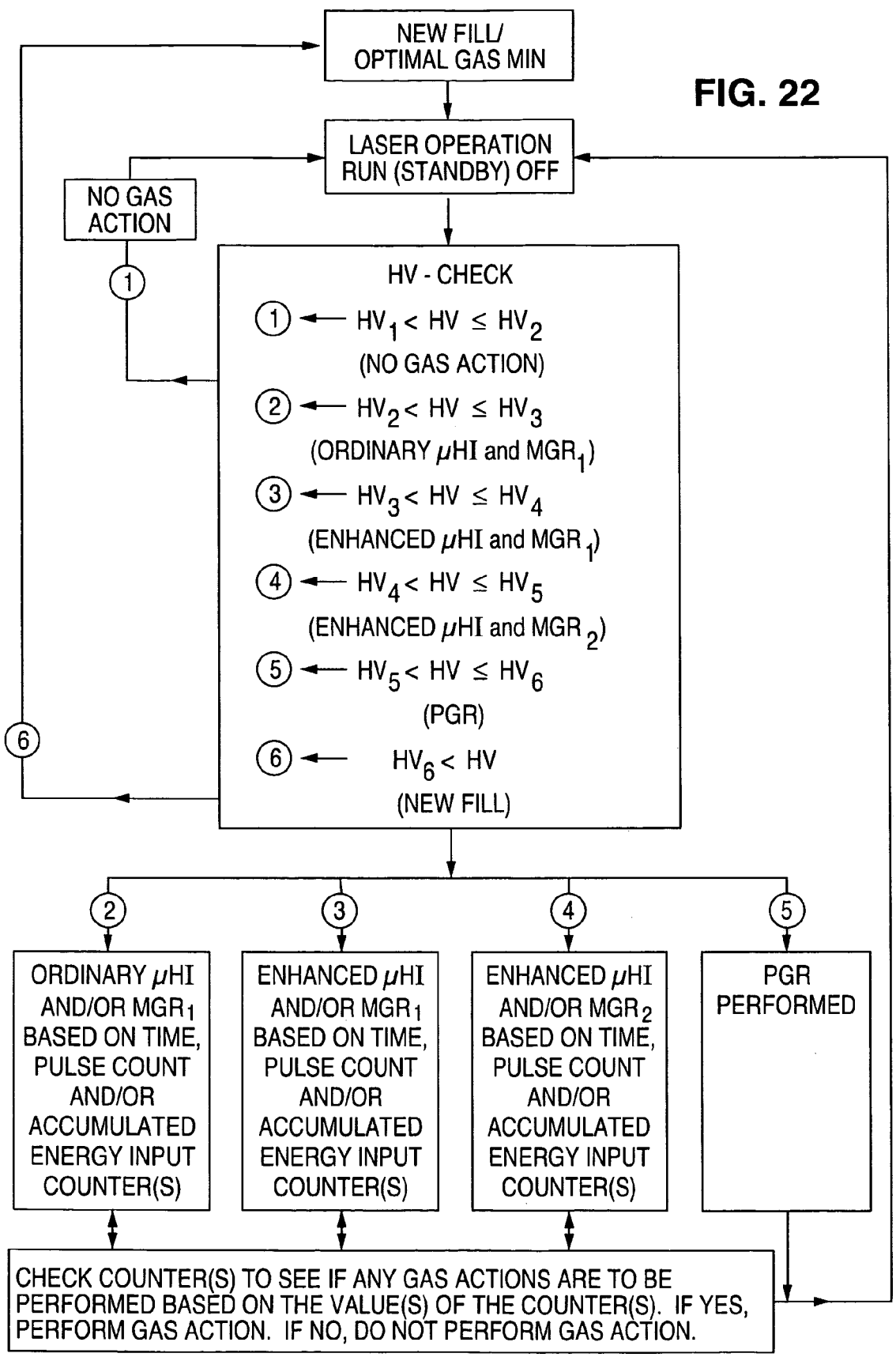
FIG. 22 is a flow diagram for performing halogen injections, mini gas replacements and partial gas replacements in accord with a preferred embodiment.

FIG. 22 is a flow diagram for performing ordinary and enhanced μHIs, MGRs and PGRs in accord with the present invention and the example set forth as FIG. 21. The procedure starts with a new fill, wherein the discharge chamber is filled with an optimal gas mixture. The laser can thereafter be in operation for industrial applications, in stand-by mode or shut off completely. A driving voltage check (HV-check) is performed after the current driving voltage (HV) is measured.

The measured driving voltage (HV) is compared with predetermined values for $HV_1$ through $HV_6$. The processor determines whether HV lies between $HV_1$ and $HV_2$ (i.e., $HV_1<HV<HV_2$) and thus path (1) is followed and no gas actions are to be performed and the procedure returns to the previous step. Although not shown, if the HV lies below $HV_1$, then a procedure may be followed to decrease the halogen concentration in the laser tube, such as by releasing some laser gas and/or injecting some buffer gas from/into the laser tube.

If the processor determines that the HV lies between $HV_2$ and $HV_3$, then the system is within the ordinary operating driving voltage band. If it is within the ordinary operating band, then path (2) is followed whereby ordinary μHIs and $MGR_1$ may be performed based preferably on time, input electrical energy to the discharge and/or pulse count intervals as predetermined by the expert system based on operating conditions. Again each gas action may be adjusted depending on the calculated partial pressure or number of halogen molecules in the laser tube, as described above.

The μHIs and $MGR_1$ performed when path (2) is followed may be determined in accordance with any method set forth in U.S. patent application Ser. No. 09/167,653, already incorporated by reference. If HV is not within the ordinary operating band, then it is determined whether HV lies below $HV_2$ (i.e., $HV<HV_2$). If HV is below $HV_2$, then path (2) is followed and no gas actions are performed.

If HV lies between $HV_3$ and $HV_4$ (i.e., $HV_3<HV<HV_4$), then path (3) is followed and enhanced μHI and $MGR_1$ may be performed again based on the value or values of the time, pulse count and/or applied electrical energy to the discharge counter(s) being used. The precise amounts and compositions of gases that are injected and those that are released are preferably determined by the expert system and will depend on operating conditions.

If HV lies between $HV_4$ and $HV_5$ (i.e., $HV_4<HV<HV_5$), then path (4) is followed and enhanced μHI and $MGR_2$ may be performed depending on checking the values of the counters. Again, the precise amounts and compositions of gases that are injected and those that are released are preferably determined by the expert system and will depend on operating conditions.

If HV lies between $HV_5$ and $HV_6$ (i.e., $HV_5<HV<HV_6$), then PGR is performed. If HV lies above $HV_6$ (i.e., $HV_6<HV$), then a new fill is performed.

After any of paths (2)-(5) is followed and the corresponding gas actions are performed, and preferably after a specific settling time, the method returns to the step of determining the operating mode of the laser and measuring and comparing HV again with the predetermined HV levels $HV_1$ through $HV_6$.

The setting of all of these different driving voltage levels and time, applied electrical energy to the discharge and/or pulse count schedules can be done individually or can refer to the computer controlled data base where they are stored for different operation conditions. The operation of the laser at different HV-levels under different operation conditions such as continuous pulsing or burst mode may be taken into consideration.

Figure 23:
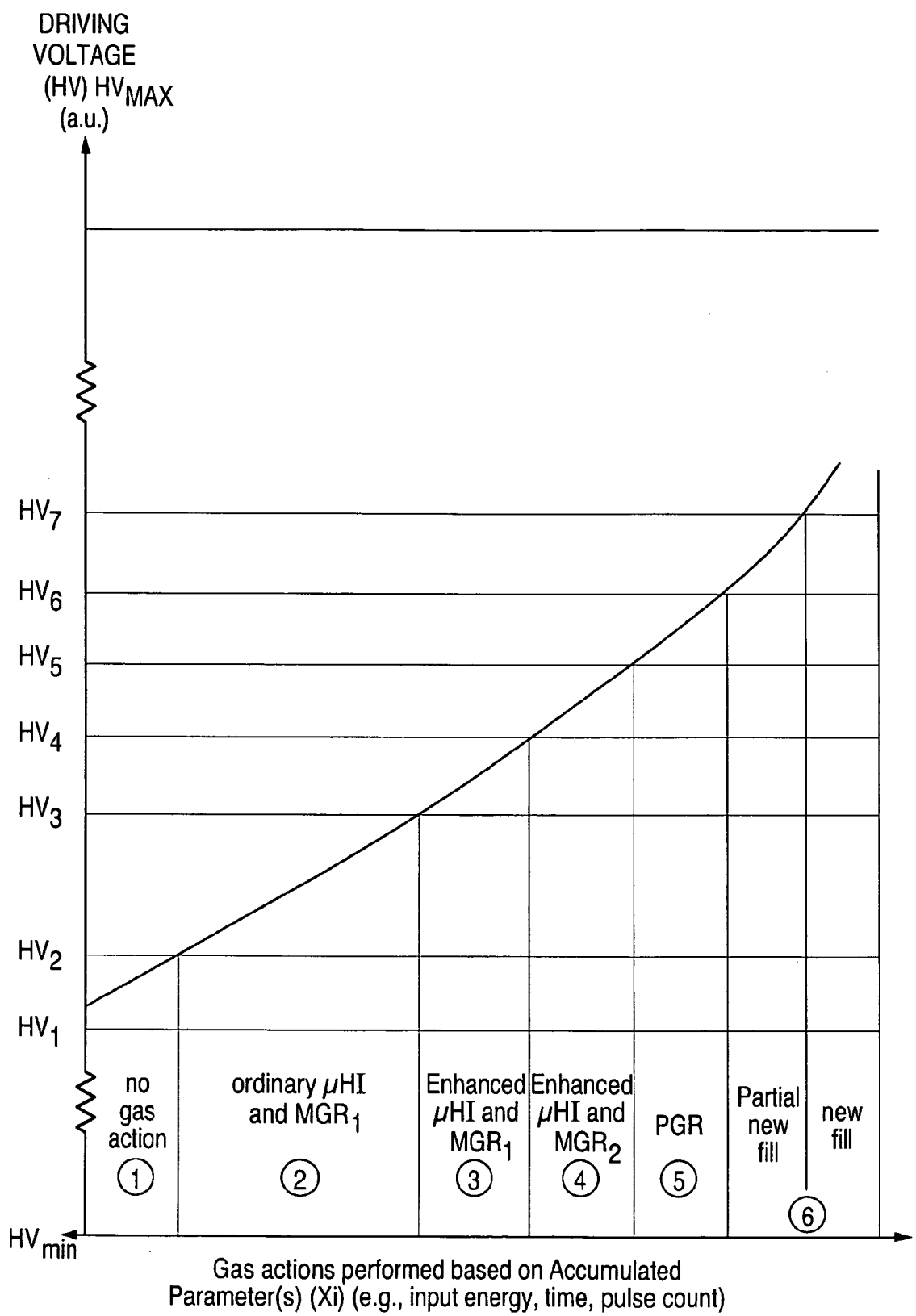
FIG. 23 is a further qualitative graph of driving voltage versus pulse count also showing periodic halogen injections, mini gas replacements and partial gas replacements for a system in accord with a preferred embodiment.
Figure 24:
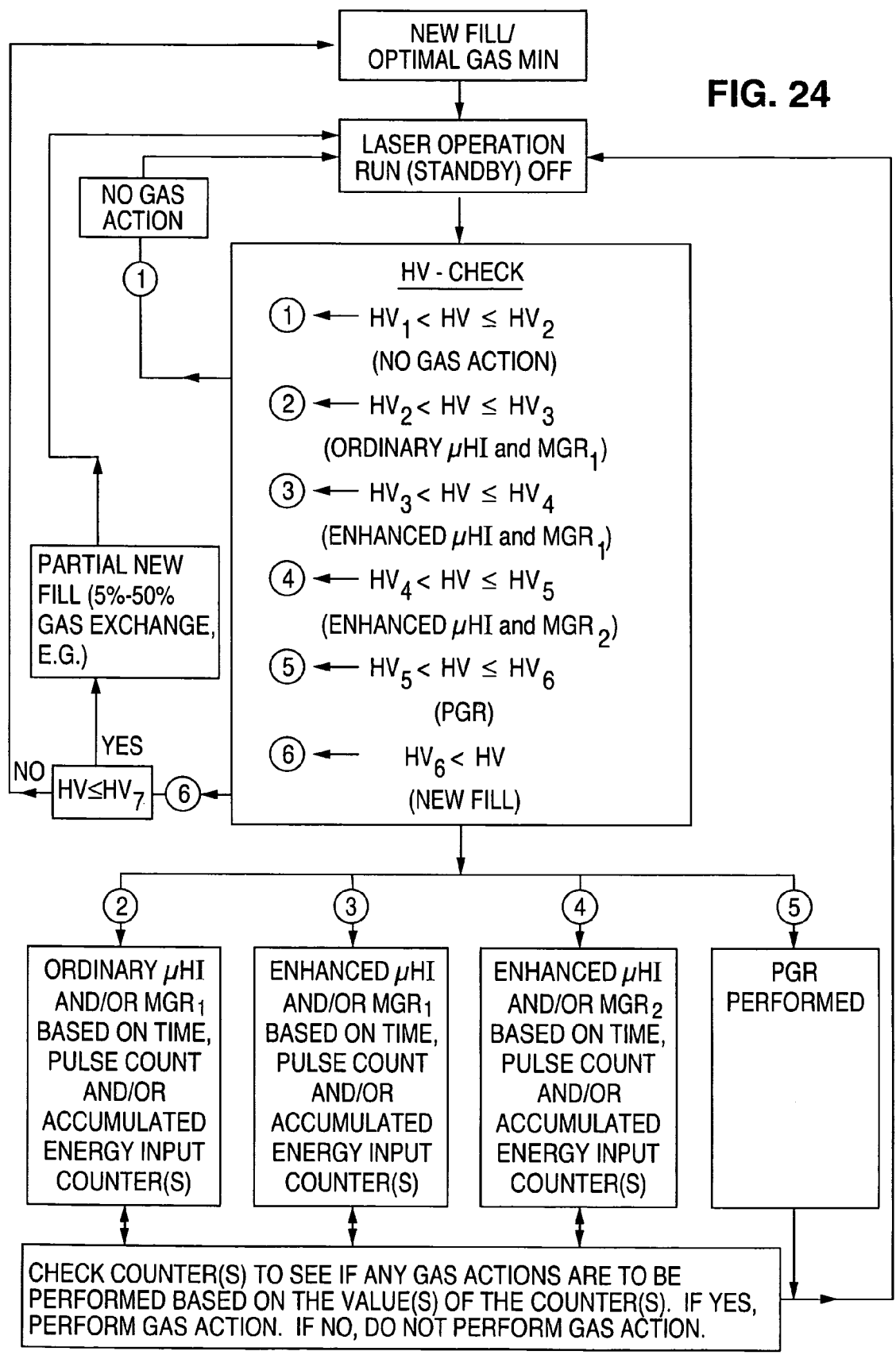
FIG. 24 is a further flow diagram for performing halogen injections, mini gas replacements and partial gas replacements in accord with a preferred embodiment.

In another preferred embodiment, a partial new fill procedure may be performed according to FIGS. 23 and 24. As shown in FIG. 23, an additional HV range is established which lies above the PGR range 5 and yet below an additional threshold value $HV_7$. The remainder of the graph shown in FIG. 23 is preferably the same as that shown in FIG. 21, and the discussion of the other ranges 1-5 will not be repeated here.

When the processor determines that the high voltage is above $HV_6$, then either a new fill or a partial new fill will be performed depending on whether the high voltage is at or below $HV_7$ wherein a partial new fill is to be performed, or is above $HV_7$, wherein a total new fill is performed. When a total new fill is performed, substantially 100% of the gas mixture is emptied from the discharge chamber and a totally fresh gas mixture is introduced into the laser chamber. However, when a partial new fill is performed, only a fraction (5% to 70% or around 0.15 bar to 2 bar, as examples) of the total gas mixture is released. More particularly preferred amounts would be between 20% and 50% or 0.6 bar to 1.5 bar. A specifically preferred amount would around 1 bar or around 30% of the gas mixture. Experiments have shown that implementing a partial new fill procedure wherein 1 bar is exchanged increases the gas lifetime by as much as five times over now having the procedure.

The amount that may be released is an amount up to which a substantial duration of time is used to get the gas out with a pump, and so the amount may be more than 50%, and yet may take substantially less time than a total new fill. Thus, a partial new fill procedure has the advantage that a large amount of aged gas is exchanged with fresh gas in a short amount of time, thus increasing wafer throughput when the laser is being used in lithographic applications, for example.

Referring now to FIG. 24, the flow chart is the same as that shown in FIG. 22, except that when the processor determines that the high voltage is above $HV_6$, an additional determination is made whether the high voltage is at or below $HV_7$. If the answer is yes, i.e., that the high voltage is at below $HV_7$, then a partial new fill is initiated, whereby less than substantially 100% of the gas mixture is taken out of the discharge chamber and replaced with fresh gas. Advantageously, the system is only taken offline for a short time compared with performing a total new fill. If the answer is no, i.e., that the high voltage is above $HV_7$, then a new fill is performed just as described above with respect to FIG. 22. As mentioned, experiments have shown that the gas lifetime can be improved by as much as five times before the new fill range would be reached when the partial new fill procedure is implemented.

It is to be understood that a system not using all of the ranges 1-6 and the new fill/partial new fill procedures of range 6 may be advantageously implemented. For example, in FIG. 23, a system that uses only a single one of the ranges with the partial new fill and new fill may be used, and the gas lifetime improved. With some ranges removed, the partial new fill range may be moved to a lower threshold high voltage. Even according to FIG. 21, one or more of the ranges may not be implemented, and the system may still improve the performance of the laser system. It is preferred that all of the ranges and corresponding gas actions be used for optimum laser system performance.

The combination of all of these different kinds of gas control and replenishment mechanisms involves harmonizing many factors and variables. Combined with the expert system and database, the processor controlled laser system of the present invention offers an extended gas lifetime before a new fill is necessary. In principle, bringing down the laser system for new fill might be totally prevented. The lifetime of the laser system would then depend on scheduled maintenance intervals determined by other laser components such as those for laser tube window or other optical components exchange. Again, as mentioned above with reference to the '126 application, even the lifetimes of the laser tube and resonator components may be increased to increase the intervals between downtime periods.

The above described gas replenishment procedures may be combined with cryogenic or electrostatic gas purification techniques, whereby contaminants such as rare gas fluorides, i.e., $AF_n$ molecules, where A=Kr, Ar or Xe and n=2, 4 or 6) or other contaminants as mentioned above are removed from the gas mixture. For this purpose, U.S. Pat. Nos. 4,534,034, 5,001,721, 5,111,473, 5,136,605 and 5,430,752 are hereby incorporated by reference into the present application. Standard methods typically include using a cold trap to freeze out contaminants before recycling the gas back into the discharge chamber. Some of the contaminants being frozen out are molecular combinations of active gases such as the active rare and halogen gases of excimer lasers. Thus, a significant amount of these important laser gases is removed from gas mixture in the discharge chamber. The result is a rapid decrease in rare and halogen gas concentrations undesirably affecting output beam parameters.

In summary, the present invention provides a method and procedure for stabilizing an original or optimal gas composition of a gas discharge laser, and particularly an excimer or molecular fluorine ($F_2$) laser. During a long period of operation of the laser in a running or stand-by mode, the depletion of the laser gas is continuously monitored by monitoring and controlling the high voltage, laser pulse shape, ASE, elapsed time after new fill or other additional laser parameters some of which have been set forth above, in addition to accumulated electrical energy applied to the discharge, time and/or pulse count. According to a database of known histories and trends of key operating parameters for various lasers operating under various conditions, a processor controlled procedure is applied to replenish the gas degradation. The stabilization process involves using a number of tiny gas actions (micro injections) performed preferably based on specified time, driving voltage change, input electrical energy to the discharge and/or shot count intervals, a combination thereof or some other interval relating to a parameter which changes with a known relationship to the gas mixture degradation. A careful combination of µHIs and MGRs of various amounts, and PGRs, are used to effect very nearly complete stabilization of the laser gas mixture over a potentially unlimited duration. Most importantly, the gas actions described herein do not disturb meaningful output beam parameters or operation of the laser, because they are smooth and controlled based on an expert system comprising myriad operating conditions of the laser system. Thus, the laser can operate without interruption during the gas replenishment actions and industrial processing can be performed with high efficiency.

A method is provided below for maintaining an output energy of an excimer or molecular fluorine laser within a tolerance range of a desired energy and for maintaining an input driving voltage within a tolerance range of an optimal input driving voltage, the excimer or molecular fluorine laser having a laser tube filled with a gas mixture, multiple electrodes within the laser tube coupled with a gas discharge circuit for energizing the gas mixture and a resonator for generating a laser beam. The method includes operating the laser to emit the laser beam within the tolerance range of the desired energy. An energy of the laser beam is measured. An input driving voltage is adjusted to maintain the energy of the laser beam within the tolerance range of the desired energy. A value of the input driving voltage is determined. A total pressure of the gas mixture within the laser tube is adjusted to maintain the input driving voltage within said tolerance range of said optimal input driving voltage.

A method is further provided for energy stabilization of an excimer or molecular fluorine laser having a laser tube filled with a gas mixture, multiple electrodes within the laser tube coupled with a gas discharge circuit for energizing the gas mixture and a resonator for generating a laser beam. The method includes operating the laser to emit the laser beam. An energy of the laser beam is measured as a first energy. A step of determining whether the first energy lies within a tolerance range of a desired energy is performed. A pressure of the gas mixture within the laser tube is adjusted to adjust the energy of the laser beam when the measured first energy is determined to be outside the tolerance range of the desired energy.

A method is further provided for optimizing performance of an excimer or molecular fluorine laser system having a laser tube filled with a gas mixture, multiple electrodes within the laser tube coupled with a gas discharge circuit for energizing the gas mixture and a resonator for generating a laser beam. The method includes setting a value of input driving voltage within an input driving voltage range which includes an optimum driving voltage predetermined to provide optimum laser system performance. A new fill of the gas mixture within the laser tube is performed. The laser is operated at the set value of input driving voltage to emit the laser beam. An energy of the laser beam is measured. A step of determining whether the measured energy is within a tolerance range of a desired energy is performed. A pressure of the gas mixture within the laser tube is adjusted to adjust the energy of the laser beam when the measured energy is determined to be outside the tolerance range of the desired energy.

A method is further provided for optimizing performance of an excimer or molecular fluorine laser system having a laser tube filled with a gas mixture, multiple electrodes within the laser tube coupled with a gas discharge circuit for energizing the gas mixture and a resonator for generating a laser beam. The method includes setting a value of input driving voltage within a tolerance input driving voltage range which includes an optimum driving voltage predetermined to provide optimum laser system performance. A new fill of the gas mixture within the laser tube is performed. The laser is operated to emit the laser beam at a desired energy. A step of determining whether the input driving voltage applied to achieve the desired energy is within the input driving voltage range is performed. A pressure of the gas mixture within the laser tube is adjusted to adjust the input driving voltage to be applied to achieve the desired energy when the input driving voltage is determined to be outside the tolerance input driving voltage range.

An excimer or molecular fluorine laser system is provided including a laser tube filled with a gas mixture, multiple electrodes within the laser tube connected to a power supply circuit for providing a driving voltage to the electrodes to energize the gas mixture, a resonator for generating a laser beam at a desired energy, a gas exchange unit connected to the laser tube including an auxiliary volume at a pressure below a pressure of the gas mixture within the laser tube, and a processor for controlling gaseous flow between the gas exchange unit and the laser tube. The gas exchange unit and the processor are configured to permit amounts of the gas mixture to release into the auxiliary volume to reduce the pressure within the laser tube to increase the driving voltage applied to achieve the desired energy when the driving voltage is determined to be below a tolerance driving voltage range to achieve the desired energy.

An excimer or molecular fluorine laser system is further provided including a laser tube filled with a gas mixture, multiple electrodes within the laser tube connected to a power supply circuit for providing a driving voltage to the electrodes to energize the gas mixture, a resonator for generating a laser beam at a desired energy, a gas exchange unit connected to the laser tube, and a processor for controlling gaseous flow between the gas exchange unit and the laser tube. The gas exchange unit and the processor are configured to permit amounts of gas to be added to the laser tube to increase the pressure within the laser tube to reduce the driving voltage applied to achieve the desired energy when the driving voltage is determined to be above a tolerance driving voltage range to achieve the desired energy.

An excimer or molecular fluorine laser, and method of operating thereof, is provided below in accord with a preferred embodiment. The average energy of output pulses or the energy dose is stabilized around a predetermined substantially constant value by monitoring the average pulse energy or energy dose and adjusting the total pressure of the laser gas mixture in the laser tube when the pulse energy or energy dose is varied from the predetermined constant value, preferably in a feedback arrangement involving a processor, an energy detector and a gas control unit. In this way, an applied driving discharge voltage from a pulser module to electrodes within a laser tube or discharge chamber of the laser is maintained within a predetermined voltage range which is smaller than in conventional laser systems. In addition, the average pulse energy or energy dose is maintained around the predetermined constant average energy and/or energy dose, while preferably a duration between new fills is not reduced and more preferably such duration is actually increased.

It is noted here that the laser tube is the portion of the laser system that is filled with the gas mixture that is excited to produce the laser beam, while the discharge chamber may be referred to as a portion of the laser tube which also includes a heat exchanger and a fan. However, the terms laser tube and discharge chamber are meant each to refer to the laser tube whenever either term is used herein. It is further noted here that when the term energy is used herein, the energy may non-exhaustively refer to an average pulse energy over several pulses, an energy dose at a workpiece, a pulse energy, an average power of a pulsed output laser beam.

An excimer or molecular fluorine laser system according to a preferred embodiment is configured with a processor for controlling one or more special gas procedures for the operation of the laser within a certain limited range of driving high voltages, i.e., nearly HV for an optimal laser operation ($HV_{opt}$), independent of the age of the laser tube and of optical components of the laser resonator. Such algorithms include adjustments of the total pressure within the laser tube. In addition, an algorithm is provided for calculating an amount of pressure adjustment before the adjustment is performed, for providing greater precision pressure in the adjustment. Further algorithms are provided for including pressure adjustments in energy control algorithms of an expert system of the laser, including measuring an output laser energy to be outside a deviation tolerance, either above or below a desired average pulse energy or energy dose, and initiating a pressure release or a pressure add, respectively, to the total pressure of the laser tube.

The average pulse energy or energy dose is preferably stabilized with the pulser circuit of the laser configured to apply a driving voltage to the electrodes at or near $HV_{opt}$ notwithstanding an aging state of the laser tube or resonator optics by adjusting the total gas pressure in the laser tube following a new fill and during the laser operation such that application of $HV_{opt}$ to the discharge of the laser results in generation of a laser beam of energy at or near a desired average pulse energy or energy dose. Therefore, an excimer or molecular fluorine laser system is provided wherein the average pulse energy may be adjusted by adjusting another parameter of the laser system other than the input driving voltage, which permits the input driving voltage to operate within a narrower range of voltages than conventional systems without reducing a duration between new fills.

Figure 25:
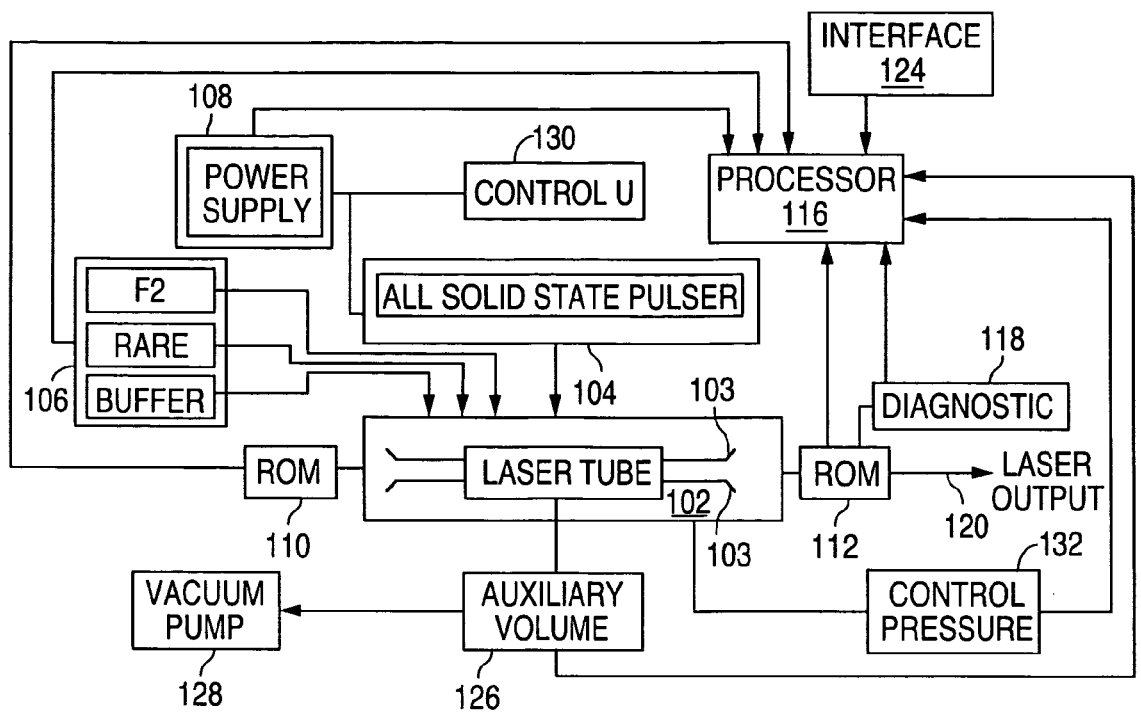
FIG. 25 schematically shows an excimer or molecular fluorine laser system according to a preferred embodiment.

FIG. 25 schematically shows an excimer or molecular fluorine laser system according to a preferred embodiment. The preferred gas discharge laser system is a DUV or VUV laser system, such as an excimer laser system, e.g., ArF or KrF, or a molecular fluorine (F2) laser system for use with a deep ultraviolet (DUV) or vacuum ultraviolet (VUV) lithography system, is schematically shown. Alternative configurations for laser systems for use in such other industrial applications as TFT annealing, photoablation and/or micromachining, e.g., are understood by those skilled in the art as being similar to and/or modified from the system shown in FIG. 25 to meet the requirements of that application. For this purpose, alternative DUV or VUV laser system and component configurations are described at U.S. patent application Ser. Nos. 09/317,695, 09/130,277, 09/244,554, 09/452,353, 09/317,527, 09/343,333, 09/512,417, 09/599,130, 60/162,735, 60/166,952, 60/171,172, 60/141,678, 60/173,993, 60/166,967, 60/147,219, 60/170,342, 60/162,735, 60/178,445, 60/166,277, 60/167,835, 60/171,919, 60/202,564, 60/204,095, 60/172,674, 09/574,921, 09/734,459, 09/741,465, 09/686,483, 09/715,803, and 60/181,156, and U.S. Pat. Nos. 6,005,880, 6,061,382, 6,020,723, 5,946,337, 6,014,206, 6,157,662, 6,154,470, 6,160,831, 6,160,832, 5,559,816, 4,611,270, 5,761,236, each of which is assigned to the same assignee as the present application and is hereby incorporated by reference.

The system shown in FIG. 25 generally includes a laser chamber 102 (or laser tube including a heat exchanger and fan for circulating a gas mixture within the chamber 102 or tube) having a pair of main discharge electrodes 103 connected with a solid-state pulser module 4, and a gas handling module 106. The gas handling module 106 has a valve connection to the laser chamber 102 so that halogen, rare and buffer gases, and preferably a gas additive, may be injected or filled into the laser chamber, preferably in premixed forms (see U.S. patent application Ser. No. 09/513,025, which is assigned to the same assignee as the present application, and U.S. Pat. No. 4,977,573, which are each hereby incorporated by reference) for ArF and KrF excimer lasers, and halogen and buffer gases, and any gas additive, for the $F_2$ laser. The solid-state pulser module 104 is powered by a high voltage power supply 108. The laser chamber 102 is surrounded by optics module 110 and optics module 112, forming a resonator. The optics modules 110 and 112 may be controlled by an optics control module (not shown), or may be alternatively directly controlled by a computer or processor 116, as shown.

The processor 116 for laser control receives various inputs and controls various operating parameters of the system. A diagnostic module 118 receives and measures one or more parameters, such as pulse energy, average energy and/or power, and preferably wavelength, of a split off portion of the main beam 120 via optics for deflecting a small portion of the beam toward the module 118, such as preferably a beam splitter module (not specifically shown). The beam 120 is preferably the laser output to an imaging system (not shown) and ultimately to a workpiece (also not shown) such as for lithographic applications, and may be output directly to an application process. The laser control computer 116 communicates through an interface 124 with a stepper/scanner computer, other control units and/or other external systems (not otherwise shown).

The laser chamber 102 contains a laser gas mixture and includes one or more preionization electrodes (not shown) in addition to the pair of main discharge electrodes 103. Preferred main electrodes 103 are described at U.S. patent application Ser. Nos. 09/453,670 and 09/791,430, each of which is assigned to the same assignee as the present application and is hereby incorporated by reference. Other electrode configurations are set forth at U.S. Pat. Nos. 5,729,565 and 4,860,300, each of which is assigned to the same assignee, and alternative embodiments are set forth at U.S. Pat. Nos. 4,691,322, 5,535,233 and 5,557,629, all of which are hereby incorporated by reference. Preferred preionization units are set forth at U.S. patent application Ser. Nos. 09/692,265, 09/532,276, and 09/247,887, each of which is assigned to the same assignee as the present application, and alternative embodiments are set forth at U.S. Pat. Nos. 5,337,330, 5,818,865 and 5,991,324, all of the above patents and patent applications being hereby incorporated by reference.

The solid-state pulser module 104 and high voltage power supply 108 supply electrical energy in compressed electrical pulses to the preionization and main electrodes 103 within the laser chamber 102 to energize the gas mixture. Components of the preferred pulser module and high voltage power supply may be described at U.S. patent application Ser. Nos. 09/640,595, 09/838,715, 09/858,147, 09/432,348 and 09/390,146, and 09/858,147, and U.S. Pat. Nos. 6,005,880 and 6,020,723, each of which is assigned to the same assignee as the present application and which is hereby incorporated by reference into the present application. Other alternative pulser modules are described at U.S. Pat. Nos. 5,982,800, 5,982,795, 5,940,421, 5,914,974, 5,949,806, 5,936,988, 6,028,872, 6,151,346 and 5,729,562, each of which is hereby incorporated by reference. A conventional pulser module may generate electrical pulses in excess of 1-3 Joules of electrical power (see the '988 patent, mentioned above).

The laser resonator which surrounds the laser chamber 102 containing the laser gas mixture includes optics module 110 preferably including line-narrowing optics for a line narrowed excimer or molecular fluorine laser, which may be replaced by a high reflectivity mirror or the like in a laser system wherein either line-narrowing is not desired, or if line narrowing is performed at the front optics module 112, or a spectral filter external to the resonator is used, or if the line-narrowing optics are disposed in front of the HR mirror, for narrowing the bandwidth of the output beam.

The laser chamber 102 is sealed by windows transparent to the wavelengths of the emitted laser radiation 120. The windows may be Brewster windows or may be aligned at another angle, e.g., 5°, to the optical path of the resonating beam. One of the windows may also serve to output couple the beam.

After a portion of the output beam 120 passes the outcoupler of the optics module 112, that output portion preferably impinges upon a beam splitter module (not shown) which includes optics for deflecting a portion of the beam to the diagnostic module 118, or otherwise allowing a small portion of the outcoupled beam to reach the diagnostic module 118, while a main beam portion 120 is allowed to continue as the output beam 120 of the laser system (see U.S. patent application Ser. Nos. 09/771,013, 09/598,552, and 09/712,877 which are assigned to the same assignee as the present invention, and U.S. Pat. No. 4,611,270, each of which is hereby incorporated by reference. Preferred optics include a beamsplitter or otherwise partially reflecting surface optic. The optics may also include a mirror or beam splitter as a second reflecting optic. More than one beam splitter and/or HR mirror(s), and/or dichroic mirror(s) may be used to direct portions of the beam to components of the diagnostic module 118. A holographic beam sampler, transmission grating, partially transmissive reflection diffraction grating, grism, prism or other refractive, dispersive and/or transmissive optic or optics may also be used to separate a small beam portion from the main beam 120 for detection at the diagnostic module 118, while allowing most of the main beam 120 to reach an application process directly or via an imaging system or otherwise.

The output beam 120 may be transmitted at the beam splitter module while a reflected beam portion is directed at the diagnostic module 118, or the main beam 120 may be reflected, while a small portion is transmitted to the diagnostic module 118. The portion of the outcoupled beam which continues past the beam splitter module is the output beam 120 of the laser, which propagates toward an industrial or experimental application such as an imaging system and workpiece for photolithographic applications.

Particularly for the molecular fluorine laser system, and for the ArF laser system, an enclosure (not shown) may seal the beam path of the beam 120 such as to keep the beam path free of photoabsorbing species. Smaller enclosures may seal the beam path between the chamber 102 and the optics modules 110 and 112 and between the beam splitter (not shown, see above) and the diagnostic module 118. Preferred enclosures are described in detail in U.S. patent application Ser. Nos. 09/343,333, 09/598,552, 09/594,892 and 09/131,580, which are assigned to the same assignee and are hereby incorporated by reference, and U.S. Pat. Nos. 5,559,584, 5,221,823, 5,763,855, 5,811,753 and 4,616,908, all of which are hereby incorporated by reference.

The diagnostic module 118 preferably includes at least one energy detector. This detector measures the total energy of the beam portion that corresponds directly to the energy of the output beam 120 (see U.S. Pat. No. 4,611,270 and U.S. patent application Ser. No. 09/379,034, each of which is assigned to the same assignee and is hereby incorporated by reference). An optical configuration such as an optical attenuator, e.g., a plate or a coating, or other optics may be formed on or near the detector or beam splitter module 121 to control the intensity, spectral distribution and/or other parameters of the radiation impinging upon the detector (see U.S. patent application Ser. Nos. 09/172,805, 09/741,465, 09/712,877, 09/771,013 and 09/774,238, each of which is assigned to the same assignee as the present application and is hereby incorporated by reference).

One other component of the diagnostic module 118 is preferably a wavelength and/or bandwidth detection component such as a monitor etalon or grating spectrometer (see U.S. patent application Ser. Nos. 09/416,344, 09/791,496, 09/686,483, 09/791,431, each of which is assigned to the same assignee as the present application, and U.S. Pat. Nos. 4,905,243, 5,978,391, 5,450,207, 4,926,428, 5,748,346, 5,025,445, and 5,978,394, all of the above wavelength and/or bandwidth detection and monitoring components being hereby incorporated by reference.

Other components of the diagnostic module may include a pulse shape detector or ASE detector, such as are described at U.S. patent application Ser. Nos. 09/484,818 and 09/418,052, respectively, each of which is assigned to the same assignee as the present application and is hereby incorporated by reference, such as for gas control and/or output beam energy stabilization, or to monitor the amount of amplified spontaneous emission (ASE) within the beam to ensure that the ASE remains below a predetermined level, as set forth in more detail below. There may be a beam alignment monitor, e.g., such as is described at U.S. Pat. No. 6,014,206, or beam profile monitor, e.g., U.S. patent application Ser. No. 09/780,124, which is assigned to the same assignee, wherein each of these patent documents is hereby incorporated by reference.

The processor or control computer 116 receives and processes values of some of the pulse shape, energy, ASE, energy stability, energy overshoot for burst mode operation, wavelength, spectral purity and/or bandwidth, among other input or output parameters of the laser system and output beam. The processor 116 also controls the line narrowing module to tune the wavelength and/or bandwidth or spectral purity, and controls the power supply and pulser module 104 and 108 to control preferably the moving average pulse power or energy, such that the energy dose at points on the workpiece is stabilized around a desired value. In addition, the computer 116 controls the gas handling module 106 which includes gas supply valves connected to various gas sources. Further functions of the processor 116 such as to provide overshoot control, energy stability control and/or to monitor input energy to the discharge, are described in more detail at U.S. patent application Ser. No. 09/588,561, which is assigned to the same assignee and is hereby incorporated by reference.

As shown in FIG. 25, the processor preferably communicates the solid-state pulser module 104 and HV power supply 108, separately or in combination, the gas handling module 106, the optics modules 110 and/or 112, the diagnostic module 118, and an interface 124. The processor preferably also controls an auxiliary volume 126 which is preferably connected to a vacuum pump 128 for releasing gases from the laser tube 102 for reducing a total pressure in the tube 102 according to preferred embodiments set forth in more detail below. In this way, the processor controls the input voltage to the discharge 130 and the laser tube total pressure 132 for controlling the average energy or energy dose in the laser beam 120 output by the laser in a feedback control loop including receiving pulse energy and/or beam power data from the diagnostic module 118, and preferably according to one or more algorithms set forth below with reference to FIGS. 26-29.

The laser gas mixture is initially filled into the laser chamber 102 in a process referred to herein as a "new fills". In such procedure, the laser tube is evacuated of laser gases and contaminants, and re-filled with an ideal gas composition of fresh gas. The gas composition for a very stable excimer or molecular fluorine laser in accord with the preferred embodiment uses helium or neon or a mixture of helium and neon as buffer gas(es), depending on the particular laser being used. Preferred gas compositions are described at U.S. Pat. Nos. 4,393,405, 6,157,162 and 4,977, 573 and U.S. patent application Ser. Nos. 09/513,025, 09/447,882, 09/418,052, and 09/588,561, each of which is assigned to the same assignee and is hereby incorporated by reference into the present application. The concentration of the fluorine in the gas mixture may range from 0.003% to 1.00%, and is preferably around 0.1%. An additional gas additive, such as a rare gas or otherwise, may be added for increased energy stability, overshoot control and/or as an attenuator as described in the Ser. No. 09/513,025 application incorporated by reference above. Specifically, for the F2-laser, an addition of xenon, krypton and/or argon may be used. The concentration of xenon or argon in the mixture may range from 0.0001% to 0.1%. For an ArF-laser, an addition of xenon or krypton may be used also having a concentration between 0.0001% to 0.1%. For the KrF laser, an addition of xenon or argon may be used also having a concentration between 0.0001% to 0.1%.

Halogen and rare gas injections, total pressure adjustments and gas replacement procedures are performed using the gas handling module 106 preferably including a vacuum pump, a valve network and one or more gas compartments. The gas handling module 106 receives gas via gas lines connected to gas containers, tanks, canisters and/or bottles. Some preferred and alternative gas handling and/or replenishment procedures, other than as specifically described herein (see below), are described at U.S. Pat. Nos. 4,977,573 and 5,396,514 and U.S. patent application Ser. Nos. 09/447, 882, 09/418,052, 09/379,034, 09/734,459, 09/513,025 and 09/588,561, each of which is assigned to the same assignee as the present application, and U.S. Pat. Nos. 5,978,406, 6,014,398 and 6,028,880, all of which are hereby incorporated by reference. A xenon gas supply may be included either internal or external to the laser system according to the '025 application, mentioned above.

Total pressure adjustments in the form of releases of gases or reduction of the total pressure within the laser tube 102 are preferably facilitated by using the auxiliary volume 126. A valve is opened between the auxiliary volume 126 and the gas mixture in the laser tube 102 when the auxiliary volume 126 is at lower pressure than the laser tube 102, preferably due to the vacuum pump being connected to the auxiliary volume before or during the pressure release. Total pressure adjustments in the form of increases in the total pressure may be performed using the valves of the gas handling unit 106 and injecting combinations of gases or only a single gas such as the buffer gas of helium, neon or a combination thereof. Total pressure adjustments may be followed by gas composition adjustments if it is determined that, e.g., other than the desired partial pressure of halogen gas is within the laser tube 102 after the total pressure adjustment. Total pressure adjustments may also be performed after gas replenishment actions, and may be performed in combination with smaller adjustments of the driving voltage to the discharge than would be made if no pressure adjustments were performed in combination.

The auxiliary volume 126 is connected to the laser tube 102 for releasing gas from the laser tube 102 into the volume 126 based on control signals received from the processor 111. The processor 111 regulates the release of gases via a valve assembly to the auxiliary volume 126, and also regulates the delivery of gases or mixtures of gases to the laser tube 102 via a valve assembly or system of valves associated with the gas handling unit 106.

The auxiliary volume preferably includes a reservoir or compartment having a known volume and preferably having a pressure gauge attached for measuring the pressure in the auxiliary volume. Alternatively or in combination with the pressure gauge, a flow rate controller allows the processor to control the flow rate of gases from the tube 102 to the auxiliary volume 126, so that the processor may control and/or determine precisely how much gas is being released or has been released. The auxiliary volume 126 as well as the laser tube may also each have means, such as a thermocouple arrangement, for measuring the temperature of the gases within the volume 126 and tube 102. The compartment 107 may be a few to thousands of $cm^3$ or so in volumetric size (preferably, the laser tube 102 may be around 42,000 $cm^3$ volumetrically).

At least one valve is included for controlling the flow of gases between the laser tube 102 and the auxiliary volume 126. Additional valves may be included therebetween. Another valve is also included between the vacuum pump 128 and the auxiliary volume 126 for controlling access between the vacuum pump 128 and the auxiliary volume 126. A further valve or valves may be provided between either or both of the vacuum pump 128 and auxiliary volume 126 and the laser tube 102 and the auxiliary volume 126 for controlling the atmosphere in the line therebetween, and an additional pump or the same vacuum pump 128 may be used to evacuate the line between the laser tube and auxiliary volume either directly or through the auxiliary volume.

Predetermined amounts of the gas mixture in the tube 102 are preferably released into the auxiliary volume 126 from the laser tube 102 for total pressure releases according algorithms of preferred embodiments set forth herein. This same auxiliary volume may be used in partial, mini- or macro-gas replacement operations such as are set forth above. As an example, the gas handling unit 106 connected to the laser tube 102 either directly or through an additional valve assembly, such as may include a small compartment for regulating the amount of gas injected (see above), may include a gas line for injecting a premix A including 1% $F_2$:99% Ne, and another gas line for injecting a premix B including 1% Kr:99% Ne, for a KrF laser. For an ArF laser, premix B would have Ar instead of Kr, and for a $F_2$ laser premix B is not used. Thus, by injecting premix A and premix B into the tube 102 via the valve assembly, the fluorine and krypton concentrations (for the KrF laser, e.g.) in the laser tube 102, respectively, may be replenished. Then, a certain amount of gas is released corresponding to the amount that was injected. Additional gas lines and/or valves may be used for injecting additional gas mixtures. New fills, partial and mini gas replacements and gas injection procedures, e.g., enhanced and ordinary micro-halogen injections, and any and all other gas replenishment actions are initiated and controlled by the processor 111 which controls valve assemblies of the gas handling unit 106, laser tube 102, auxiliary volume 126 and vacuum pump 128 based on various input information in a feedback loop.

An exemplary method according to the present invention is next described for accurately and precisely releasing gas from the laser tube 102 into the auxiliary volume 126. It is noted that a similar procedure for accurately and precisely replenishing gases including injection into the laser tube 102 are preferably used for injecting small amounts of gases such that significant output beam parameters are not significantly disturbed, if at all, with each gas injection. For example, the processor 116, which is monitoring a parameter indicative of the fluorine concentration in the laser tube 102, may initiate a micro-halogen injection (μHI) when the processor 116 determines it is time to increase the halogen concentration in the gas mixture in the laser tube 102 (further details of preferred gas replenishment actions are described above).

With respect to preferred total pressure releases according to preferred embodiments herein, the processor 116 determines that it is time for a pressure release. The processor 116 then sends a signal that causes a valve to open between the tube 102 and the volume 126 to gases to flow from the tube 102 to the volume 126 either to a predetermined pressure in the auxiliary volume 126 or according to a known flow rate and time that the valve is to be opened. Then, the valve is closed. Preferably, the pressure in the tube 102 after the release is determined by either a pressure gauge on the tube 102 or by calculation using the known amount of gas released and the amount of gas that was in the tube 102 before the release. A valve between the vacuum pump and the auxiliary volume is then preferably opened allowing the gas in the volume 126 to be pumped out of the volume.

If the pressure in the tube was 3 bar prior to the release and the tube has 42,000 cm$^3$, and the release is such that the pressure in the auxiliary volume was increased to, e.g., around 3 bar after the release, then 0.5×[(volume of auxiliary volume 26)/42,000] bar would be the pressure reduction in the tube 102 as a result of the release. Particular total pressure release or addition algorithms are set forth below with reference to FIGS. 26-29.

The above calculation may be performed by the processor 116 to determine more precisely how much gas was released, or prior to the release, the pressure in the auxiliary volume 126 may be set according to a calculation by the processor 116 concerning how much gas should be released based on the information received by the processor 116 and/or based on pre-programmed criteria. Preferably, the auxiliary volume is pumped down such that a substantially zero pressure approximation may be used, or a very low pressure as measured by a gauge measuring the pressure in the interior of the volume 126. A correction for difference in temperature between the gas in the tube 102 and the auxiliary volume 126 may also be performed by the processor 116 for greater accuracy, or the temperature within the auxiliary volume may be preset, e.g., to the temperature within the laser tube 102.

There may be more than one auxiliary volume like the volume 126, as described above, each having different properties such as volumetric space. For example, there may be two compartments, one for gas replacement procedures and one for total pressure releases. There may be more than two, for still further versatility in the amounts of gas to be released, and for adjusting driving voltage ranges corresponding to different gas action algorithms (see above).

A general description of the line-narrowing features of the several embodiments of the present is provided here, followed by a listing of patent and patent applications being incorporated by reference as describing variations and features that may used within the scope of the present invention for providing an output beam with a high spectral purity or bandwidth (e.g., below 1 pm and preferably 0.6 pm or less). Exemplary line-narrowing optics contained in the optics module 110 include a beam expander, an optional interferometric device such as an etalon and a diffraction grating, which produces a relatively high degree of dispersion, for a narrow band laser such as is used with a refractive or catadioptric optical lithography imaging system. As mentioned above, the front optics module may include line-narrowing optics as well (see the U.S. Pat. Nos. 09/715,803, 09/738,849, and 09/718,809 applications, each being assigned to the same assignee and hereby incorporated by reference).

For a semi-narrow band laser such as is used with an all-reflective imaging system, the grating may be replaced with a highly reflective mirror, and a lower degree of dispersion may be produced by a dispersive prism. A semi-narrow band laser would typically have an output beam linewidth in excess of 1 pm and may be as high as 100 pm in some laser systems, depending on the characteristic broadband bandwidth of the laser.

The beam expander of the above exemplary line-narrowing optics of the optics module 110 preferably includes one or more prisms. The beam expander may include other beam expanding optics such as a lens assembly or a converging/diverging lens pair. The grating or a highly reflective mirror is preferably rotatable so that the wavelengths reflected into the acceptance angle of the resonator can be selected or tuned. Alternatively, the grating, or other optic or optics, or the entire line-narrowing module may be pressure tuned, such as is set forth in the U.S. Pat. Nos. 09/771,366 and 09/317,527 applications, each of which is assigned to the same assignee and is hereby incorporated by reference. The grating may be used both for dispersing the beam for achieving narrow bandwidths and also preferably for retroreflecting the beam back toward the laser tube. Alternatively, a highly reflective mirror is positioned after the grating which receives a reflection from the grating and reflects the beam back toward the grating in a Littman configuration, or the grating may be a transmission grating. One or more dispersive prisms may also be used, and more than one etalon may be used.

Depending on the type and extent of line-narrowing and/or selection and tuning that is desired, and the particular laser that the line-narrowing optics are to be installed into, there are many alternative optical configurations that may be used. For this purpose, those shown in U.S. Pat. Nos. 4,399,540, 4,905,243, 5,226,050, 5,559,816, 5,659,419, 5,663,973, 5,761,236, 6.081,542, 6,061,382, and 5,946,337, and U.S. patent application Ser. Nos. 09/317,695, 09/130,277, 09/244,554, 09/317,527, 09/073,070, 09/452,353, 09/602,184, 09/629,256, 09/599,130, 09/712,367, 09/741,465, 09/774,238, 09/738,849, 09/715,803, 09/718,809, 09/712,367, 09/791,431, each of which is assigned to the same assignee as the present application, and U.S. Pat. Nos. 5,095,492, 5,684,822, 5,835,520, 5,852,627, 5,856,991, 5,898,725, 5,901,163, 5,917,849, 5,970,082, 5,404,366, 4,975,919, 5,142,543, 5,596,596, 5,802,094, 4,856,018, 5,970,082, 5,978,409, 5,999,318, 5,150,370 and 4,829,536, and German patent DE 298 22 090.3, are each hereby incorporated by reference into the present application.

Optics module 112 preferably includes means for outcoupling the beam 120, such as a partially reflective resonator reflector. The beam 120 may be otherwise outcoupled such as by an intra-resonator beam splitter or partially reflecting surface of another optical element, and the optics module 112 would in this case include a highly reflective mirror. The optics control module 114 preferably controls the optics modules 110 and 112 such as by receiving and interpreting signals from the processor 16, and initiating realignment or reconfiguration procedures (see the '353, '695, '277, '554, and '527 applications mentioned above).

The preferred embodiments relate particularly to excimer and molecular fluorine laser systems configured for adjustment of an average pulse energy of an output beam of the laser systems by using gas handling procedures including total pressure adjustments of the gas mixture in the laser tube 102. To avoid the operation of laser with a new laser tube and optics at a voltage below an optimal driving voltage level, or $HV_{opt}$, the total gas pressure after a new fill is advantageously decreased by a total pressure release, such as has been described above with reference to FIG. 25, until a desired average pulse energy corresponds to an input driving voltage within an acceptable range of the high voltage around $HV_{opt}$.

The halogen and the rare gas concentrations are maintained constant during laser operation by gas replenishment actions for replenishing the amount of halogen, rare gas and buffer gas in the laser tube for KrF and ArF excimer lasers, and halogen and buffer gas for molecular fluorine lasers, such that these gases are maintained in a same predetermined ratio as are in the laser tube 102 following a new fill procedure. A resulting decrease in the total pressure in the tube 102 is achieved by pumping out gases from the tube 102 through the auxiliary volume 126, as set forth above. Gas injection actions such as µHIs as understood from the above, may be advantageously modified into micro gas replacement procedures, such that the increase in energy of the output laser beam may be compensated by reducing the total pressure. In contrast, or alternatively, conventional laser systems would reduce the input driving voltage so that the energy of the output beam is at the predetermined desired energy. In this way, the driving voltage is maintained within a small range around $HV_{opt}$, while the gas procedure operates replenish the gases and maintain the average pulse energy or energy dose, such as by controlling an output rate of change of the gas mixture or a rate of gas flow through the laser tube 102.

Further stabilization by increasing the average pulse energy during laser operation may be advantageously performed by increasing the total pressure of gas mixture in the laser tube up to $P_{max}$. The increase of the total pressure takes place automatically when gas injections are not compensated by releases of gas after the injection, or may occur by affirmative further increases of the total gas pressure in the laser tube 102, which may be independent of any gas replenishment procedures or procedures for adjusting the gas composition to a desired composition, for controlling an increase of the average pulse energy by total pressure increase. Advantageously, the gas procedures set forth herein permit the laser system to operate within a very small range around $HV_{opt}$, while still achieving average pulse energy control and gas replenishment.

A laser system having a discharge chamber or laser tube 102 with a same gas mixture, total gas pressure, constant distance between the electrodes and constant rise time of the charge on laser peaking capacitors of the pulser module 104, also has a constant breakdown voltage. The operation of the laser has an optimal driving voltage $HV_{opt}$, at which the generation of a laser beam has a maximum efficiency and discharge stability.

As mentioned briefly above, an undesirable situation for a conventional laser tube can occur if the laser is operated at an input driving voltage much less than $HV_{opt}$. Such a low driving voltage would be outside of the driving voltage range that the laser of the preferred embodiment is operated within. If a laser is operated at this low discharge voltage, the discharge is not stable and the electrodes of the conventional laser system can be eroded quickly or strongly burned. To avoid the operation of the laser with a new laser tube and optics at a voltage below $HV_{opt}$, the total gas pressure after a new fill is advantageously reduced in a laser tube 102 in accord with the preferred embodiment, compared with a total gas pressure after a new fill of a laser having an aged laser tube 102 and/or optics. In this way, the desired average pulse energy is achieved and corresponds to at most only a deviation from the optimal driving voltage $HV_{opt}$. For example, while a conventional laser is typically reduced to operation at 1.5 kV or the low end of the conventional range and ordinary total laser tube pressure, the laser of the preferred embodiment is operated at around 1.7 kV, or around the optimal input driving voltage, and the laser tube pressure is reduced to a lower pressure, e.g., around a minimum tolerable pressure $P_{min}$.

Figure 26:
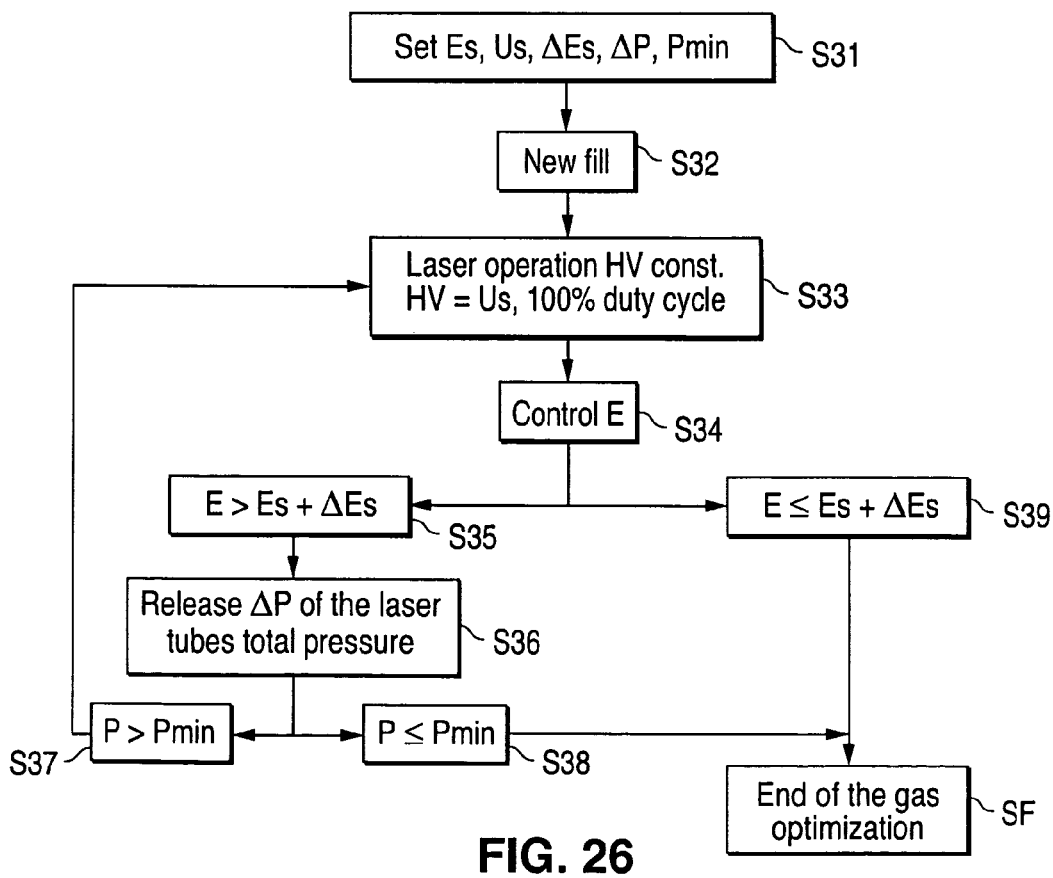
FIG. 26 shows a gas action algorithm including a pressure release step according to a first preferred embodiment.

A first preferred algorithm according to this procedure is set forth in the flow diagram shown at FIG. 26. Referring to FIG. 26, at step S31 parameters are set including $E_s$, $U_s$, $\Delta E_s$, $\Delta P$, and $P_{min}$, wherein:

$E_s$ corresponds to a desired average output pulse energy of laser oscillation, which is preferably around 10 mJ;

$U_s$ corresponds to a desired driving voltage for laser operation with average pulse energy $E_s$, which is preferably at or near $HV_{opt}$, and as mentioned, $HV_{opt}$, and correspondingly $U_s$, is preferably around 1.7 kV;

$\Delta E_s$ corresponds to a desired tolerance of average pulse energy by laser operation at driving voltage $U_s$, and is preferably around 0.5 mJ or less;

$\Delta P$ corresponds to a predefined amount of released gas mixture, e.g., around 100 mbar may be released in steps; and $P_{min}$ corresponds to a predefined minimal allowed value of the total gas pressure in the laser tube 102, and may be between 2200 and 2800 mbar, and the minimum pressure $P_{min}$ will depend on the gas mixture of the laser system, as so may vary.

At step S32, a new fill is performed, such as has been previously described above and/or is understood by those skilled in the art. At step S33, the laser is operated at a constant or substantially constant driving voltage of $U_s$ and a 100% duty cycle. The output average pulse energy E is then measured using an energy detector at step S34, wherein the measured energy is then preferably sent to the processor 116 of FIG. 25.

The processor 116 then determines whether the measured energy E is above the tolerance range, i.e., whether $E > E_s + \Delta E_s$. If at step S35, the processor 116 determines that the energy E is above the tolerance limit $E_s + \Delta E_s$, then at step S36, a release of pressure from the laser tube 102 in an amount $\Delta P$ is performed. If the pressure P in the tube 102 after the pressure release is then determined at step S37 to be greater than $P_{min}$, then the procedure returns to step S33. If the pressure P in the tube 102 after the pressure release is, however, then determined at step S38 to be less than or equal to $P_{min}$, then the gas optimization procedure is ended at step SF. If after the energy measurement at step S34, the processor 116 determines that the measured energy E is within or below the tolerance range, i.e., $E < E_s + \Delta E_s$, at step S39, then the gas optimization procedure is ended at step SF.

Figure 27:
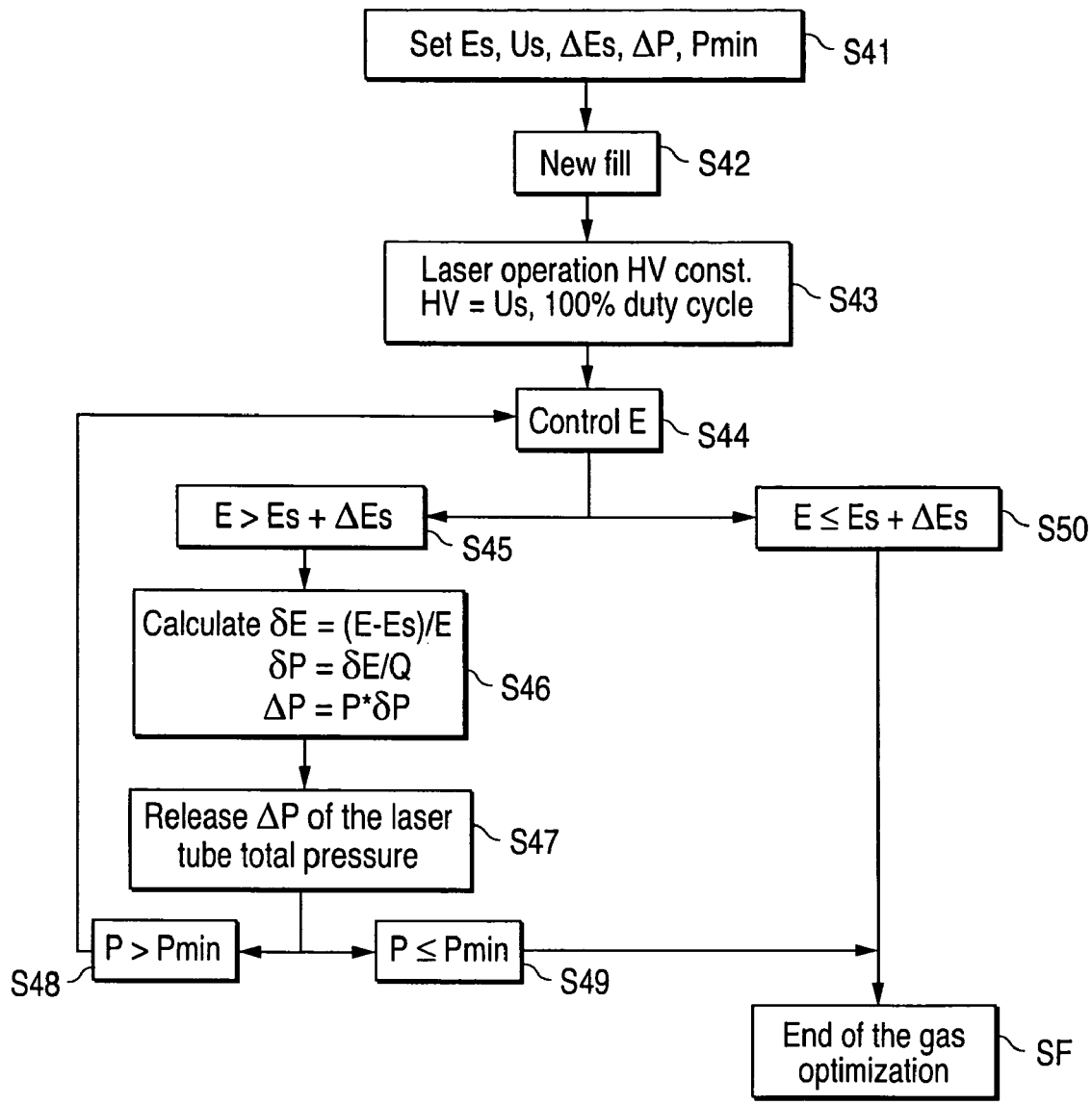
FIG. 27 shows a gas action algorithm including a pressure release step according to a second preferred embodiment.

A second preferred algorithm according to the gas optimization procedure of the preferred embodiment is set forth in the flow diagram shown at FIG. 27. Referring to FIG. 27, at step S41 parameters are set including $E_s$, $U_s$, $\Delta E_s$, Q, and $P_{min}$, wherein:

$E_s$ corresponds to a desired average output pulse energy of laser oscillation;

$U_s$ corresponds to a desired driving voltage for laser operation with average pulse energy $E_s$, which is preferably at or near $HV_{opt}$;

$\Delta E_s$ corresponds to a desired tolerance of average pulse energy by laser operation at driving voltage $U_s$;

Q corresponds to a factor determined based on a relationship between a desired decreasing of the average laser pulse energy and a demanded value of released pressure of the gas mixture, and Q may ordinarily be between 2 and 4; and $P_{min}$ corresponds to a predefined minimal allowed value of the total gas pressure in the laser tube 102, while preferred values of some of these quantities has been mentioned above.

At step S42, a new fill is performed, such as has been previously described above and/or is understood by those skilled in the art. At step S43, the laser is operated at a constant or substantially constant driving voltage of $U_s$ and a 100% duty cycle. The output average pulse energy E is then measured using an energy detector at step S44, wherein the measured energy is then preferably sent to the processor 116 of FIG. 25.

The processor 116 then determines whether the measured energy E is above the tolerance range, i.e., whether $E>E_s+\Delta E_s$. If at step S45, the processor 116 determines that the energy E is above the tolerance limit $E_s+\Delta E_s$, then at step S46, an amount of pressure $\Delta P$ to be released is calculated by the processor 116. At step S46, an energy differential $\delta E$ is calculated as $\delta E=(E-E_s)/E$. Then, a pressure differential $\delta P$ is calculated as $\delta P=\delta E/Q$. Then, an amount of pressure release $\Delta P$ is calculated as $\Delta P=P\times\delta P=P\times(E-E_s)/(Q\times E)$, where P is the pressure in the tube prior to the pressure release $\Delta P$.

Then at step S47, a release of pressure from the laser tube 102 in the calculated amount $\Delta P$ is performed. If the pressure P in the tube 102 after the pressure release is then determined at step S48 to be greater than $P_{min}$, then the procedure returns to step S43. If the pressure P in the tube 102 after the pressure release is, however, then determined at step S49 to be less than or equal to $P_{min}$, then the gas optimization procedure is ended at step SF. If after the energy measurement at step S44, the processor 116 determines that the measured energy E is within or below the tolerance range, i.e., $E\leq E_s+\Delta E_s$, at step S50, then the gas optimization procedure is ended at step SF.

FIG. 27 shows an alternative algorithm to that shown at FIG. 26, wherein the adjustment of the average pulse energy by means of decreasing of the total gas pressure in the laser tube is performed by a pressure release in an amount which is calculated at step S46 prior to the release at step S47. In contrast, in the algorithm shown at FIG. 26, the pressure release amount $\Delta P$ is determined in advance.

Figure 28:
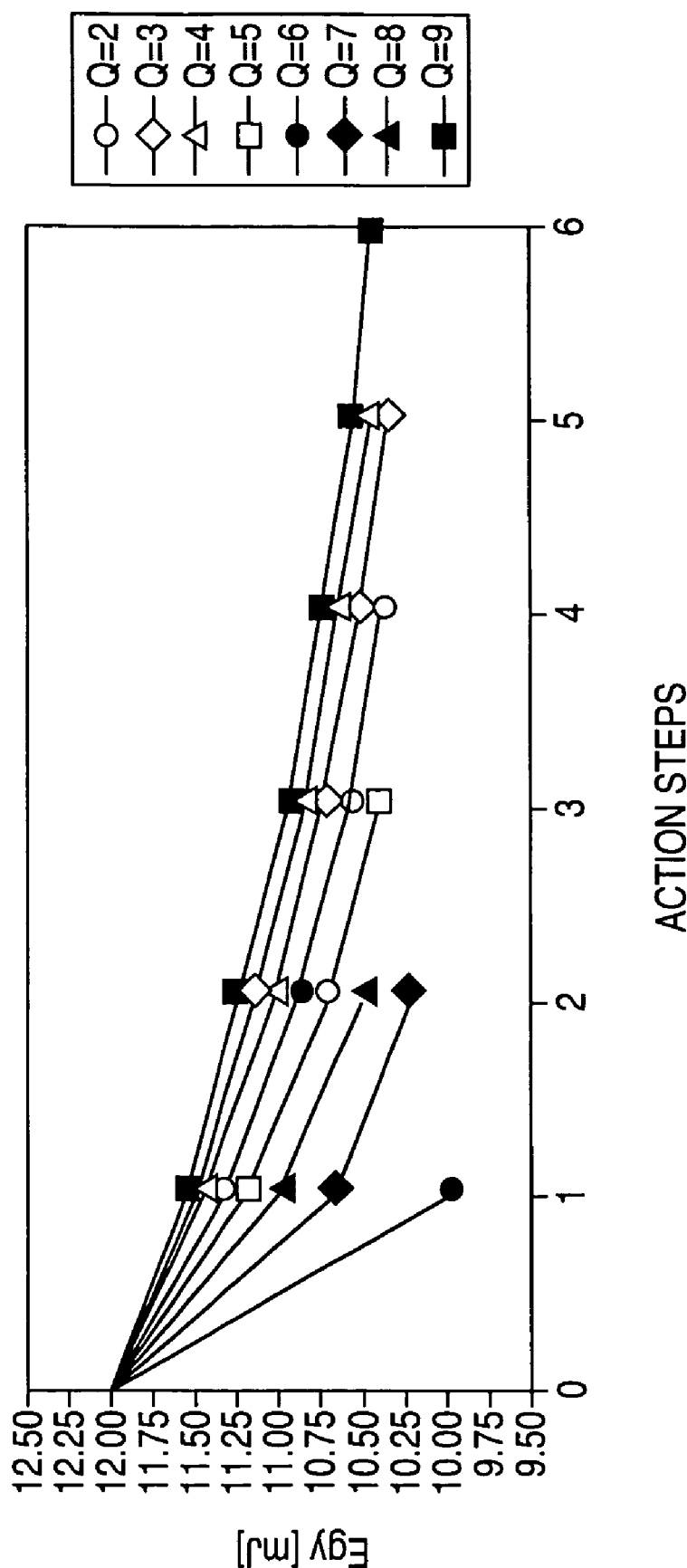
FIG. 28 shows plots characterizing laser performances for different values of the quality factor Q.

FIG. 28 shows several plots of average laser output energy versus pressure release steps of same amounts of release pressure for various values of the Q factor referred to above and used in the determination of the amount of pressure to be released at step S46 of the algorithm of FIG. 27. The graph at FIG. 28 shows that for a laser operating with a Q factor of Q=2, the average output pulse energy is reduced by about 2 mJ, while for a same pressure release amount for a laser operating at Q factor Q=9, the average output pulse energy is reduced by only about 0.4 mJ. The reduction in average output pulse energy varies in between 2 mJ and 0.4 mJ for a same pressure release amount for lasers operating at Q factors between Q=3 and Q=8. FIG. 28 thus clearly shows that the average pulse energy reduces for a same pressure release amount by a different amount depending on the Q factor of the laser system. In order then to reduce the output energies for lasers operating at different Q values by a same energy amount, the amount of the pressure release is advantageously varied according the algorithm of FIG. 27, as shown in the calculation step S46, wherein the calculated amount is dependent on the q factor. The accuracy of the approach to reducing the average pulse energy to the desired pulse energy and number of steps of such procedures is thus improved according to the algorithm of FIG. 27.

Figure 29:
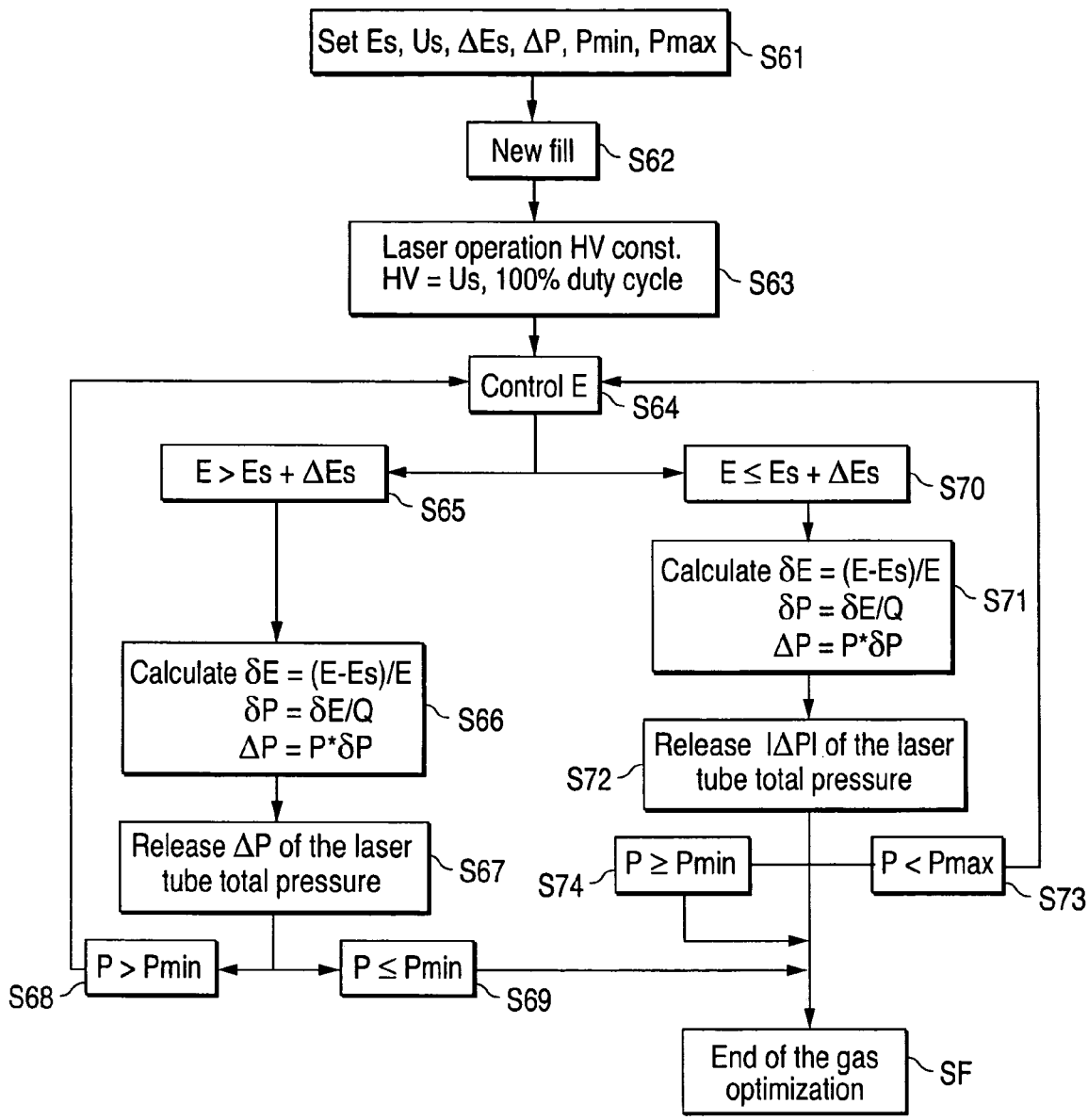
FIG. 29 shows a gas action algorithm including pressure release and pressure addition steps according to a third embodiment.

A third preferred algorithm according to the gas optimization procedure of the preferred embodiment is set forth in the flow diagram shown at FIG. 29. Referring to FIG. 29, at step S61 parameters are set including $E_s$, $U_s$, $\Delta E_s$, Q, $P_{min}$ and $P_{max}$, wherein:

$E_s$ corresponds to a desired average output pulse energy of laser oscillation;

$U_s$ corresponds to a desired driving voltage for laser operation with average pulse energy $E_s$, which is preferably at or near $HV_{opt}$;

$\Delta E_s$ corresponds to a desired tolerance of average pulse energy by laser operation at driving voltage $U_s$;

Q corresponds to a factor determined based on a relationship between a desired decreasing of the average laser pulse energy and a demanded value of released pressure of the gas mixture;

$P_{min}$ corresponds to a predefined minimum allowed value of the total gas pressure in the laser tube 102; and $P_{max}$ corresponds to a predefined maximum allowed value of the total gas pressure in the laser tube 102, and $P_{max}$ would typically be greater than 3 bar.

At step S62, a new fill is performed, such as has been previously described above and/or is understood by those skilled in the art. At step S63, the laser is operated at a constant or substantially constant driving voltage of $U_s$ and a 100% duty cycle. The output average pulse energy E is then measured using an energy detector at step S64, wherein the measured energy is then preferably sent to the processor 116 of FIG. 25.

The processor 116 then determines whether the measured energy E is above the tolerance range, i.e., whether $E>E_s+\Delta E_s$. If at step S65, the processor 116 determines that the energy E is above the tolerance limit $E_s+\Delta E_s$, then at step S66, an amount of pressure $\Delta P$ to be released is calculated by the processor 116. At step S66, an energy differential $\delta E$ is calculated as $\delta E=(E-E_s)/E$. Then, a pressure differential $\delta P$ is calculated as $\delta P=\delta E/Q$. Then, an amount of pressure release $\Delta P$ is calculated as $\Delta P=P\times\delta P=P\times(E-E_s)/(Q\times E)$, where P is the pressure in the tube prior to the pressure release $\Delta P$.

Then at step S67, a release of pressure from the laser tube 102 in the calculated amount $\Delta P$ is performed. If the pressure P in the tube 102 after the pressure release is then determined at step S68 to be greater than $P_{min}$, then the procedure returns to step S64. If the pressure P in the tube 102 after the pressure release is, however, then determined at step S69 to be less than or equal to $P_{min}$, then the gas optimization procedure is ended at step SF.

If after the energy measurement at step S64, the processor 116 determines that the measured energy E is within or below the tolerance range, i.e., $E\leq E_s+\Delta E_s$, at step S70, an amount of pressure $\Delta P$ to be added into the laser tube 102 is calculated by the processor 116. At step S71, an energy differential $\delta E$ is calculated as $\delta E=(E-E_s)/E$. Then, a pressure differential $\Delta P$ is calculated as $\Delta P=\delta E/Q$. Then, an amount of pressure addition $\Delta P$ is calculated as $\Delta P=P\times\delta P=P\times(E-E_s)/(Q\times E)$, where P is the pressure in the tube prior to the pressure add $\Delta P$.

Then at step S72, an addition of pressure into the laser tube 102 in the calculated amount $\Delta P$ is performed. If the pressure P in the tube 102 after the pressure addition is then determined at step S73 to be less than $P_{max}$, then the procedure returns to step S64. If the pressure P in the tube 102 after the pressure addition is, however, then determined at step S74 to be greater than or equal to $P_{max}$, then the gas optimization procedure is ended at step SF.

FIG. 29 shows an alternative algorithm to those shown at FIGS. 26 and 27, wherein the adjustment of the average pulse energy by means of decreasing and increasing the total gas pressure in the laser tube 102 is performed by a pressure release or pressure addition, respectively, in an amount which is calculated at step S66 or step S71 prior to the release or addition at step S47 or step S72. In contrast, in the algorithm shown at FIG. 26, the pressure release amount $\Delta P$ is determined in advance, and there are no pressure addition steps in either of the algorithms of FIG. 26 or 27.

The algorithm of FIG. 29 may be modified to an algorithm for incorporating total pressure adjustments within an average pulse energy control algorithm other than just after a new fill. Conventional average pulse energy control algorithms are known by those skilled in the art and steps involved in those procedures that are preferably combined with those of the following algorithm and those steps involved in the algorithms shown at FIGS. 26-27 and 29 are not shown or described here. The Ser. Nos. 09/588,561 and 09/734,459 applications, incorporated herein by reference above, describe energy control algorithms including burst overshoot control (see particularly the '561 application) and average pulse energy control components of a preferred algorithm that may be combined with the algorithm described here which includes pressure adjustments for controlling the average pulse energy.

Parameters have already been set according to the algorithms set forth above, and may be adjusted for this present algorithm, including $E_s$, $U_s$, $\Delta E_s$, Q, $P_{min}$ and $P_{max}$, wherein:

$E_s$ corresponds to a desired average output pulse energy of laser oscillation;

$U_s$ corresponds to a desired driving voltage for laser operation with average pulse energy $E_s$, which is preferably at or near $HV_{opt}$;

$\Delta E_s$ corresponds to a desired tolerance of average pulse energy by laser operation at driving voltage $U_s$;

Q corresponds to a factor determined based on a relationship between a desired decreasing of the average laser pulse energy and a demanded value of released pressure of the gas mixture;

$P_{min}$ corresponds to a predefined minimum allowed value of the total gas pressure in the laser tube 2; and $P_{max}$ corresponds to a predefined maximum allowed value of the total gas pressure in the laser tube 2.

At step S163, the laser is operated at a constant or substantially constant driving voltage of $U_s$ and a 100% duty cycle. The output average pulse energy E is then measured using an energy detector at step S164, wherein the measured energy is then preferably sent to the processor 16 of FIG. 25. The processor 16 may have and preferably does have other procedures available to it for controlling the average pulse energy upon measurement at step S164, such as gas replenishment, but in the present algorithm, the energy may be adjusted upon initiation by the processor 16 of a pressure adjustment.

The processor 16 determines whether the measured energy E is above the tolerance range, i.e., whether $E>E_s+\Delta E_s$ or whether the measured energy E is below the tolerance range, i.e., whether $E<E_s-\Delta E_s$. If at step S165, the processor 16 determines that the energy E is above the tolerance limit $E_s+\Delta E_s$, then at step S1166, an amount of pressure $\Delta P$ to be released is calculated by the processor 16. At step S166, an energy differential $\delta E$ is calculated as $\delta E=(E-E_s)/E$. Then, a pressure differential $\delta P$ is calculated as $\delta P=\delta E/Q$. Then, an amount of pressure release $\Delta P$ is calculated as $\Delta P=P\times\delta P=P\times(E-E_s)/(Q\times E)$, where P is the pressure in the tube prior to the pressure release $\Delta P$. Alternatively, a pressure amount $\Delta P$ may be determined in advance, such as is described above with reference to the algorithm shown at FIG. 26.

Then at step S167, a release of pressure from the laser tube 2 in the calculated amount $\Delta P$ is performed. If the pressure P in the tube 2 after the pressure release is then determined at step S168 to be greater than $P_{min}$, then the procedure returns to step S164. If the pressure P in the tube 2 after the pressure release is, however, then determined at step S169 to be less than or equal to $P_{min}$, then the pressure release option is disabled temporarily following step 169, at least until the pressure in the tube 2 is later increased to above $P_{min}$. Such an increase of the total pressure P may, e.g., occur as gas injections are performed without corresponding pressure releases being performed or as affirmative pressure additions coupled with other gas actions or according to the operations set forth at steps S170-S172.

If after the energy measurement at step S164, the processor 16 determines that the measured energy E is below the tolerance range, i.e., $E<E_s-\Delta E_s$, at step S170, an amount of pressure $\Delta P$ to be added into the laser tube 2 is calculated by the processor 16. At step S171, an energy differential $\delta E$ is calculated as $\delta E=(E-E_s)/E$. Then, a pressure differential $\delta P$ is calculated as $\delta P=\delta E/Q$. Then, an amount of pressure addition $\Delta P$ is calculated as $\Delta P=P\times\delta P=P\times(E-E_s)/(Q\times E)$, where P is the pressure in the tube prior to the pressure add $\Delta P$. Alternatively, a pressure amount $\Delta P$ may be determined in advance, such as is described above with reference to the algorithm shown at FIG. 26.

Then at step S172, an addition of pressure into the laser tube 2 in the calculated amount $\Delta P$ is performed. If the pressure P in the tube 2 after the pressure addition is then determined at step S173 to be less than $P_{max}$, then the procedure returns to step S164. If the pressure P in the tube 2 after the pressure addition is, however, then determined at step S174 to be greater than or equal to $P_{max}$, then the pressure addition option is disabled temporarily following step 174, at least until the pressure in the tube 2 is later decreased to below $P_{max}$. Such a decrease of the total pressure P may, e.g., occur or as affirmative pressure releases coupled with other gas actions or according to the operations set forth at steps S165-S167.

It is here noted that modifications of the methods described above may be made. For example, the energy of the laser beam may be continuously maintained within a tolerance range around the desired energy by adjusting the input driving voltage. The input driving voltage may then be monitored. When the input driving voltage is above or below the optimal driving voltage $HV_{opt}$ by a predetermined or calculated amount, then a total pressure addition or release, respectively, may be performed to adjust the input driving voltage a desired amount, such as closer to $HV_{opt}$, or otherwise within a tolerance range of the input driving voltage. The total pressure addition or release may be of a predetermined amount of a calculated amount, such as described above. In this case, the desired change in input driving voltage may be determined to correspond to a change in energy which would then be compensated by the calculated or predetermined amount of gas addition or release, such that similar calculation formulas may be used as those set forth above.

By incorporating pressure adjustments into an average pulse energy control algorithm according to a preferred embodiment, the range of driving voltages applied to the discharge may be advantageously reduced, such that the driving voltages applied to the discharge do not vary much from the optimal driving voltage $HV_{opt}$, even as a result of the aging of the gas mixture, and without reducing a duration between new fills. Another advantage that may be realized by itself or in combination with reducing the driving voltage variation range, is that a duration between new fills may be extended by utilizing pressure additions for increasing output energy (over operating at a lower pressure) in combination with gas replenishment techniques such as halogen injections and gas replacements as set forth below. This latter advantageous feature is described below according to a preferred embodiment.

Several driving voltage levels ($HV_i$) can be defined wherein particular gas actions are predetermined to be performed. The processor 16 monitors the driving voltage and causes the gas supply unit to perform gas injections of varying degrees, partial and mini gas replacements of varying degrees, and total pressure adjustments of various degrees or in constant amounts, depending on the value of the driving voltage, or which preset range the current operating driving voltage is in (left hand side y-axis of FIG. 23 of the Ser. No. 09/734,459 application), based on such parameters as time, pulse count and/or total input electrical energy to the discharge, etc. (see the '561 application, mentioned above) x-axis of FIG. 23 of the Ser. No. 09/734, 459 application).

An example in accord with the present invention is next described. The laser system is configured to be capable of operating at driving voltages between $HV_{min}$ and $HV_{max}$. The actual operating minimum and maximum driving voltages are set to be in a much smaller range between $HV_1$ and $HV_7$, as illustrated by the broken ordinate axis. An advantage of this preferred embodiment is that the range $HV_1$ to $HV_7$ itself may be reduced to a very small window such that the operating voltage is never varied greatly during operation of the laser. Where this operating range itself lies between $HV_{min}$ and $HV_{max}$, i.e., the actual voltage range (in Volts) corresponding to the range may be adjusted, e.g., to increase the lifetimes of the optical components of the resonator and the laser tube, e.g., such as by adjusting an output energy attenuating gas additive (see the '025 application, mentioned above) or using an extra-resonator attenuator (see U.S. patent application No. 60/178,620, which is assigned the same assignee and is hereby incorporated by reference). Also advantageously, the operating driving voltage range between $HV_1$ and $HV_7$ may be reduced so that the driving voltage varies less from $HV_{opt}$ than previous systems, while maintaining or extending the lifetime of the laser tube, optics and/or gas mixture between new fills.

The right hand side ordinate axis of FIG. 23 of the Ser. No. 09/734,459 application may be modified to show total pressures within the laser tube 2 during a lifetime of the gas mixture (between new fills), and corresponding with driving voltage levels shown on the left hand side ordinate axis. At the lowest driving voltage used in this system, i.e., $HV_1$, the pressure is preferably as low as $P_{min}$. By having a lowest tolerable pressure in the tube when, e.g., a new fill has been recently performed, the driving voltage level $HV_1$ can be higher (and closer to $HV_{opt}$) than for a system operating with a constant total pressure, while providing a same desired average pulse energy.

At the highest driving voltage used in this system, i.e., $HV_7$, the pressure in the tube 2 is preferably as high as $P_{max}$. By having a highest tolerable pressure in the tube when, e.g., the gas mixture is reaching the end of its lifetime before a new fill will be performed, the driving voltage level $HV_7$ can be lower (and closer to $HV_{opt}$) than for a system operating with a constant total pressure, while providing a same desired average pulse energy. Alternatively, the driving voltage range can be extended to provide a longer gas lifetime. Preferably, the total pressure is incremented along with the driving voltage range used as the gas mixture ages, to extend the durations of use of each driving voltage range.

The coordinate axis of FIG. 23 of the Ser. No. 09/734,459 application denotes gas actions that may be performed, based on one or more accumulated parameters, when the driving voltage is in each interval. In addition, as is evident from the increasing of the laser tube total pressure shown on the right hand side ordinate axis, pressure additions are also preferably performed as the gas mixture ages, or as the system progresses from left to right on the coordinate axis. The general order of performance of the gas actions is from left to right as the gas mixture ages. However, when each gas action is performed, the driving voltage is checked, and the next gas action that may be performed may correspond to the same driving voltage range, or a different one denoted to the left or the right of that range. For example, after a PGR is performed (when it is determined that the driving voltage is above $HV_5$), the driving voltage may be reduced to between $HV_2$ and $HV_3$, and so the system would return to ordinary μHI and $MGR_1$ gas control operations. Also, upon performance of a pressure increase, the driving voltage range may be reduced from a higher voltage to a lower voltage range, depending on the state of the system after the pressure increase.

Within the operating range between $HV_1$ and $HV_7$, several other ranges are defined. For example, when the driving voltage HV is between $HV_1$ and $HV_2$ (i.e., $HV_1$<HV<$HV_2$), and the total tube pressure is between $P_{min}$ and $P_1$, no gas actions are performed as there is a sufficient amount of halogen in the gas mixture. When the driving voltage is between $HV_2$ and $HV_3$ (i.e., $HV_2$<HV<$HV_3$), and the total tube pressure is between $P_1$ and $P_2$, $MGR_1$ and ordinary μHI are performed periodically based on the accumulated parameter(s) (i.e., input electrical energy to the discharge, time, and/or pulse count, etc.). This is the ordinary range of operation of the system in accord with the preferred embodiment.

When the driving voltage is between $HV_3$ and $HV_4$ (i.e., $HV_3$>HV>$HV_4$), and the total tube pressure is between $P_2$ and $P_3$, one or both of the injection amounts of the μHIs and the MGRs with corresponding gas releases is increased. In this example, only the μHIs are increased. Thus, the range between $HV_3$ and $HV_4$ is the range within which enhanced μHIs are performed, which are preferably halogen injections of greater amount or reduced duration than ordinary μHIs, and the same MGR amounts as in the previous range between $HV_2$ and $HV_3$ are maintained.

To be clear, enhanced μHIs may differ from ordinary μHIs in one or both of two ways. First, the amount per injection may be increased. Second, the interval between successive μHIs may be decreased.

The range between $HV_4$ and $HV_5$ (i.e., $HV_4$<HV<$HV_5$), and between total tube pressures $P_3$ and $P_4$, represents a new range within which one or both of the injection amounts of the μHIs and the MGRs with corresponding gas releases is increased (or the duration between successive actions is reduced). In this example, only the MGRs are increased as compared with the range $HV_3$ to $HV_4$. Thus, an enhanced amount of halogen gas is injected (with corresponding release of gases) during each $MGR_2$ than the ordinary amount $MGR_1$ when the driving voltage is in the range between $HV_4$ and $Hv_5$. Alternatively, or in combination with replacing the gas in larger amounts, the mini gas replacements $MGR_2$ are performed at shorter intervals than the $MGR_1$ are performed. In each of the preferred and alternative $MGR_2$ procedures, the contaminants in the discharge chamber are reduced at smaller intervals (e.g., of accumulated input energy to the discharge, pulse count and/or time, among others) compared with the $MGR_1$ procedures that are performed at the lower driving voltage range between $HV_3$ and $HV_4$. The μHIs are also preferably performed periodically in this range to recondition the gas mixture. It is noted here that several ranges wherein either or both of the amounts injected during the μHIs and MGRs is adjusted may be defined each corresponding to a defined driving voltage range. Also, as mentioned above with respect to monitoring the pressure (and optionally the temperature) in the accumulator (and optionally the laser tube), the amount injected may be adjusted for each injection.

When the driving voltage is above $HV_5$ (i.e., $HV_5<HV<HV_6$), a still greater gas replacement PGR is implemented. PGR may be used to replace up to ten percent or more of the gas mixture. Certain safeguards may be used here to prevent unwanted gas actions from occurring when, for example, the laser is being tuned. One is to allow a certain time to pass (such as several minutes) after the $HV_5$ level is crossed before the gas action is allowed to be performed, thus ensuring that the driving voltage actually increased due to gas mixture degradation. When the driving voltage goes above $HV_6$, then it is time for a new fill of the laser tube. It is noted here that the magnitudes of the driving voltages ranges shown in FIG. 23 of the Ser. No. 09/734,459 are not necessarily are not necessarily drawn to scale.

A flow sequence for performing ordinary and enhanced μHIs, MGRs and PGRs in accord with the preferred embodiment and the example just set forth above will now be described, wherein FIG. 24 of the Ser. No. 09/734,059 application illustrates this flow sequence. The procedure starts with a new fill, wherein the discharge chamber is filled with an optimal gas mixture. The laser can thereafter be in operation for industrial applications, in stand-by mode or shut off completely. A driving voltage check (HV-check) is performed after the current driving voltage (HV) is measured.

The measured driving voltage (HV) is compared with predetermined values for $HV_1$ through $HV_7$. The processor determines whether HV lies between $HV_1$ and $HV_2$ (i.e., $HV_1<HV<HV_2$) and thus path (1) is followed and no gas actions are to be performed and the procedure returns to the previous step. Although not shown, if the HV lies below $HV_1$, then a procedure may be followed to decrease the halogen concentration in the laser tube, such as by releasing some laser gas and/or injecting some buffer gas from/into the laser tube. Alternatively, if the total pressure is not at or below $P_{min}$, then a pressure release may be performed according to the algorithm set forth at either of FIGS. 26-27, described above.

If the processor determines that the HV lies between $HV_2$ and $HV_3$, then the system is within the ordinary operating driving voltage band. If it is within the ordinary operating band, then path (2) is followed whereby ordinary μHIs and $MGR_1$ may be performed based preferably on time, input electrical energy to the discharge and/or pulse count intervals as predetermined by the expert system based on operating conditions. Again each gas action may be adjusted depending on the calculated partial pressure or number of halogen molecules in the laser tube, as described above.

The μHIs and $MGR_1$ performed when path (2) is followed may be determined in accordance with any method set forth in U.S. patent application Ser. No. 09/588,561, already incorporated by reference. If HV is not within the ordinary operating band, then it is determined whether HV lies below $HV_2$ (i.e., $HV<HV_2$). If HV is below $HV_2$, then path (2) is followed and no gas actions are performed.

If HV lies between $HV_3$ and $HV_4$ (i.e., $HV_3<HV<HV_4$), then path (3) is followed and enhanced μHI and $MGR_1$ may be performed again based on the value or values of the time, pulse count and/or applied electrical energy to the discharge counter(s) being used. The precise amounts and compositions of gases that are injected and those that are released are preferably determined by the expert system and will depend on operating conditions.

If HV lies between $HV_4$ and $HV_5$ (i.e., $HV_4<HV<HV_5$), then path (4) is followed and enhanced μHI and $MGR_2$ may be performed depending on checking the values of the counters. Again, the precise amounts and compositions of gases that are injected and those that are released are preferably determined by the expert system and will depend on operating conditions.

If HV lies between $HV_5$ and $HV_6$ (i.e., $HV_5<HV<HV_6$), then PGR is performed. If HV lies above HV6 (i.e., $HV_6<HV$), then a new fill is performed.

After any of paths (2)-(5) is followed and the corresponding gas actions are performed, and preferably after a specific settling time, the method returns to the step of determining the operating mode of the laser and measuring and comparing HV again with the predetermined HV levels $HV_1$ through $HV_7$.

The setting of all of these different driving voltage and laser tube total pressure levels and time, applied electrical energy to the discharge and/or pulse count schedules can be done individually or can refer to the computer controlled data base where they are stored for different operation conditions. The operation of the laser at different HV-levels under different operation conditions such as continuous pulsing or burst mode may be taken into consideration.

Also in accord with the preferred embodiment, a partial new fill procedure may be performed. As shown in FIG. 23 of the Ser. No. 09/734,459 application, an additional HV range is established which lies above the PGR range 5 and yet below the driving voltage threshold value $HV_7$. When the processor determines that the high voltage is above $HV_6$, then either a new fill or a partial new fill will be performed depending on whether the high voltage is at or below $HV_7$ wherein a partial new fill is to be performed, or is above $HV_7$, wherein a total new fill is performed. Alternatively, if the total pressure is still below $P_{max}$, a pressure addition may be performed to extend laser operation until the total pressure reaches $P_{max}$, when total pressure additions are disabled following step S174 according to the above description.

When a total new fill is performed, substantially 100% of the gas mixture is emptied from the discharge chamber and a totally fresh gas mixture is introduced into the laser chamber. However, when a partial new fill is performed, only a fraction (5% to 70% or around 0.15 bar to 2 bar, as examples) of the total gas mixture is released. More particularly preferred amounts would be between 20% and 50% or 0.6 bar to 1.5 bar. A specifically preferred amount would be around 1 bar or around 30% of the gas mixture. Experiments have shown that implementing a partial new fill procedure wherein 1 bar is exchanged increases the gas lifetime by as much as five times over not having the procedure.

The amount that may be released is an amount up to which a substantial duration of time is used to get the gas out with a pump, and so the amount may be more than 50%, and yet may take substantially less time than a total new fill. Thus, a partial new fill procedure has the advantage that a large amount of aged gas is exchanged with fresh gas in a short amount of time, thus increasing wafer throughput when the laser is being used in lithographic applications, for example.

When the processor determines that the high voltage is above $HV_6$, a determination is made whether the high voltage is at or below $HV_7$. If the answer is yes, i.e., that the high voltage is at or below $HV_7$, then a partial new fill is initiated, whereby less than substantially 100% of the gas mixture is taken out of the discharge chamber and replaced with fresh gas. Advantageously, the system is only taken offline for a short time compared with performing a total new fill. If the answer is no, i.e., that the high voltage is above $HV_7$, then a new fill is performed. As mentioned, experiments have shown that the gas lifetime can be improved by as much as five times before the new fill range would be reached when the partial new fill procedure is implemented.

It is to be understood that a system not using all of the ranges 1-6 and the new fill/partial new fill procedures of range 6 may be advantageously implemented. For example, a system that uses only a single one of the ranges with the partial new fill and new fill may be used, and the gas lifetime improved. With some ranges removed, the partial new fill range may be moved to a lower threshold high voltage. In addition, fewer or more than the total pressure ranges shown may be used, and the pressure ranges may be used more than once over the driving voltage range from $HV_1$ to $HV_7$. For example, the entire total pressure range may be used during one range or fewer than all of the driving voltage ranges, and then the total pressure range from $P_{min}$ to $P_{max}$ may be used again at a higher driving voltage range, and so on. It is preferred that all of the ranges and corresponding gas actions be used for optimum laser system performance.

The combination of all of these different kinds of gas control and replenishment mechanisms involves harmonizing many factors and variables. Combined with the expert system and database, the processor controlled laser system of the preferred embodiment offers an extended gas lifetime before a new fill is necessary. In principle, bringing down the laser system for new fill might be totally prevented. The lifetime of the laser system would then depend on scheduled maintenance intervals determined by other laser components such as those for laser tube window or other optical components exchange. Again, as mentioned above, even the lifetimes of the laser tube and resonator components may be increased to increase the intervals between downtime periods.

During the laser operation, it is important to keep the ratio of the concentrations of the gas components of the gas mixture constant at their desired ratios as set forth above by example for the ArF, KrF and $F_2$ laser systems. The halogen injections preferably compensate not only the depleting of $F_2$ during the laser operation, but also the static degradation of the gas mixture in the laser tube 2, and in any case the degradation of the optical components, too.

If the fluorine level is not monitored and maintained at the desired level, e.g., around 0.1%, then by compensating the aging of the optics and laser tube and contaminant build-up in the laser tube 2, the gas mixture can have a larger amount of fluorine than the desired amount, while the average energy is at the desired level. If this is done, then various laser oscillation parameters can vary from their desired values during the laser operation as a result of the increased fluorine concentration, and the gas lifetime and lifetime of the laser tube can be reduced. It is therefore desired to keep the fluorine concentration constant at the desired value, and to vary the total pressure and driving voltage within its limited range according to the preferred embodiments. The halogen and the rare gas concentrations, particularly, for the ArF and KrF lasers, and the halogen concentration for the $F_2$ laser, are preferably maintained constant during the laser operation, wherein the replenished amounts of halogen and rare gas, and preferably buffer gas, in the laser tube 2 are maintained in the same ratio as just after a new fill procedure.

When pressure releases are performed, the reduction of the total gas pressure in the laser tube 2 is preferably achieved by pumping through the auxiliary volume 26 (see FIG. 25). This auxiliary volume 26 is preferably used because the amount of the released gas mixture is very small, and thus a more precise determination of the release amount is desired, compared, e.g., to pumping the laser tube 2 during a new fill or partial new fill.

Many variations are possible according to the preferred embodiments and many alternative embodiments can be understood by those skilled in the art. Micro halogen injections, as described above, may be advantageously replaced with micro replacements or constant replacements of gas mixture, i.e., a pressure release is performed is association with the halogen injection. In this case, the gas procedure may involve working with a single parameter, i.e., a rate at which the gas mixture is changed or a rate of gas flow through the laser tube 2.

This gas flow rate can have a constant value. This value can be preferably as large as possible to extend the lifetime of the gas mixture. In addition, the gas flow rate can be made to depend on the time, pulse count, input energy to the discharge, etc., such that the rate may be increased according to a progression of one or more of these parameters. The gas flow rate may also depend on the duty cycle of the laser, such that, e.g., the rate is increased at higher duty cycles.

In addition, total pressure increases during the laser operation may be performed according to the gas flow rate, such that when the gas flow rate of micro gas replacements exceeds a threshold value, then the pressure is increased. The increasing of total gas pressure in the laser tube 2 may also be made to depend on the high voltage of the laser operation. The total pressure increases can begin at the start of laser operation, e.g., after a new fill, or can be started some time, pulse count or input energy to the discharge amount after the new fill. The time, pulse count or total input energy to the discharge amount when the pressure increases are started may also depend on the duty cycle. Preferably, the total gas pressure increases themselves increase at a constant value from when they are started, and may depend again on the time, pulse count or total input energy to the discharge from the start of laser operation or the start of the pressure increases, or on the duty cycle or on the driving voltage level or range of operation of the laser system.

Methods and apparatuses are provided below, such as a narrow band excimer or molecular fluorine laser system including an oscillator and an amplifier, wherein the oscillator produces a sub-250 nm beam having a linewidth less than 1 pm and the amplifier increases the power of the beam above a predetermined amount, such as more than one or several Watts. In general, the molecular fluorine laser will be used as an example. The oscillator includes a discharge chamber filled with a laser gas including molecular fluorine and a buffer gas, electrodes within the discharge chamber connected to a discharge circuit for energizing the molecular fluorine, and a resonator including the discharge chamber and line-narrowing optics for generating the laser beam having a wavelength around 248 nm, 193 nm or 157 nm and a linewidth less than 1 pm.

The amplifier preferably comprises a discharge chamber filled with a laser gas including molecular fluorine and a buffer gas, electrodes connected to the same or a similar discharge circuit, e.g., using an electrical delay circuit, for energizing the molecular fluorine. The amplifier discharge is timed to be at or near a maximum in discharge current when the pulse from the oscillator reaches the amplifier discharge chamber.

The line-narrowing optics preferably include one or more etalons tuned for maximum transmissivity of a selected portion of the spectral distribution of the beam, and for relatively low transmissivity of outer portions of the spectral distribution of the beam. A prism beam expander is preferably provided before the etalons for expanding the beam incident on the etalon or etalons. Two etalons may be used and tuned such that only a single interference order is selected.

The line-narrowing optics may further include a grating for selecting a single interference order of the etalon or etalons corresponding to the selected portion of the spectral distribution of the beam. The resonator further preferably includes an aperture within the resonator, and particularly between the discharge chamber and the beam expander. A second aperture may be provided on the other side of the discharge chamber.

The line-narrowing optics may include no etalon. For example, the line optics may instead include only a beam expander and a diffraction grating. The beam expander preferably includes two, three or four VUV transparent prisms before the grating. The grating preferably has a highly reflective surface for serving as a resonator reflector in addition to its role of dispersing the beam.

The line-narrowing optics may include an etalon output coupler tuned for maximum reflectivity of a selected portion of the spectral distribution of the beam, and for relatively low reflectivity of outer portions of the spectral distribution of the beam. This system would also include optics such as a grating, dispersive prism or etalon, preferably following a beam expander, for selecting a single interference order of the etalon output coupler. The resonator would preferably have one or more apertures for reducing stray light and divergence within the resonator.

In any of above configurations including a grating, a highly reflective mirror may be disposed after the grating such that the grating and HR mirror form a Littman configuration. Alternatively, the grating may serve to retroreflect as well as to disperse the beam in a Littrow configuration. A transmission grating or grism may also be used.

The buffer gas preferably includes neon and/or helium for pressurizing the gas mixture sufficiently to increase the output energy for a given input energy and to increase the energy stability, gas and tube lifetime, and/or pulse duration. The laser system further preferably includes a gas supply system for transferring molecular fluorine into discharge chamber and thereby replenishing the molecular fluorine, therein, and a processor cooperating with the gas supply system to control the molecular fluorine concentration within the discharge chamber to maintain the molecular fluorine concentration within a predetermined range of optimum performance of the laser.

The laser system may also include a spectral filter between the oscillator and the amplifier for further narrowing the linewidth of the output beam of the oscillator. The spectral filter may include an etalon or etalons following a beam expander. Alternatively, the spectral filter may include a grating for dispersing and narrowing the beam. In the grating embodiment, the spectral filter may include a lens focusing the beam through a slit and onto a collimating optic prior to impinging upon the beam expander-grating combination.

A detailed discussion of the line-narrowing configurations of an oscillator element of the laser system according to the preferred embodiment is now set forth with reference to FIGS. 30a-30f. Several embodiments of an oscillator of the laser system using line-narrowing techniques for the molecular fluorine laser, are shown in FIGS. 30a-30f to meet or substantially meet the first object of the invention.

Figure 30A:
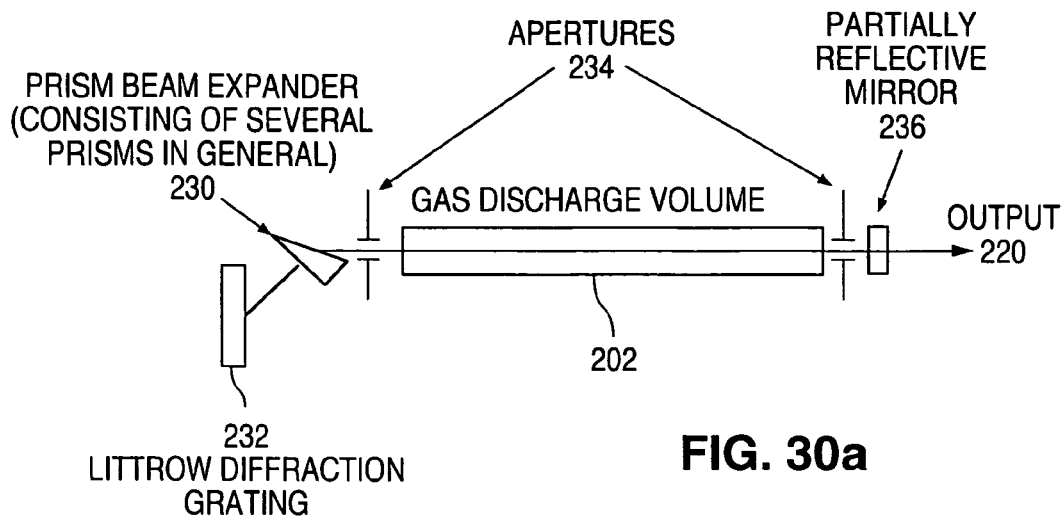
FIGS. 30a-30f schematically show several alternative embodiments in accord with a first aspect of the invention including various line narrowing resonators and techniques utilizing line-narrowed oscillators for the molecular fluorine laser.

FIG. 30a schematically shows an oscillator of a laser system according to a first embodiment including a discharge chamber 202 preferably containing molecular fluorine and a buffer gas of neon, helium or a combination thereof (see the Ser. No. 09/317,526 application), and having a pair of main discharge electrodes 203 (not shown) and a preionization arrangement (also not shown) therein. The system shown in FIG. 30a also includes a prism beam expander 230 and a diffraction grating 232 arranged in a Littrow configuration. The beam expander 230 may include one or more prisms and preferably includes several prisms. The beam expander serves to reduce divergence of the beam incident onto the grating, thus improving wavelength resolution of the wavelength selector. The grating is preferably a high blaze angle echelle grating (see the Ser. No. 09/712,367 application incorporated by reference above).

The system shown includes a pair of apertures 234 in the resonator which reject stray light and reduce broadband background, and can also serve to reduce the linewidth of the beam by lowering the acceptance angle of the resonator. Alternatively, one aperture 234 on either side of the chamber 202 may be included, or no apertures 234 may be included. Exemplary apertures 234 are set forth at U.S. Pat. No. 5,161,238, which is assigned to the same assignee and is hereby incorporated by reference (see also the Ser. No. 09/130,277 application incorporated by reference above).

The system of FIG. 30a also includes a partially reflecting output coupling mirror 236. The outcoupling mirror 236 may be replaced with a highly reflective mirror, and the beam may be otherwise output coupled such as by using a polarization reflector or other optical surface within the resonator such as a surface of a prism, window or beamsplitter (see, e.g., U.S. Pat. No. 5,150,370, incorporated by reference above).

Figure 30B:
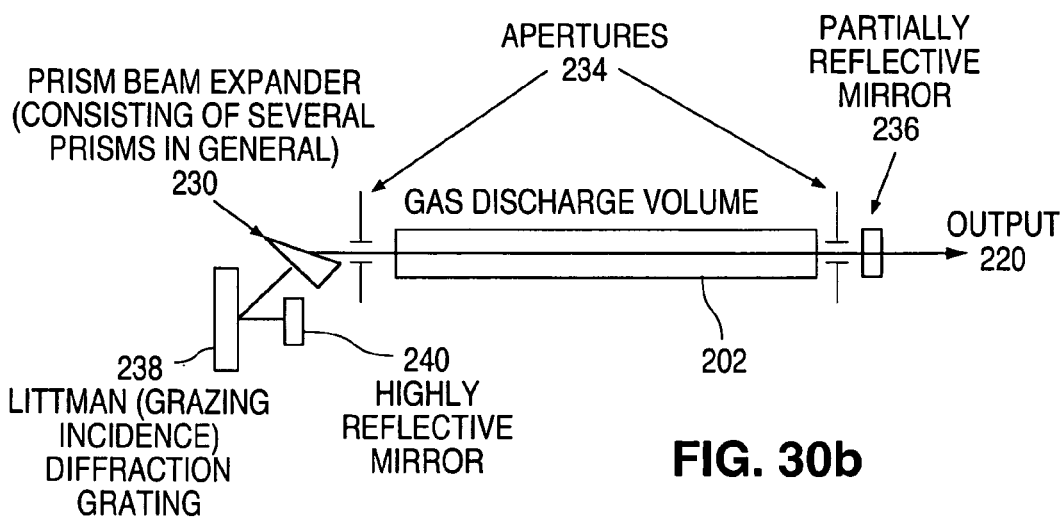

The system shown at FIG. 30b includes the chamber 202, the apertures 234, the partially reflecting output coupling mirror 236 and beam expander 230 described above with respect to FIG. 30a. The system of FIG. 30b also includes a diffraction grating 238 and a highly reflective mirror 240. The grating 238 preferably differs from the grating 232 of FIG. 30a either in its orientation with respect to the beam, or its configuration such as its blaze angle, etc., or both. The laser beam is incident onto the grating 238 at an angle closer to 90° than for the grating 232. The incidence angle is, in fact, preferably very close to 90°. This is arrangement is referred to here as the Littman configuration. The Littman configuration increases the wavelength dispersion of the grating 238. After passing through or reflecting from the diffraction grating 238, the diffracted beam is reflected by the highly reflective mirror 240. The tuning of the wavelength is preferably achieved by tilting the highly reflective mirror 240. As mentioned above with respect to the exemplary arrangement, tuning may be achieved otherwise by rotating another optic or by pressure tuning one or more optics, or otherwise as may be understood by one skilled in the art.

Figure 30C:
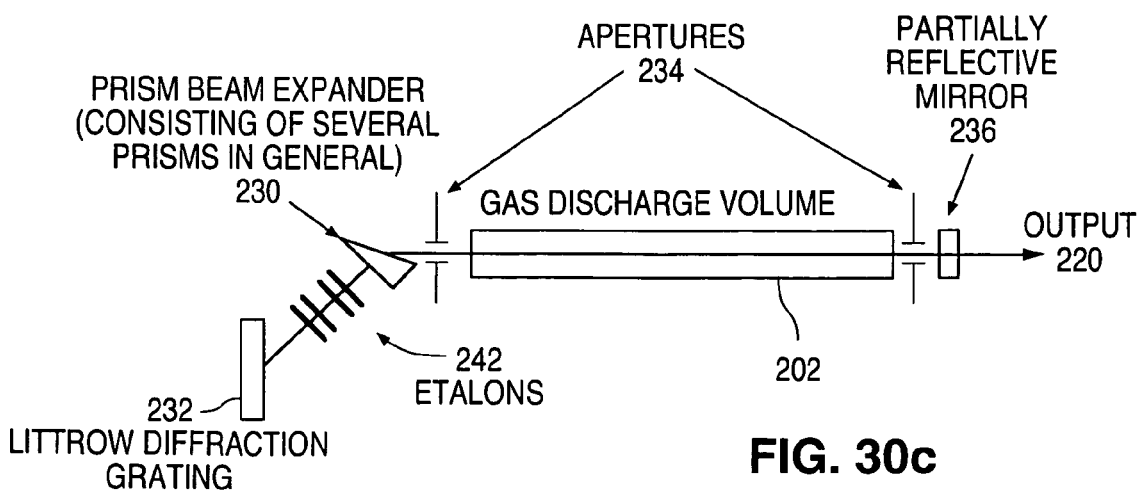

FIG. 30c schematically shows another embodiment of an oscillator having a laser chamber 102, apertures 234, outcoupler 236, beam expander 230 and Littrow diffraction grating 232, preferably as described above. In addition, the system of FIG. 30c includes one or more etalons 242, e.g., two etalons are shown, which provide high-resolution line narrowing, while the grating 232 serves to select a single interference order of the etalons 242. The etalon or etalons 242 may be placed in various positions in the resonator, i.e., other than as shown. For example, a prism or prisms of the beam expander 230 may be positioned between an etalon or etalons 242 and the grating. An etalon 242 may be used as an output coupler, as will be described in more detail below with reference to FIGS. 30e-30f. The arrangement of FIG. 30c (as well as FIG. 30d below) including an etalon or etalons 242 may be varied as described at any of U.S. patent application Ser. Nos. 09/694,246, 09/771,366, or 09/686,483, each of which is assigned to the same assignee and is hereby incorporated by reference.

Figure 30D:
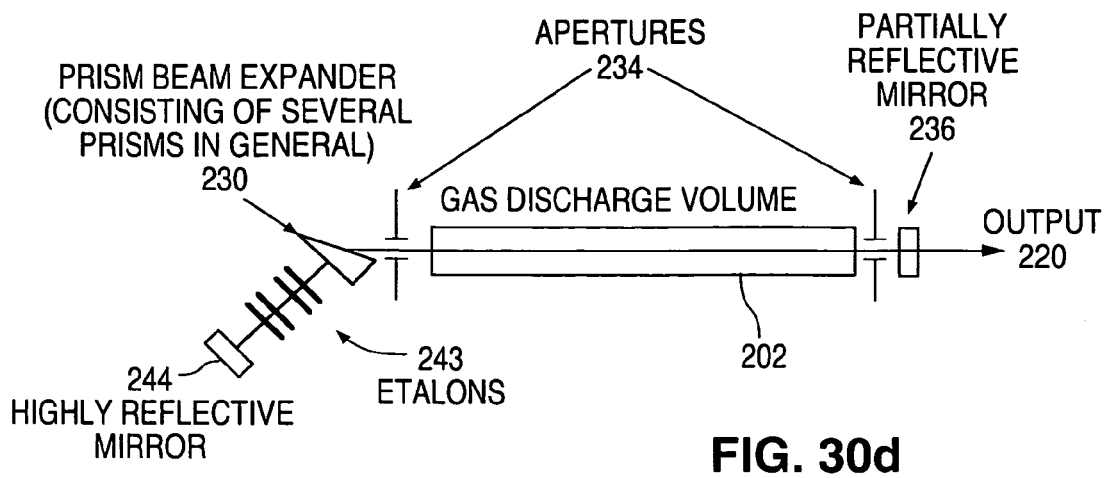

FIG. 30d shows another embodiment of the laser system having one or more etalons 243, e.g., two etalons 243 are shown. The system of FIG. 30d is the same as that of FIG. 30c except that the grating 232 is replaced with a highly reflective mirror, and the etalons 243 are differently configured owing to the omission of the grating 232 which is not available, as in the system of FIG. 30c, to select a single interference order of the etalons 243. The free spectral ranges of etalons 243 are instead adjusted in such a way that one of the etalons 243, preferably the first etalon 243 after the beam expander 230, selects a single order of the other etalon 243, e.g., the second etalon 243. The second etalon 243 of the preferred arrangement is, therefore, allowed to have a smaller free spectral range and higher wavelength resolution. Some further alternative variations of the etalons 243 of the system of FIG. 30d may be used as set forth in U.S. Pat. No. 4,856,018, which is hereby incorporated by reference.

Figure 30E:
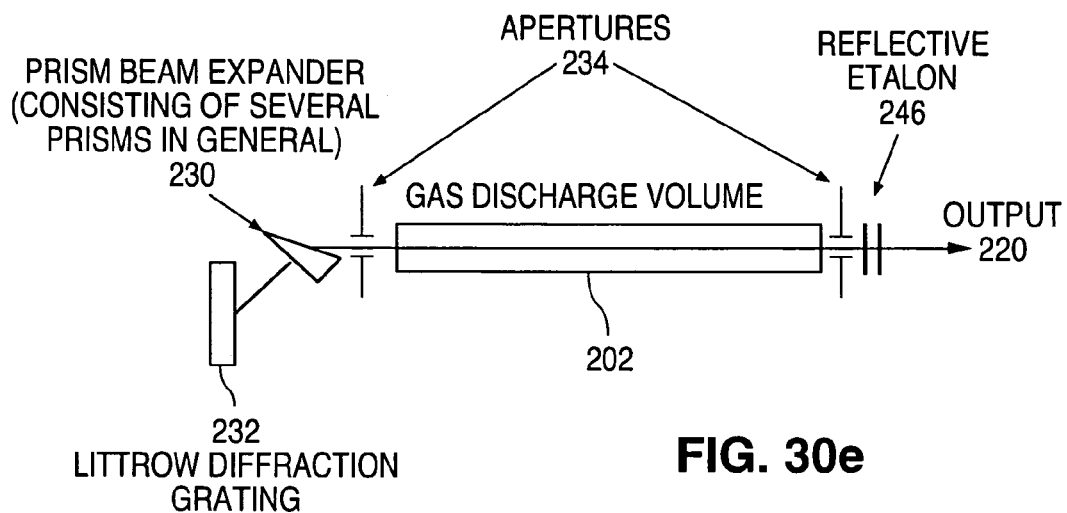
Figure 30F:
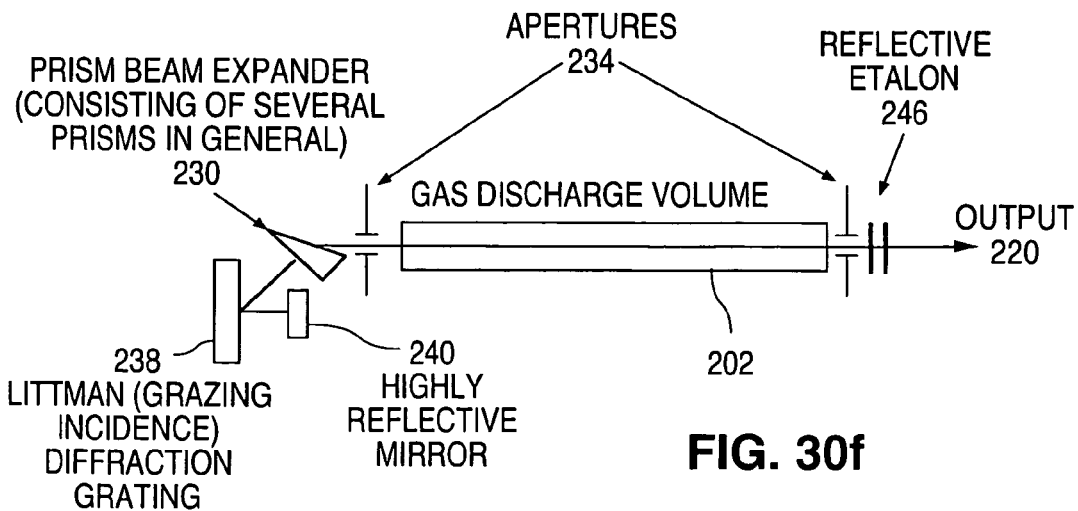

FIGS. 30e and 30f schematically show embodiments similar to the arrangements described above with reference to FIGS. 30a and 30b, respectively, which differ in that the partially reflecting outcoupler mirror 236 is replaced with a reflective etalon outcoupler 246. The etalon outcoupler 246 is used in combination with the grating 232 or 238 and beam expander 230 of FIGS. 30e and 30f, respectively, wherein the grating 232 or 238 selects a single interference order of the etalon outcoupler 246. Alternatively, one or more dispersive prisms or another etalon may be used in combination with the etalon outcoupler 246 for selecting a single interference order of the etalon 246. The grating 232 or 238 restricts wavelength range to a single interference order of the outcoupler etalon 46. Variations of the systems of FIGS. 30e and 30f that may be used in combination with the systems set forth at FIGS. 30e and/or 30f are set forth at the Ser. Nos. 09/317,527 and 09/715,803 applications, incorporated by reference above, and U.S. Pat. Nos. 6,028,879, 3,609,586, 3,471,800, 3,546,622, 5,901,163, 5,856,991, 5,440,574, and 5,479,431, and H. Lengfellner, Generation of tunable pulsed microwave radiation by nonlinear interaction of Nd:YAG laser radiation in GaP crystals, Optics Letters, Vol. 12, No. 3 (March 1987), S. Marcus, Cavity dumping and coupling modulation of an etalon-coupled $CO_2$ laser, J. Appl. Phys., Vol. 53, No. 9 (September 1982), and The physics and technology of laser resonators, eds. D. R. Hall and P. E. Jackson, at p. 244, each of which is hereby incorporated by reference.

In all of the above and below embodiments shown and described with reference to FIGS. 30a-30f, the material used for the prisms of the beam expanders 230, etalons 242, 243, 246 and laser windows is preferably one that is highly transparent at wavelengths below 200 nm, such as at the 157 nm output emission wavelength of the molecular fluorine laser. The materials are also capable of withstanding long-term exposure to ultraviolet light with minimal degradation effects. Examples of such materials are $CaF_2$, $MgF_2$, BaF, $BaF_2$, LiF, $LiF_2$, and $SrF_2$. Also, in all of the above embodiments of FIGS. 30a-30f, many optical surfaces, particularly those of the prisms, preferably have an anti-reflective coating on one or more optical surfaces, in order to minimize reflection losses and prolong their lifetime.

Also, as mentioned in the general description above, the gas composition for the $F_2$ laser in the above configurations uses either helium, neon, or a mixture of helium and neon as a buffer gas. The concentration of fluorine in the buffer gas preferably ranges from 0.003% to around 1.0%, and is preferably around 0.1%. The addition of a trace amount of xenon, and/or argon, and/or oxygen, and/or krypton and/or other gases may be used for increasing the energy stability, burst control, or output energy of the laser beam. The concentration of xenon, argon, oxygen, or krypton in the mixture may range from 0.0001% to 0.1%. Some alternative gas configurations including trace gas additives are set forth at U.S. patent application Ser. Nos. 09/513,025 and 09/317,526, each of which is assigned to the same assignee and is hereby incorporated by reference.

All of the oscillator configurations shown above at FIGS. 30a-30f may be advantageously used to produce a VUV beam 220 having a wavelength of around 157 nm and a linewidth of around 1 pm or less. Some of those configurations having an output linewidth of less than 1 pm already meet the above first object of the invention with respect to the linewidth. Those oscillators may be used with other elements, such as an amplifier, as set forth below at FIGS. 31a-34b to achieve sufficient output power for substantial throughput at a 157 nm lithography fab. Other oscillators producing linewidths above 1 pm may be advantageously used in combination with other line-narrowing elements such as a spectral filter, as set forth below at FIGS. 31a-32b, and with an amplifier as set forth in the embodiments of FIGS. 31a-32b.

Figure 31A:
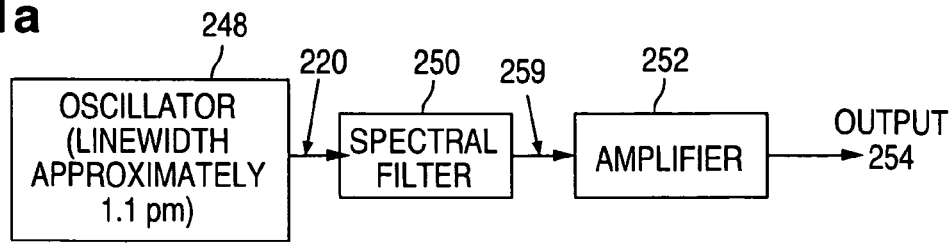
FIG. 31a schematically shows a preferred embodiment in accord with a second aspect of the invention including an oscillator, a spectral filter in various configurations, and an amplifier.

FIG. 31a schematically illustrates, in block form, a laser system in accord with a preferred embodiment, wherein a narrower linewidth is desired than is output by the oscillator 248, and higher power is desired than is output by the oscillator 248. To reduce the linewidth, the output beam 220 of the oscillator 248 is directed through a spectral filter 250. To increase the output power, the beam 220 is directed through an amplifier 252.

The system of FIG. 31a includes a line-narrowed oscillator 248, a spectral filter 250 and an amplifier 252. Various preferred configurations of the spectral filter 250 are described below with reference to FIGS. 31b-31d. The oscillator 248 of FIG. 31a is an electrical discharge molecular fluorine laser producing a spectral linewidth of approximately 1 pm, and is preferably one of the configurations described above with respect to FIGS. 30a-30f, or a variation thereof as described above, or as may be understood as being advantageous to one skilled in the art, such as may be found in one or more of the reference incorporated by reference herein. The oscillator 248 is followed by the spectral filter 250, which transmits light in a narrower spectral range, i.e., less than the linewidth of the output beam 220 from the oscillator or less than around 1 pm. Lastly, the transmitted beam is amplified in an amplifier 252 based on a separate discharge chamber to yield an output beam 254. Preferably, the oscillator and amplifier discharges are synchronized using a delay circuit and advantageous solid-state pulser circuit such as is described at U.S. patent application Ser. No. 09/858,147 and at U.S. Pat. No. 6,005,880, each of which is assigned to the same assignee and is hereby incorporated by reference.

Figure 31B:
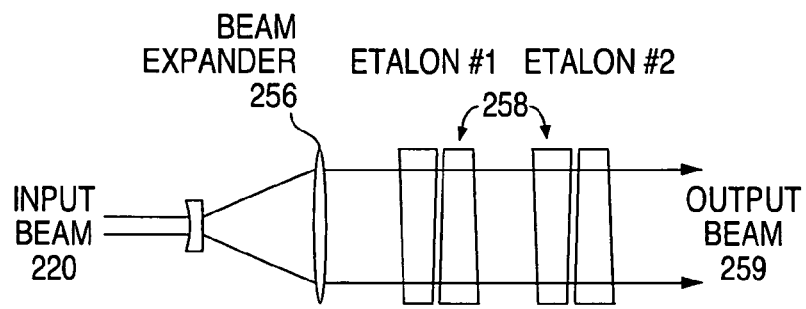
FIGS. 31b-31d schematically show alternative embodiments of spectral filters in further accord with the second aspect of the invention.
Figure 31C:
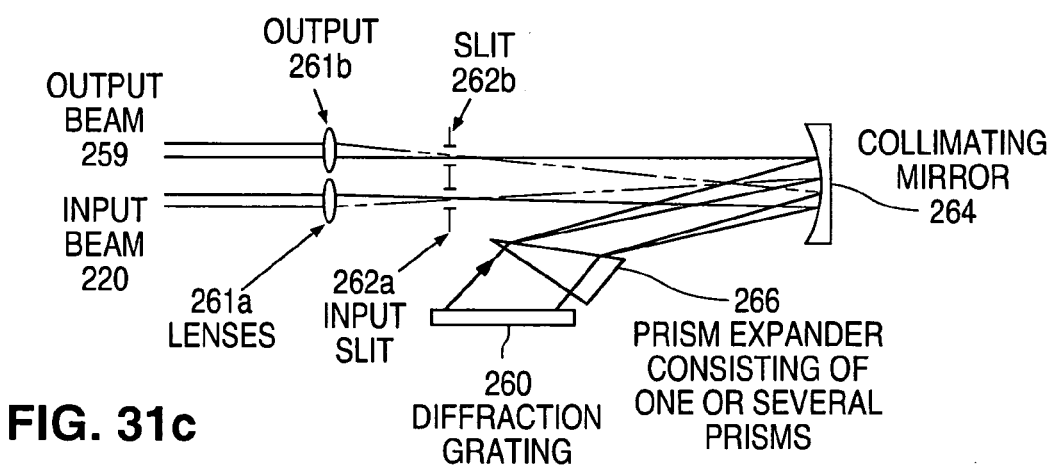
Figure 31D:
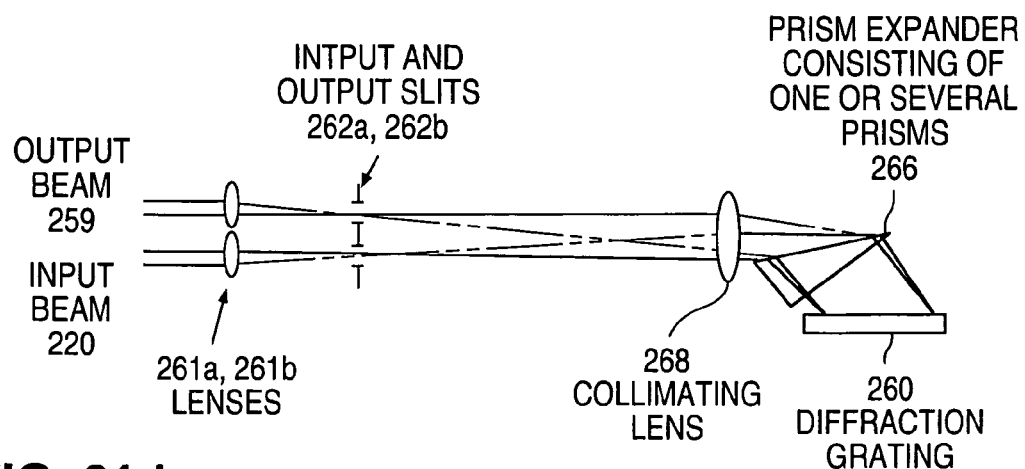

The spectral filter 250 is preferably includes one of the arrangements shown in FIGS. 31*b*-31*d*. Variations may be understood as advantageous to one skilled in the art using any of a large number of combinations of prisms, gratings, grisms, holographic beam samplers, etalons, lenses, apertures, beam expanders, collimating optics, etc., for narrowing the linewidth of the input beam 220, preferably without consuming a substantial fraction of the energy of the input beam 220.

FIG. 31*b* illustrates a first spectral filter 250 embodiment including a beam expander followed by one or more etalons 258 to yield an output beam having a linewidth substantially below the linewidth, e.g., around 1 pm, of the input beam 220. Each etalon 258 includes two partially reflecting surfaces of reflectivity R, separated by a preferably gas-filled gap of thickness D. The transmission spectrum of the etalon $T(\lambda)$ is described by a periodic function of the wavelength $\lambda$:

$$T(\lambda)=(1+(4F^2/\pi^2)\sin(2\pi nD\cos(\Theta)/\lambda))^{-1} \quad (1)$$

where n is the refractive index of the material, preferably an inert gas, filling the etalon 258, $\Theta$ is the tilt angle of the etalon 258 with respect to the beam, and F is the finesse of the etalon 258 which is defined as:

$$F=\pi R^{1/2}/(1-R) \quad (2)$$

The reflectivity R and spacing of the etalon D can be selected in such a way that only a single transmission maximum overlaps with the emission spectrum of the broader-band oscillator 248. For instance, if the finesse of the etalon 258 is selected to be 10, then the spectral width of the transmission maximum is roughly 1/10 of the free spectral range (FSR) of the etalon 258. Therefore, selecting a free spectral range of 1 pm will produce a transmitted beam with spectral linewidth of 0.1 pm, without sidebands since the linewidth of the oscillator (248) output (approximately 1 pm) is significantly less than two times the FSR.

Using multiple etalons 258 allows a higher contrast ratio, which is defined as a ratio of the maximum transmission to the transmission of the wavelength halfway between the maxima. This contrast ratio for a single etalon is approximately equal to $(1+4F^2/\pi^2)$. Higher finesse values lead to higher contrast. For several etalons 258, the total contrast ratio will be $(1+4F^2/\pi^2)^n$ where n is the number of etalons 258 used. Additionally, the spectral width of the transmission maxima will be reduced with increased number of etalons 258 used. Disadvantages of using several etalons 258 include high cost and complexity of the apparatus and increased optical losses.

The beam expander 256 shown at FIG. 31*b* serves to reduce the divergence of the beam incident onto the etalons 258. From the formula (1), it follows that a change in the beam incidence angle $\Theta$ causes a shift of the wavelength at which maximum transmission occurs. Assuming an FSR of 1 pm, the etalon spacing is D=1.2 cm. If the transmission interference spectrum of the etalon 258 is at its maximum at normal incidence ($\Theta=0$), then the angle $\Theta$, at which the transmission spectrum reaches maximum again is $\Theta\sim(\lambda/nD)^{1/2}$=3.6 mrad. Therefore, it is preferred that the spectral filter 250 shown at FIG. 31*b* be configured such that the divergence of the beam is below $\Theta$, and preferably by a factor comparable to the finesse F of the etalon 258. Since the divergence of a typical molecular fluorine laser is several millirads, the advantage of using the beam expander 256 to reduce this divergence from typically above $\Theta$ as it is output from the oscillator 248 to below $\Theta$, is may be understood. It is also preferred to use one or more apertures 234 in the oscillator 248 to reduce its output divergence (see the Ser. No. 09/130,277 application, mentioned above).

The gaps between the plates of the etalons 258 are preferably filled with an inert gas. Tuning of the transmitted wavelength can be accomplished by changing the pressure of the gas as described in the Ser. No. 09/317,527 application, mentioned above. In addition to pressure tuning and rotation tuning of the etalon's output transmission spectrum, the etalons 258 may be piezoelectrically tuned such as to geometrically alter the gap spacing.

FIG. 31*c* schematically illustrates a second embodiment of the spectral filter 250 of FIG. 31*a* generally utilizing a diffraction grating 260. Although there are other ways to configure the spectral filter 250 according to the second embodiment using a grating 260, an example is shown at FIG. 31*c* and described here. The spectral filter 250 shown at FIG. 31*c* is a Czerny-Turner type spectrometer, modified to achieve high resolution. The input beam 220 in focused by a lens 261*a* through an input slit 262*a* after which the beam is incident on a collimating mirror 264. After reflection from the mirror 264, the beam is incident on a beam expander 266 and then onto the grating 260. The beam is dispersed and reflected from the grating 260, after which the beam retraverses the beam expander 266, and is reflected from the collimating mirror 264 through an output slit 262*b* at or near the focal point of a lens 262*b*. The output beam 259 then has a linewidth substantially less than the linewidth, e.g., around 1 pm, of the input beam 220, or substantially less than 1 pm.

The diffraction grating 260 is preferably a high blaze echelle grating 260. The wavelength dispersion of this preferred grating 260 is described by the following formula:

$$d\lambda/d\Theta=(2/\lambda)\tan\Theta \quad (3)$$

where $\Theta$ is the incidence angle. The spectral width $\Delta\lambda$ of the transmitted beam is determined by the dispersion $d\lambda/d\Theta$ of the grating 260, the magnification factor M of the prism expander 266, the focal length L of the collimating mirror 264 and the width d of the slits 262*a*, 262*b* of the spectrometer:

$$\Delta\lambda=d(L\,M\,d\lambda/d\Theta)^{-1} \quad (4)$$

For example, using an echelle grating 260 wherein the incidence angle $\Theta$ is 78.6°, L=2 m and M=8, the slit width d which would achieve 0.1 pm resolution for the spectral filter 250 of FIG. 31*c* is around d=0.1 mm. It is preferred, therefore, to reduce the divergence of the oscillator 248 in order to increase the transmission of the beam 220 through the input slit 261*a*. This can be advantageously achieved by using apertures inside the resonator of the oscillator 248 (see again the Ser. No. 09/130,277 application, mentioned above).

The third example of a spectral filter 250 that may be used in illustrated at FIG. 31*d*. The spectral filter 250 of FIG. 31*d* differs from that shown at FIG. 31*c* in that a collimating lens 268 is used in the embodiment of FIG. 31*d*, rather than a collimating mirror 264, as is used in the embodiment of FIG.

31c. An advantage of the embodiment of FIG. 31d is its simplicity and the absence of astigmatism introduced by the mirror 264 of FIG. 31c at non-zero incidence angle.

It is useful to reiterate here that synchronization of the electrical discharge pulses in the chambers 202 of the oscillator 248 and amplifier 252 is preferred in order to ensure that the line-narrowed optical pulse from the oscillator 248 arrives at the chamber 202 of the amplifier 252 at the instance when the gain of the amplifier 252 is at or near its maximum. Additionally, this preferred synchronization timing should be reproducible from pulse to pulse to provide high energy stability of the output pulses. The preferred embodiment electronic circuitry allowing this precise timing control is described at U.S. Pat. No. 6,005,880 and U.S. patent application Ser. No. 09/858,147, as mentioned above.

FIG. 32a shows the use of a single discharge chamber 270 that provides the gain medium for both an oscillator and an amplifier. The setup of FIG. 32a includes the discharge chamber 270 within a resonator including a highly reflective mirror 272 and a partially reflecting outcoupling mirror 274. A pair of apertures 234 are also included, as described above, to match the divergence of the resonator of this oscillator 248. A small portion of the cross-section of the discharge volume is used to produce an un-narrowed beam 276 with this oscillator configuration. It is also possible to include one or more line-narrowing components with this oscillator configuration, or to otherwise modify the oscillator according to the description set forth above with respect to FIGS. 30a-30f.

Similar to the embodiment shown and described with respect to FIG. 31a, this un-narrowed output is then directed through a spectral filter 250, which is preferably one of the embodiments described in FIGS. 31b-31d. Given the significant time (e.g., several nanoseconds) that it takes for the beam to traverse the spectral filter 250, it is preferred to adjust the arrival time of the filtered pulse to a second maximum of the discharge current. To achieve this temporal adjustment, an optical delay line is preferably inserted after the spectral filter 250. The delay line may be one of those described at U.S. patent application Ser. No. 09/550,558, which is assigned to the same assignee and is hereby incorporated by reference.

FIGS. 32b(i)-(iii) illustrate the electrical current through the discharge gap, the intensity of the un-narrowed beam 276 and the output 259 of the oscillator-amplifier system, each as a function of time. The current exhibits several cycles of oscillations, as shown in FIG. 32b(i). The optical pulse shown at FIG. 32b(ii) evolves towards the end of the first maximum (a) of current. The second maximum of electrical current is separated from the first one by approximately 20 nanoseconds, thus providing sufficient time for the beam 276 to traverse the spectral filter 250 and additional optical delay line 278. This discussion with respect to the timing of the successive maxima in the electrical discharge current reveals how the additional optical delay line 278 may be advantageously used to precisely tune the arrival time of the pulse at the chamber 270 (amplifier). The line-narrowed beam from the spectral filter 250, whose temporal pulse shape is shown at FIG. 32b(iii), thus overlaps the second maximum b of the electrical current shown at FIG. 32b(i) of the amplifier and is amplified, and thus a line-narrowed beam 259, i.e., substantially less than 1 pm, is output with sufficient power.

Figure 33B:
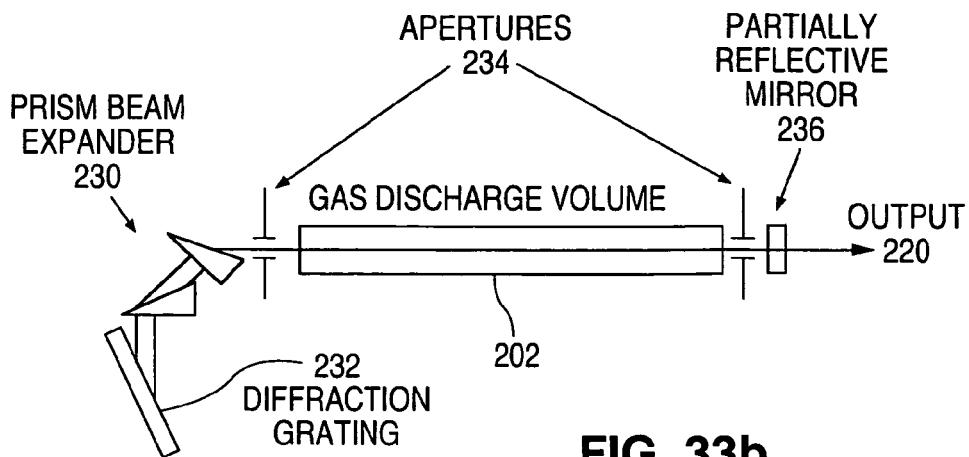
FIGS. 33b-33f schematically show alternative embodiments of line-narrowed oscillators in further accord with the third aspect of the invention.

FIG. 33a shows the use of a line-narrowed oscillator followed by a power amplifier made in a separate discharge chamber. Any of the embodiments shown and described above including those discussed with respect to the exemplary embodiments, the patents and publications incorporated by reference, and the embodiments described with respect to FIGS. 30a-30f can be used to narrow the bandwidth of the oscillator. Examples of the preferred line-narrowed oscillator 248 are set forth at FIGS. 33b-33f.

The line-narrowed oscillator 248 schematically shown at FIG. 33(b) uses a prism beam expander 320 and grating 232, preferably as described in one or the U.S. Pat. No. 5,559,816, 298 22 090.3 DE, U.S. Pat. Nos. 4,985,898: 5,150,370, and 5,852,627 patents, each being incorporated by reference above. Alternatively, the Littman configuration may be used (see discussion above with respect to FIG. 30b). As discussed above with respect to the embodiments of FIGS. 30a-32a, the additional apertures 234 in the resonator reduce divergence of the beam and, therefore, advantageously increase the resolution of the wavelength selector (again, see the Ser. No. 09/130,277 application for details).

Figure 33C:
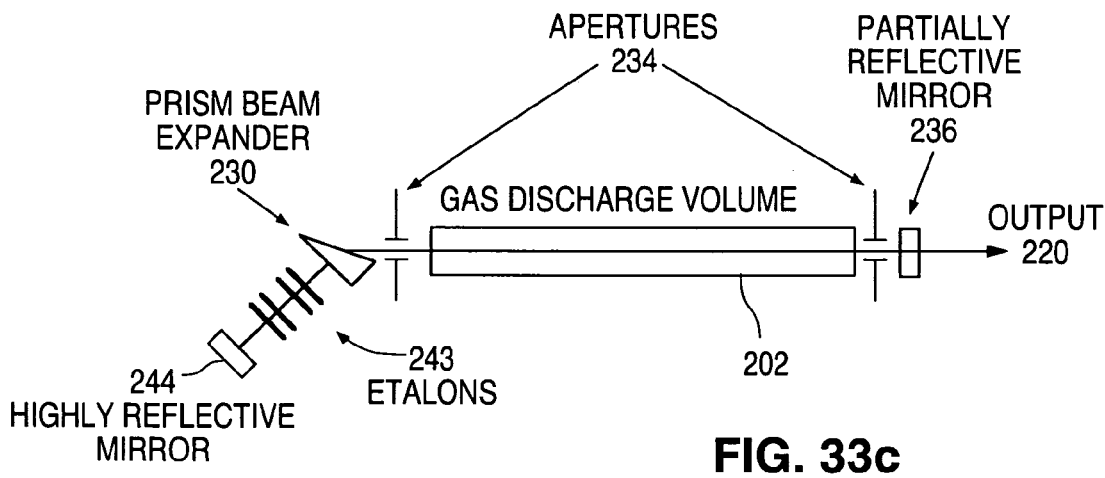

The embodiment shown in FIG. 33c utilizes multiple etalons 243 as wavelength selective elements (see FIG. 30d). The prism beam expander 230 in combination with the apertures 234 helps to reduce the divergence of the beam in the etalons 243 thus improving resolution of the wavelength selector. Additionally, this reduces the intensity of the beam at a particular area of the surfaces of the etalons 243, thus extending their lifetime.

Figure 33D:
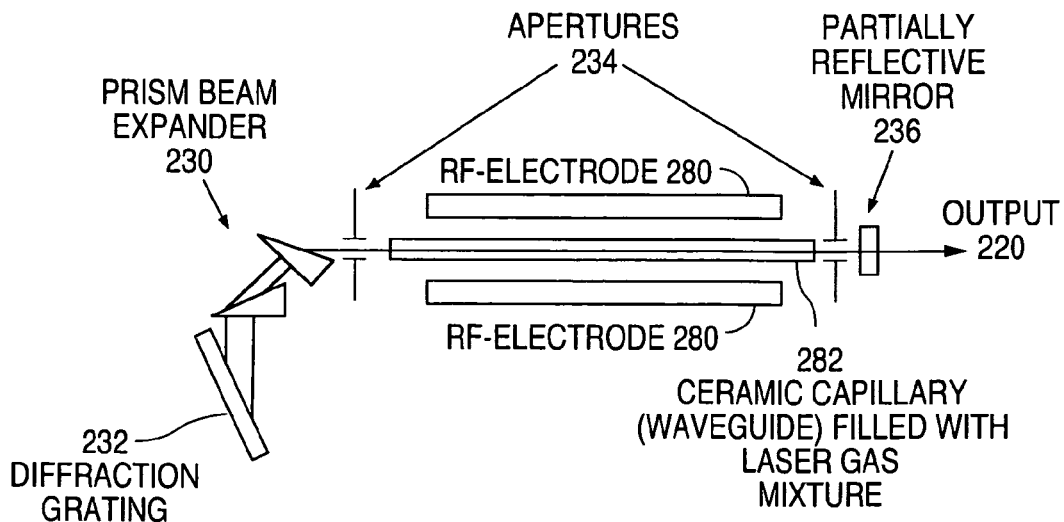
Figure 33E:
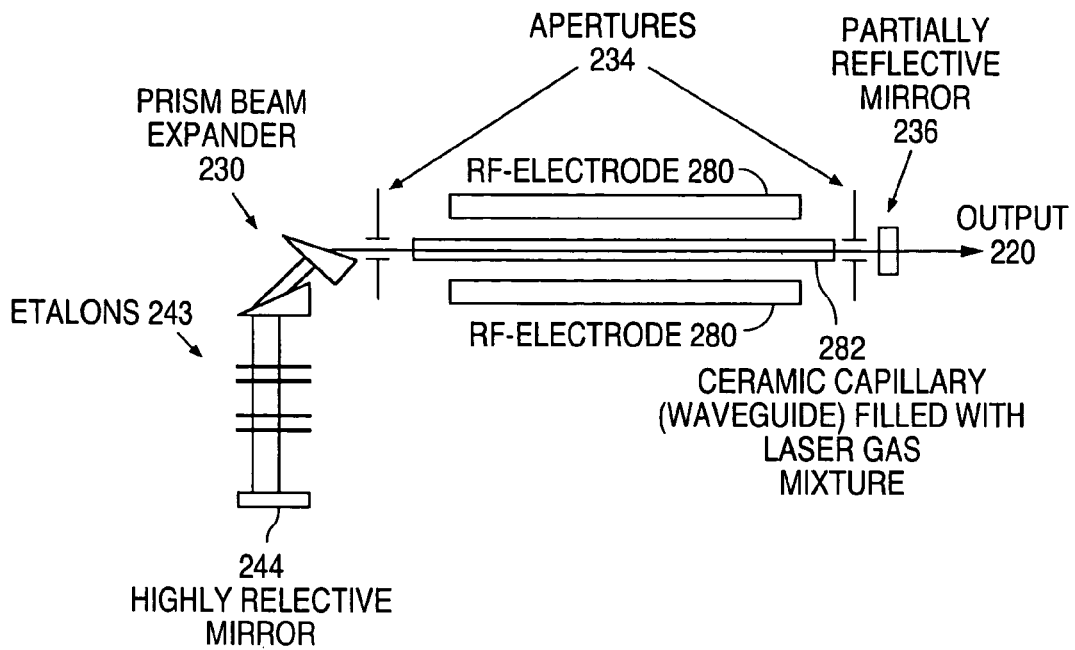

FIGS. 33d-33e show alternative arrangements that each include an RF or microwave excited waveguide laser as an oscillator. The arrangement of FIG. 33d preferably includes a pair of RF-electrodes 280 and a waveguide 282 preferably including a ceramic capillary filled with a laser active gas mixture. Any of the resonator configurations shown in FIGS. 30a-33c may be used in this embodiment, wherein the discharge chamber 202 is replaced with the RF-excited waveguide arrangement shown in FIG. 33d. Features of the waveguide laser that may be used in the arrangement of FIGS. 33d-33e may be found at C. P. Christenson, Compact Self-Contained ArF Laser, Performing Organization Report Number AFOSR IR 95-0370; T. Ishihara and S. C. Lin, Theoretical Modeling of Microwave-Pumped High-Pressure Gas Lasers, Appl. Phys. B 48, 315-326 (1989); and Ohmi, Tadahiro and Tanaka, Nobuyoshi, Excimer Laser Oscillation Apparatus and Method, Excimer Laser Exposure Apparatus, and Laser Tube, European Patent Application EP 0 820 132 A2, each of which is hereby incorporated by reference. RF-excited lasers are commonly operated with a carbon dioxide gas medium, e.g., as discussed in Kurt Bondelie "Sealed carbon dioxide lasers achieve new power levels", Laser Focus World, August 1996, pages 95-100, which is hereby incorporated by reference.

The specific arrangement shown in FIG. 33d includes a prism beam expander 230 and a grating 232 in Littrow configuration. A Littman configuration may be used here (see FIGS. 30b and 30f) including the grating 238 and HR mirror 240. A pair of apertures 234 are again included, particularly for matching the divergence of the resonator. A partially reflecting mirror 236 outcouples the beam 220. An etalon outcoupler 246 may be used instead of the mirror 236 (see FIGS. 30e-30f)

The arrangement schematically shown at FIG. 33e is the same as that of FIG. 33d, except that the grating is replaced with a one or more etalons 243 and an HR mirror 244. A grating 232 or 238 may be used along with the etalons 243, and an etalon outcoupler 246 may be used instead of the partially reflecting mirror 236.

An advantage of this RF-excited waveguide type of laser is its long pulse, which allows more efficient line narrowing, since the linewidth is approximately inversely proportional to the number of round trips of the beam in the resonator. Additionally, the RF-excited waveguide laser has a small discharge width (on the order of 0.5 mm) which allows high angular resolution of the wavelength selector based on the prisms of the beam expander 230 and the diffraction grating 232. This holds for both of the embodiments shown at FIGS. 33d-33e.

Figure 33F:
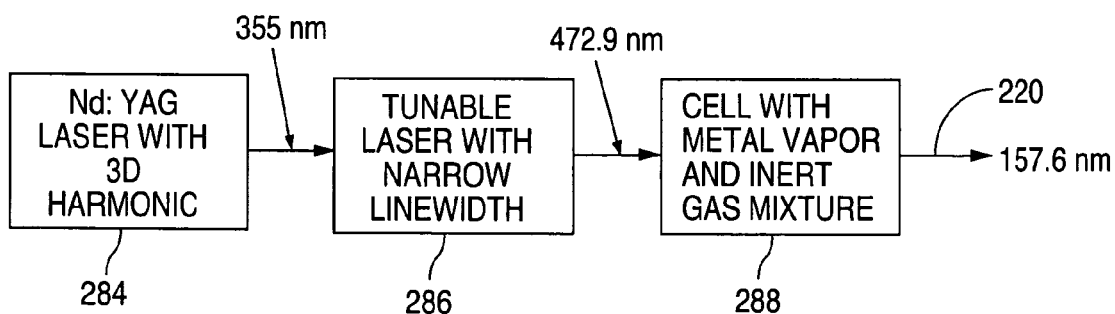

FIG. 33f schematically shows another source of a narrow linewidth beam that may be used in accordance with the present invention to serve as the oscillator 248 in the embodiment of FIG. 33a. The arrangement of FIG. 33f includes a solid state laser 285 with a third harmonic output at 355 nm, such as diode pumped, Nd:YAG laser or other such type laser as may be described, e.g., at U.S. Pat. No. 6,002,697, which is assigned to the same assignee and is hereby incorporated by reference, or as may be otherwise known to one skilled in the art. The solid state laser 285, in turn, pumps a narrow linewidth tunable laser 286, such as a dye laser or optical parametric oscillator, emitting, e.g., around 472.9 mm. This 472.9 nm radiation is focused into a gas cell 88 containing a mixture of halide metal and inert gas, in order to produce a third harmonic beam at 157.6 nm. Such third harmonic generation in gases has been described at: Kung A. H., Young J. F., Bjorklung G. C., Harris S. E., Physical Review Letters, v.29, Page 985 (1972); and Kung A. H., Young J. F., Harris S. E, Applied Physics Letters, v.22 page 301 (1973), each of which is hereby incorporated by reference.

Figure 34A:
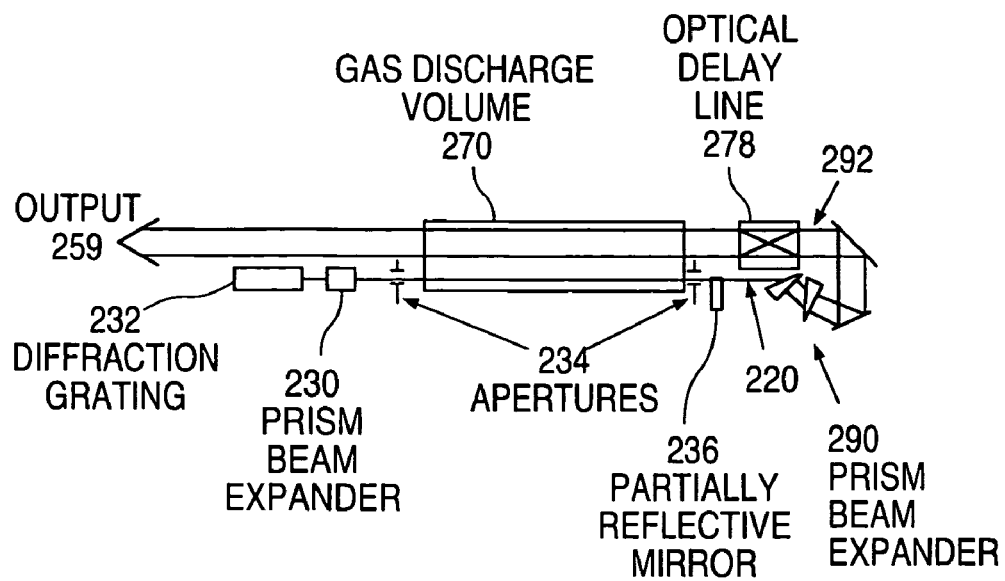
FIGS. 34a-34b schematically show alternative embodiments in accord with a fourth aspect of the invention including a single discharge chamber providing the gain medium for both an oscillator with line-narrowing and an amplifier.
Figure 34B:
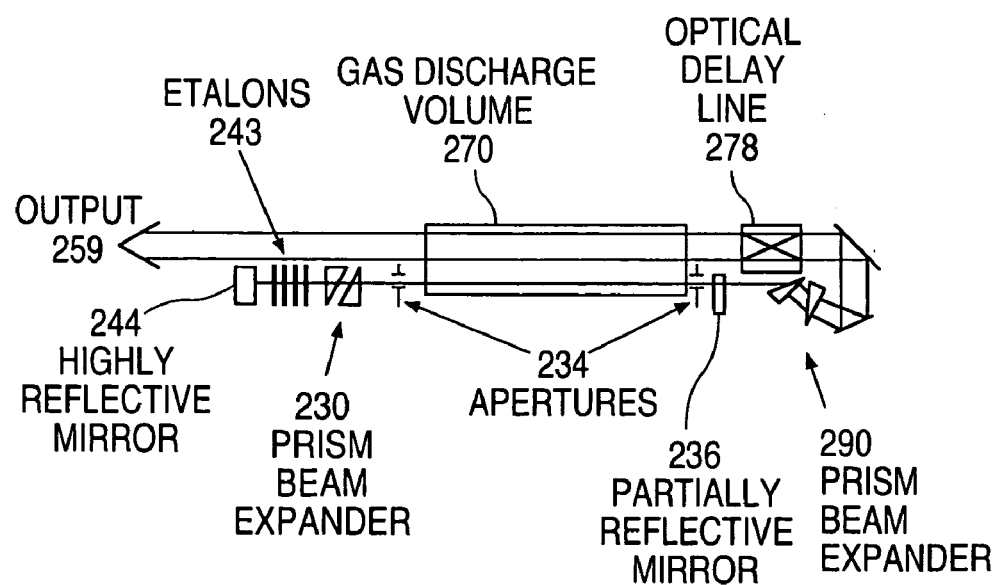

FIGS. 34a and 34b schematically illustrate further embodiments wherein a portion of the discharge volume of a discharge chamber 202 is used as an oscillator with line narrowing, and the same discharge chamber 202 is used as an amplifier 252. The arrangement of FIG. 34a is similar to that shown at FIG. 32a except that the linewidth of the beam 230 is narrowed within the resonator of the oscillator, and no spectral filter 250 is preferably used. A spectral filter 250 may alternatively be used in addition to the line-narrowing optics of the oscillator of FIG. 34a. Again, the line-narrowing arrangement of the oscillator may be modified as set forth in any of the descriptions above (see particularly FIGS. 30a-30f, 33c and 33f), or as set forth in any of the patents, patent applications or publications incorporated by reference in this application, or as otherwise understood by one skilled in the art, to produce a narrow output beam 220. The output beam 220 from the oscillator is expanded by an external beam expander 290, preferably comprising one or more prisms and alternatively comprising a lens arrangement.

The expanded beam 292 is then directed through a delay line 278 (see the '558 application) to synchronize the pulse with the amplification maxima of the chamber 270, as described above. The optical delay line 278 serves to fine tune the arrival time of the optical pulse to the amplifier section, similar to the embodiment shown and described with respect to FIGS. 32a-32b(iii). The expanded beam 220 then advantageously fills a substantial portion of the rest of the discharge cross section, and is amplified.

In the above embodiments, it is preferred to adjust the gas mixture in the discharge chamber 202, 270 of the oscillator, to obtain the longest possible pulse. Additionally, the waveform of the discharge current can be modified by deliberately introducing an impedance mismatch of the pulse forming circuitry and discharge gap. The impedance mismatch leads to a longer discharge time and thus, to a longer optical pulse. The lower gain resulting from such modification means lower efficiency of the oscillator. However, in the embodiments discussed above, the amount of reduction in the output power of the oscillator is regained at the amplification stage.

An excimer or $F_2$ laser in accord with a preferred embodiment includes a laser tube filled with a laser gas mixture and having a plurality of electrodes connected with a power supply circuit for energizing the gas mixture. A laser resonator including the tube for generating a sub-250 nm laser beam includes a line selection unit for selecting one of multiple closely-spaced characteristic emission lines around 157 nm, 193 nm or 248 nm.

In a first aspect, line selection is provided by a transmission diffraction grating. The preferred grating is made of $CaF_2$ and also serves to outcouple the laser beam. The transmission grating in accord with the first aspect advantageously permits a straight, shortened and more efficient laser resonator.

In a second aspect, line selection is provided for a laser by a grism. The preferred grism also serves either to outcouple the beam or as a highly reflective resonator reflector. The grism in accord with the second aspect advantageously provides enhanced dispersion and efficiency.

Also in accord with this aspect, an excimer or molecular fluorine laser includes a laser output coupler including a grism, which is a combination of a prism and a grating. Such a combination of prism and grating within one element advantageously improves the resolving power of a single dispersive element and reduces the internal resonator losses by a minimum of optical interfaces.

The grism used directly as an output coupler for an excimer or molecular fluorine laser advantageously combines four different tasks in one element: partial reflection (or output coupling) for the resonator, dispersion and line narrowing or line selection, suppression of background radiation, such as amplified spontaneous emission (ASE) radiation (or a parasitic second line), and pointing stabilization of the selected line (wavelength). The grating-prism (or grism) may be designed in such a manner that it realizes a straight beam path for the selected wavelength which is used as the output beam for use with an application process, operating like a common mirror if the blaze angle of the grating is equal to the prism angle for the selected wavelength. Thus, the laser resonator can be very short even if it is containing a line selecting or line narrowing element having the direction of beam propagation in a straight line.

In a third aspect, line selection for a laser is fully performed at the front optics module of the laser resonator resulting in a more efficient resonator.

In a fourth aspect, a monitor grating and an array detector are provided for monitoring and controlling the intensity of the selected (and/or unselected) lines and for monitoring the stability of the selected wavelength. The quality of the line selection may be advantageously monitored.

In a fifth aspect, a laser system includes an energy detector provided in an enclosure purged with an inert gas at a slight, regulated overpressure. Advantages include reduced turbulence typically associated with high gas flow and a reduced rate of deposition of contaminants on optical surfaces. The fifth aspect may be advantageously combined with the fourth aspect.

In a sixth aspect, a blue or green reference beam (e.g., having a wavelength between 400 nm and 600 nm) is used for laser beam, particularly F2 laser) wavelength calibration and/or alignment stabilization. The blue or green reference beam advantageously is not reflected out with the red emission of the laser and is easily resolved from the red emission.

In a seventh aspect, the clearing ratio of the laser gas flow through the discharge area of a laser is improved. The reduced clearing time is provided by narrowing the discharge width using improved laser electrodes and/or by increasing the gas flow rate through the discharge while maintaining uniformity by using a more aerodynamic discharge chamber. Laser operation at higher repetition rates is advantageously permitted by the reduced clearing ratio in accord with the seventh aspect.

In an eighth aspect, an excimer or molecular fluorine laser is provided with a substantially polarized output beam. The polarization is provided by a thin film polarizer, a double reflection prism and/or Brewster windows. The polarization provided by the eighth aspect is advantageously 98% or better.

With respect to all of the above eight aspects, U.S. patent application Ser. Nos. 09/738,849 and 10/116,903 are hereby incorporated by reference as setting forth particularly preferred embodiments in accordance with those aspects.

Figure 35:
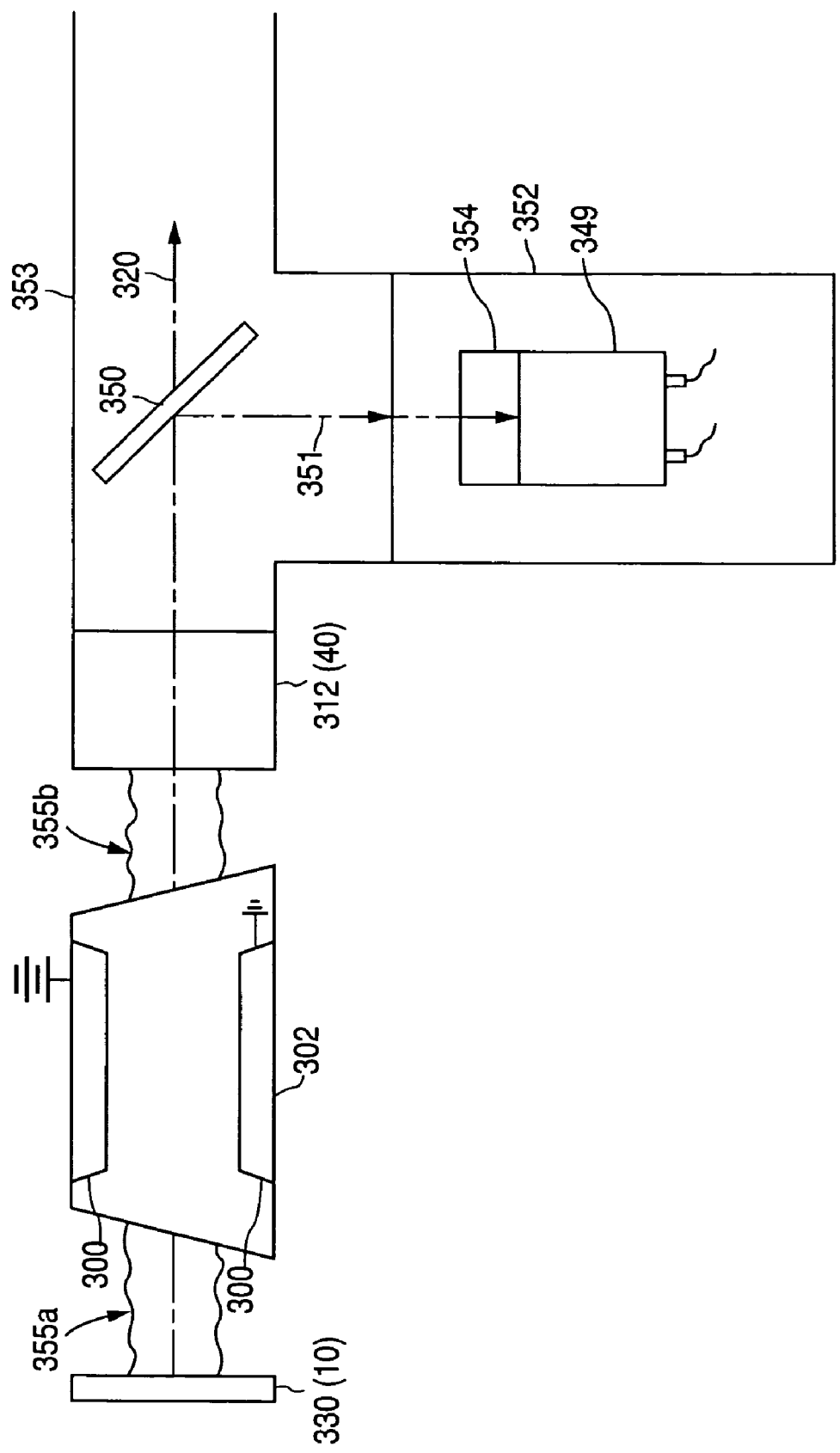
FIG. 35 shows an energy detector for use with a $F_2$ laser system in accord with the fifth aspect of the invention.

FIG. 35 shows an energy detector 349 for use with an excimer or molecular fluorine laser system in accord with a seventh embodiment and the fifth aspect above. A beam splitter 350 redirects a beam portion 351 towards the energy detector 349, allowing the main beam 320 to pass through. The detector 349 may be a diode or photomultiplier detector, and may be a diamond detector such as that set forth in U.S. patent application Ser. Nos. 09/512,417, which are assigned to the same assignee as the present application and hereby incorporated by reference. The detector 349 is preferably particularly designed to be sensitive at 157 nm. Optics for filtering the red emission of the laser may be included such as a dispersive element, holographic beam splitter, dichroic mirror(s), or red light filter before the detector, or otherwise as set forth at U.S. patent application Ser. Nos. 09/598,552 and 09/712,877, assigned to the same assignee and hereby incorporated by reference.

The detector 349 is advantageously enclosed in a sealed enclosure 352. The sealed enclosure 352 is preferably sealably connected with a beam path enclosure 353 that encloses the path of the outcoupled main beam 320 and that is itself sealably connected to the laser resonator such that the beam 320 is never exposed to and absorbed by oxygen and water in ambient air (see U.S. patent application Ser. No. 09/343,333, which is assigned to the same assignee as the present application and is hereby incorporated by reference). The entire resonator itself is also kept free of the photoabsorbing species such as by using a pair of smaller enclosures 355a and 355b between the laser tube 302 and the rear and front optics modules 330 and 340, respectively.

Photoabsorbing species such as oxygen, hydrocarbons and water are removed from the enclosure 352, such as by pumping them out with a high vacuum pump, such as a turbo pump, or by pumping for a long time with a rotary or mechanical (roughing) pump. The pumping can be continued until high vacuum is reached. However, preferably only a roughing pump (not shown) is used and a series of pumping steps each followed by purging with inert gas are performed more quickly and with better results, such as is described in the '333 application relating to the beam path enclosure 353.

After the contaminants are removed, a low flow of inert gas such as argon or helium continuously purges the sealed enclosure while the laser is operating. The enclosure 352 and the enclosure 353 may be open to one another such that the same purging gas fills both enclosures 352 and 353, or the enclosures 352 and 353 may be separately maintained. The flow rate of the purging inert gas is selected such that only a slight overpressure is maintained in the enclosure 352. For example, 1-10 mbar overpressure is preferred, and up to 200 mbar overpressure could be used. The flow rate may be up to 200 liters/hour, and is preferably between ten and fifty liters/hour. The flow rate and pressure in the enclosure are precisely maintained using a pressure regulator, flow-control valves and a pressure gauge.

Advantageously, the slight overpressure, precisely maintained, of the low flow purge in accord with the fifth aspect may prevent the strain on optical surfaces that a high flow, high pressure purge or a vacuum would produce. Fluctuations of the refractive index with pressure in the enclosure may also be reduced in accord with this fifth aspect. Moreover, turbulences typically observed with high flow purges are avoided, and the rate of contamination deposition on optical surfaces is reduced according to this fifth aspect.

An attenuator 354 is preferably positioned before the detector 349 to control the intensity of the incoming light at the sensitive detector 349. The attenuator preferably includes a mesh filter. The attenuator 354 may include a coating on the detector 349 such as is set forth at U.S. patent application Ser. No. 09/172,805, which is assigned to the same assignee as the present application and is hereby incorporated by reference.

Figure 36A:
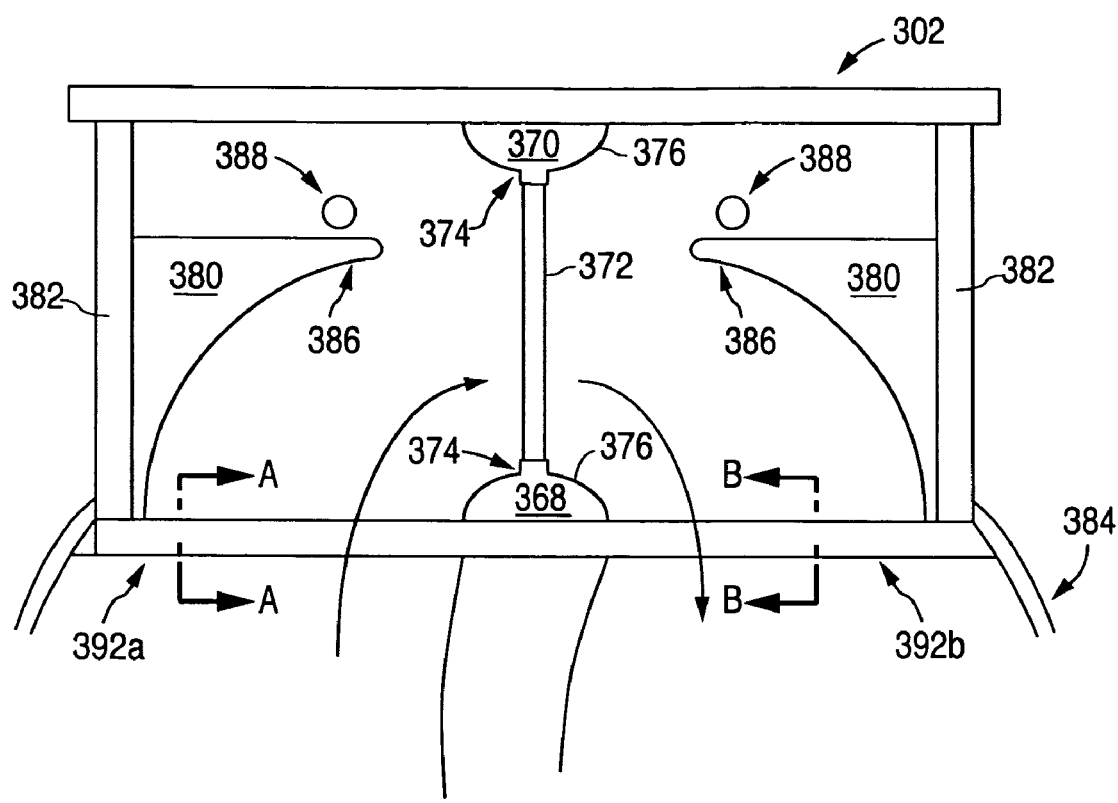
FIG. 36a shows a discharge chamber for a $F_2$ laser in accord with a seventh aspect of the invention.
Figure 36B:
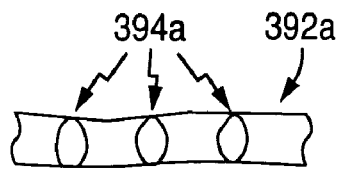
FIG. 36b shows a cross sectional view of the ribs crossing the gas flow of the laser tube where the gas flows into the discharge chamber from the gas flow vessel, wherein the ribs are separated by openings to permit the gas flow and aerodynamically shaped to provide more uniform gas flow and the ribs further serve as low inductivity current return bars.
Figure 36C:
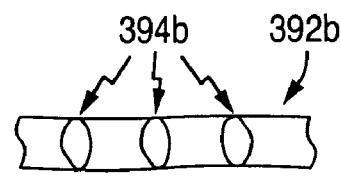
FIG. 36c shows a cross sectional view of the ribs crossing the gas flow of the laser tube separated by openings to permit gas flow from the discharge chamber back into the gas flow vessel, wherein the ribs are aerodynamically shaped and separated by openings through which gas exits the discharge chamber and flows back into the gas flow vessel.

FIGS. 36a-36c illustrate a discharge chamber for a $F_2$ laser in accord with a preferred embodiment and the seventh aspect above. As noted, it is desired to operate the $F_2$ laser at high repetition rates (e.g., more than 1 kHz, e.g., 2-4 kHz and above). To achieve this, the clearing ratio, or the gas flow rate (v) through the discharge area divided by the discharge width (d), or v/d, has to be improved over that which was sufficient at lower repetition rates (e.g., 600-1000 Hz). This is because preferably substantially all of the gas within the discharge volume at the time of a previous discharge moves out of the discharge volume and is replaced by fresh gas prior to the next discharge.

So, for a $F_2$ laser having a preferred repetition rate of 2-4 kHz or more, the clearing ratio to achieve the just stated object would be 2000=v/d, or a value twice as large as for a $F_2$ laser having a repetition rate of 1 kHz. Thus, either the gas flow rate v may be increased (without enhanced turbulence) or the discharge width d may be reduced to increase the clearing ratio. Both of these are achieved in accord with a preferred embodiment. Preferably, this preferred embodiment incorporates the discharge chamber design and electrode configuration set forth at U.S. Pat. No. 6,466,599, which is assigned to the same assignee as the present application, and which are hereby incorporated by reference. Some of the preferred details are set forth below and shown in FIGS. 36a-36c, and alternative embodiments are described in the '599 patent.

FIG. 36a illustrates the tenth embodiment relating to the shape of the main discharge electrodes 368 and 370, and the design of the discharge chamber 302 itself. The shapes of the discharge electrodes 368 and 370 significantly effect characteristics of the discharge area 372, including the discharge width d. Therefore, at least one, and preferably both, of the electrodes 368 and 370 includes two regions. One of these regions, the center portion 374, substantially carries the discharge current and provides a uniform and narrow gas discharge width. The other region, or base portion 376, preferably in collaboration with other conductive and dielectric elements within the discharge chamber, creates preferred electrical field conditions in and around the discharge area 372 and also contributes to the smoothness and uniformity of the gas flow in the vicinity of the discharge electrodes 368 and 370.

The center portions 374 and base portions 376 preferably form electrode 368 and 370 each having a single unit construction, and composed of a single material. The center and base portions 374 and 376 may also comprise different materials, but the different materials should have compatible mechanical and thermal properties such that mechanical stability and electrical conductivity therebetween is sufficiently maintained. The center portion 374 and the base portion 376 come together at a discontinuity or irregularity in the shape of the electrodes 368 and 370. A significant deviation of the electrical field occurs at the location of the irregularity in such a way that gas discharge occurs substantially from/to the center portions 374 drastically reducing the discharge width.

The center portions 374 are shaped to provide a uniform gas discharge having a narrow width. The base portions 376 may be shaped according to any of a variety of smooth curves or a combination of several smooth curves including those described by circular, elliptical, parabolic, or hyperbolic functions. The curvatures of the base portions 376 may be the same or different, and have the same direction of curvature with respect to the discharge area 372, i.e., the base portions 376 each curve away from the discharge area 372 away from the center portion 374. Alternatively, the base portion 376 of the high voltage main electrode 370 may have opposite curvature to the base portion 376 of the electrode 368. That is, the base portion 376 of the electrode 370 may curve toward the discharge area 372, while the base portion 376 of the electrode 368 curves away from the discharge area 360. The alternative configuration provides an even more aerodynamic channel for gas flow through the discharge area 372 because the electrode shapes both conform with the shape of the gas flow.

The electrodes 368 and 370 may alternatively have a regular shape and no discontinuity between base and center portions 374 and 376. The shape of the center portions 374 of the electrodes 368 and 370 in this alternative configuration is preferably similar to that described above and shown. However, the base portions 376 taper to the center portions in a triangular shape where the apexes of the triangular shaped based portions 376 are the center portions and are rounded as described above.

FIG. 36a also shows a pair of preferred spoilers 380 in accord with a preferred embodiment. The spoilers 380 are preferably integrated with the chamber at the dielectric insulators 382 on either side of the discharge area 372. The spoilers 380 may be integrated parts of a single unit, single material dielectric assembly with the insulators 382, or they may comprise different materials suited each to their particular functions. That is, the spoilers 380 and the dielectric insulators 382 may be formed together of a common material such as ceramic to provide an aerodynamic laser chamber 302 for improved gas flow uniformity. Alternatively, the spoilers 380 may be attached to the insulating members 382.

The spoilers 380 are aerodynamically shaped and positioned for uniform gas flow as the gas flows through the chamber 302 from the gas flow vessel 384 (partially shown), through the discharge area 372 and back into the gas flow vessel 384. Preferably, the spoilers 380 are symmetric in accord with a symmetric discharge chamber design.

One end 386 of each of the spoilers 380 is preferably positioned to shield a preionization unit 388 from the main electrode 368, and is shown in FIG. 36a extending underneath one of the pre-ionization units 388 between the preionization unit 388 and the main electrode 368. These ends 86 of the spoilers 380 are preferably positioned close to the preionization units 388. For example, the ends 386 may be just a few millimeters from the preionization units 388. By shielding the preionization units 388 from the main electrode 368, arcing or dielectric breakdown between the preionization units 388 and the main electrode 368 is prevented. The spoilers 380 serve to remove gas turbulence zones present in conventional discharge unit electrode chambers which occur due to the sharp curvature of the gas flow in the vicinity of the preionization units 388 and of the grounded discharge electrode 368.

FIGS. 36b-36c illustrate another feature in accord with the seventh aspect above. As discussed above, the dielectric insulators 382 of the electrode chamber isolate the high voltage main electrode 370. The gas flow is crossed by a first rib configuration 392a where the gas flow enters the electrode chamber 302 from the gas flow vessel 384 and by a second rib configuration 392b where the gas flow exits the electrode chamber 302 and returns the gas back into the gas flow vessel 384. The ribs 394a, 394b, which are current return bars, are separated by openings for the laser gas to flow into and out of the electrode chamber 302 from/to the gas flow vessel 384. The ribs 394a, 394b are preferably rigid and conducting, and are connected to the grounded main discharge electrode 368 to provide a low inductivity current return path. The conducting ribs 394a of the rib configuration 392a are preferably substantially shaped as shown in FIG. 36b. The conducting ribs 394b of the rib configuration 392b are preferably substantially shaped as shown in FIG. 36c. The ribs 394a and 394b of the rib configurations 392a and 392b, respectively, are asymmetrically shaped.

FIG. 36b is a cross sectional view A-A of the rib configuration 392a through which the laser gas enters the electrode chamber 302 from the gas flow vessel 384. The ribs 394a of the rib configuration 392a each have a wide upstream end which meets the laser gas as it flows from the gas flow vessel 384, and a narrow downstream end past which the laser gas flows as it enters the discharge chamber. Preferably, the ribs 394a are smoothly tapered, e.g., like an airplane wing, from the wide, upstream end to the narrow, downstream end to improve gas flow past the rib configuration 392a.

FIG. 36c is a cross sectional view of the rib configuration 392b through which the laser gas exits the electrode chamber 302 and flows back into the gas flow vessel 384. The ribs 394b of the rib configuration 392b each have a wide upstream end which meets the laser gas as it flows from the electrode chamber 302, and a narrow downstream end past which the laser gas flows as it enters the gas flow vessel 384. Preferably, the ribs 394b are smoothly tapered, e.g., like an airplane wing, from the wide, upstream end to the narrow, downstream end to improve gas flow past the rib configuration 392b.

The aerodynamic ribs 394a and 394b each provide a reduced aerodynamic resistance to the flowing gas from that provided by conventional rectangular ribs. Together, the effect aerodynamic spoilers 80 and the aerodynamic ribs 394a and 394b permit the flow rate of the gas through the chamber 302 to be increased without excessive turbulence. The increased gas flow rate through the discharge area 372, together with the reduced discharge width provided by the advantageous design of the electrodes 368 and 370, results in an increased clearing ratio in accord with high repetition rates of operation of the excimer or $F_2$ laser of the preferred embodiment.

While exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow, and equivalents thereof.

In addition, in the method claims that follow, the operations have been ordered in selected typographical sequences. However, the sequences have been selected and so ordered for typographical convenience and are not intended to imply any particular order for performing the operations, except for those claims wherein a particular ordering of steps is expressly set forth or understood by one of ordinary skill in the art as being necessary.

It should be recognized that a number of variations of the above-identified embodiments will be obvious to one of ordinary skill in the art in view of the foregoing description. Accordingly, the invention is not to be limited by those specific embodiments and methods of the present invention shown and described herein. Rather, the scope of the invention is to be defined by the following claims and their equivalents.

The claim invention is:

1. A gas discharge laser system, comprising:
   a discharge chamber containing a laser gas mixture including a constituent gas which is subject to depletion;
   a plurality of electrodes connected to a power supply circuit for providing a driving voltage to said electrodes as a pulsed discharge to energize said laser gas mixture;
   a resonator surrounding said discharge chamber for generating a pulsed laser beam;
   a gas supply unit connected to said discharge chamber; and
   a processor for controlling gaseous flow between said gas supply unit and said discharge chamber, the processor configured to control the gas supply unit to inject a selected amount of constituent gas into said discharge chamber at selected intervals, at least one of the selected intervals and the selected amount of each constituent gas injection depending upon an amount of input electrical energy applied to the pulsed discharge in the laser gas mixture;
   wherein the selected amount of the constituent gas injection for at least one of the selected intervals is between 0.0001 mbar and 0.2 mbar of said constituent gas or between 0.003% and 7% of said constituent gas presently within said discharge chamber.

2. A system according to claim 1, further comprising:
   a counter in communication with the processor and operable to store an accumulated total for the amount of input electrical energy applied to the pulsed discharge.

3. A system according to claim 1, wherein:
   the processor is configured to inject one of a plurality of selected amounts of constituent gas at each interval, the timing between intervals being further dependent upon the selected amount of constituent gas.

4. A system according to claim 1, wherein:
   at least one of the selected intervals and the amount of each constituent gas injection is further dependent upon at least one parameter selected from the group consisting of: the aging of at least one component of the laser system, a calculated amount of the constituent gas in the gas mixture after a previous injection, a measured pressure in an accumulator from which constituent gas was previously injected, and a measured temperature in one of said accumulator and said discharge chamber.

5. A method for controlling a composition of a gas mixture within a discharge chamber of a gas discharge laser system, comprising the steps of:
   monitoring an amount of input electrical energy applied to a pulsed discharge in the gas mixture;
   determining an amount of constituent gas to be injected into said discharge chamber based on the amount of input electrical energy applied to the pulsed discharge, the amount of constituent gas to be injected for at least one amount of input electrical energy being between 0.0001 mbar and 0.2 mbar of said constituent gas or between 0.003% and 7% of said constituent gas presently within said discharge chamber;
   selecting an interval at which to inject the constituent gas into said discharge chamber, the interval being dependent upon the amount of constituent gas; and
   injecting said amount of said constituent gas into said discharge chamber at the selected interval.

6. A method according to claim 5, further comprising:
   monitoring a second parameter indicative of the concentration of a constituent gas in the gas mixture.

7. A method according to claim 6, wherein:
   the second parameter is selected from the group consisting of: the aging of at least one component of the laser system, a calculated amount of the constituent gas in the gas mixture after a previous injection, a measured pressure in an accumulator from which constituent gas was previously injected, and a measured temperature in one of said accumulator and said discharge chamber.

8. A method according to claim 7, wherein:
   at least one of the amount of constituent gas to be injected and the interval at which to inject the constituent gas is further determined using the second parameter.

9. A gas discharge laser system, comprising:
   a discharge chamber containing a laser gas mixture including a constituent gas which is subject to depletion;
   a plurality of electrodes connected to a power supply circuit for providing a driving voltage to said electrodes as a series of pulsed discharges to energize said laser gas mixture;
   a resonator surrounding said discharge chamber for generating a pulsed laser beam;
   a gas supply unit connected to said discharge chamber; and
   a processor for controlling gaseous flow between said gas supply unit and said discharge chamber, the processor configured to control the gas supply unit to inject an amount of constituent gas into said discharge chamber at selected intervals, at least one of the selected intervals and the amount of each constituent gas injection depending upon the number of pulsed discharges in the laser gas mixture,
   wherein the amount of the constituent gas injection for at least one of the selected intervals is between 0.0001 mbar and 0.2 mbar of said constituent gas or between 0.003% and 7% of said constituent gas presently within said discharge chamber.

10. A system according to claim 9, wherein:
    a counter in communication with the processor and operable to store the number of pulsed discharges in the laser gas mixture.

11. A system according to claim 9, wherein:
    the processor is configured to inject one of a plurality of selected amounts of constituent gas at each interval, the timing between intervals being further dependent upon the selected amount of constituent gas.

12. A system according to claim 9, wherein:
at least one of the selected intervals and the amount of each constituent gas injection is further dependent upon at least one parameter selected from the group consisting of: the aging of at least one component of the laser system, a calculated amount of the constituent gas in the gas mixture after a previous injection, a measured pressure in an accumulator from which constituent gas was previously injected, and a measured temperature in one of said accumulator and said discharge chamber.

13. A method for controlling a composition of a gas mixture within a discharge chamber of a gas discharge laser system, comprising the steps of:
monitoring a number of pulsed discharges in the gas mixture;
determining an amount of constituent gas to be injected into said discharge chamber based on the number of pulsed discharges;
selecting an interval at which to inject the constituent gas into said discharge chamber, the interval being dependent upon the amount of constituent gas; and
injecting said amount of said constituent gas into said discharge chamber at the selected interval, the amount of said constituent gas for at least one selected interval being between 0.0001 mbar and 0.2 mbar of said constituent gas or between 0.003% and 7% of said constituent gas presently within said discharge chamber.

14. A method according to claim 13, wherein:
monitoring a second parameter indicative of the concentration of a constituent gas in the gas mixture.

15. A method according to claim 14, wherein:
the second parameter is selected from the group consisting of: the aging of at least one component of the laser system, a calculated amount of the constituent gas in the gas mixture after a previous injection, a measured pressure in an accumulator from which constituent gas was previously injected, and a measured temperature in one of said accumulator and said discharge chamber.

16. A method according to claim 15, wherein:
at least one of the amount of constituent gas to be injected and the interval at which to inject the constituent gas is further determined using the second parameter.

17. A gas discharge laser system, comprising:
a discharge chamber containing a laser gas mixture including a constituent gas which is subject to depletion;
a plurality of electrodes connected to a power supply circuit for providing a driving voltage to said electrodes as a pulsed discharge to energize said laser gas mixture;
a resonator surrounding said discharge chamber for generating a pulsed laser beam;
a gas supply unit connected to said discharge chamber; and
a processor for controlling gaseous flow between said gas supply unit and said discharge chamber, the processor configured to control the gas supply unit to inject an amount of constituent gas into said discharge chamber at selected intervals, at least one of the selected intervals and the amount of each constituent gas injection depending upon an operation mode of the gas discharge laser system,
wherein the depletion rate of the constituent gas in the laser gas mixture varies with operation mode, and
wherein the amount of constituent gas for at least one of the selected intervals is between 0.0001 mbar and 0.2 mbar of said constituent gas or between 0.003% and 7% of said constituent gas presently within said discharge chamber.

18. A system according to claim 17, wherein:
the processor is configured to inject one of a plurality of selected amounts of constituent gas at each interval, the timing between intervals being further dependent upon the selected amount of constituent gas.

19. A system according to claim 17, wherein:
at least one of the selected intervals and the amount of each constituent gas injection is further dependent upon at least one parameter selected from the group consisting of: the aging of at least one component of the laser system, a calculated amount of the constituent gas in the gas mixture after a previous injection, a measured pressure in an accumulator from which constituent gas was previously injected, and a measured temperature in one of said accumulator and said discharge chamber.

20. A method for controlling a composition of a gas mixture within a discharge chamber of a gas discharge laser system, comprising the steps of:
monitoring an operation mode of the gas discharge laser system, wherein a depletion rate of a constituent gas in the gas mixture varies with operation mode;
determining an amount of constituent gas to be injected into said discharge chamber based on the am operation mode of the gas discharge laser system;
selecting an interval at which to inject the amount of constituent gas into said discharge chamber, the interval being dependent upon the amount of constituent gas; and
injecting said amount of said constituent gas into said discharge chamber at the selected interval, the amount of said constituent gas for at least one selected interval being between 0.0001 mbar and 0.2 mbar of said constituent gas or between 0.003% and 7% of said constituent gas presently within said discharge chamber.

21. A method according to claim 20, wherein:
monitoring a second parameter indicative of the concentration of a constituent gas in the gas mixture.

22. A method according to claim 20, wherein:
the second parameter is selected from the group consisting of: the aging of at least one component of the laser system, a calculated amount of the constituent gas in the gas mixture after a previous injection, a measured pressure in an accumulator from which constituent gas was previously injected, and a measured temperature in one of said accumulator and said discharge chamber.

23. A method according to claim 22, wherein:
at least one of the amount of constituent gas to be injected and the interval at which to inject the constituent gas is further determined using the second parameter.

24. A gas discharge laser system, comprising:
a discharge chamber containing a laser gas mixture including first and second constituent gases, each of the first and second constituent gases being subject to depletion;
a plurality of electrodes connected to a power supply circuit for providing a driving voltage to said electrodes as a pulsed discharge to energize said laser gas mixture;
a resonator surrounding said discharge chamber for generating a pulsed laser beam;
a gas supply unit connected to said discharge chamber;
a processor for controlling gaseous flow between said gas supply unit and said discharge chamber, the processor configured to control the gas supply unit to inject a first amount of the first constituent gas into said discharge chamber at one of a first selected interval and to inject a second amount of the second constituent gas into said discharge chamber at a second selected interval; and a database in communication with the processor and operable to store information about the first and second constituent gases under different operating conditions of the gas discharge laser system, whereby the processor can access this information to determine values to be used for at least one of the first amount and first interval and at least one of the second amount and second interval at a present operating condition of the laser system, wherein the first amount for at least one of the first intervals is between 0.0001 mbar and 0.2 mbar of said first constituent gas or between 0.003% and 7% of said first constituent gas presently within said discharge chamber, and wherein the second amount for at least one of the second intervals is between 0.0001 mbar and 0.2 mbar of said second constituent gas or between 0.003% and 7% of said second constituent gas presently within said discharge chamber.

25. A method for controlling a composition of a gas mixture within a discharge chamber of a gas discharge laser system, comprising the steps of:

monitoring an operating condition of the gas discharge laser system;

accessing a database to determine a first amount of a first constituent gas and a second amount of a second constituent gas to be injected into said discharge chamber, the determined first and second amounts being dependent upon the operating condition of the gas discharge laser system;

accessing the database to determine a first interval at which to inject the first constituent gas and a second interval at which to inject the second constituent gas into said discharge chamber, the determined first and second intervals being dependent upon the operating condition of the gas discharge laser system; and injecting said first amount of said first constituent gas and said second amount of said second constituent gas into said discharge chamber at the respective first and second intervals, wherein the first amount for at least one of the first intervals is between 0.0001 mbar and 0.2 mbar of said first constituent gas or between 0.003% and 7% of said first constituent gas presently within said discharge chamber, and wherein the second amount for at least one of the second intervals is between 0.0001 mbar and 0.2 mbar of said second constituent gas or between 0.003% and 7% of said second constituent gas presently within said discharge chamber.

26. A method according to claim 25, wherein:

monitoring a second parameter indicative of the concentration of a constituent gas in the gas mixture.

27. A method according to claim 25, wherein:

the second parameter is selected from the group consisting of: the aging of at least one component of the laser system, a calculated amount of the constituent gas in the gas mixture after a previous injection, a measured pressure in an accumulator from which constituent gas was previously injected, and a measured temperature in one of said accumulator and said discharge chamber.

28. A method according to claim 27, wherein:

at least one of the amount of constituent gas to be injected and the interval at which to inject the constituent gas is further determined using the second parameter.

* * * * *